United States Patent
Ocker

(10) Patent No.: US 11,527,551 B2
(45) Date of Patent: Dec. 13, 2022

(54) MEMORY CELL ARRANGEMENTS AND METHODS THEREOF

(71) Applicant: Ferroelectric Memory GmbH, Dresden (DE)

(72) Inventor: Johannes Ocker, Dresden (DE)

(73) Assignee: Ferroelectric Memory GMBH, Dresden (DE)

( * ) Notice: Subject to any disclaimer, the term of this patent is extended or adjusted under 35 U.S.C. 154(b) by 97 days.

(21) Appl. No.: 17/085,100

(22) Filed: Oct. 30, 2020

(65) Prior Publication Data
US 2022/0139931 A1    May 5, 2022

(51) Int. Cl.

| | |
|---|---|
| *H01L 27/11* | (2006.01) |
| *H01L 27/1159* | (2017.01) |
| *G11C 11/22* | (2006.01) |
| *H01L 27/11587* | (2017.01) |

(52) U.S. Cl.
CPC ........ *H01L 27/1159* (2013.01); *G11C 11/221* (2013.01); *G11C 11/223* (2013.01); *H01L 27/11587* (2013.01)

(58) Field of Classification Search
CPC ........... H01L 27/1159; H01L 27/11587; G11C 11/221; G11C 11/223; G11C 11/2259; G11C 11/2273; G11C 11/2275; G11C 11/412; G11C 16/34
See application file for complete search history.

(56) References Cited

U.S. PATENT DOCUMENTS

| | | | |
|---|---|---|---|
| 5,559,733 A * | 9/1996 | McMillan | G11C 11/22 257/295 |
| 6,251,720 B1 * | 6/2001 | Thakur | H01L 28/60 257/E21.301 |
| 6,510,073 B1 | 1/2003 | Lee et al. | |
| 6,898,105 B2 | 5/2005 | Sakai et al. | |
| 7,656,693 B2 | 2/2010 | Nakamura et al. | |
| 8,605,477 B2 | 12/2013 | Takemura | |
| 2001/0043484 A1 | 11/2001 | Fujimori | |

(Continued)

OTHER PUBLICATIONS

Ocker, U.S. Appl. No. 17/085,084, filed Oct. 30, 2020, Non-Final Rejection, dated Nov. 24, 2021.

(Continued)

*Primary Examiner* — S M Sohel Imtiaz
(74) *Attorney, Agent, or Firm* — Hickman Becker Bingham Ledesma LLP; Malgorzata A. Kulczycka

(57) ABSTRACT

A memory cell arrangement may include: a first memory cell including a first field-effect transistor structure, a first capacitive memory structure coupled to a gate of the first field-effect transistor structure, and a first capacitive lever structure coupled to the gate of the first field-effect transistor structure, and wherein a second memory cell of the plurality of memory cells includes a second field-effect transistor structure, a second capacitive memory structure coupled to a gate of the second field-effect transistor structure, and a second capacitive lever structure coupled to the gate of the second field-effect transistor structure; wherein at least one of the first capacitive memory structure and/or the second capacitive memory structure is disposed in a memory structure region between the first capacitive lever structure and the second capacitive lever structure.

15 Claims, 22 Drawing Sheets

(56) References Cited

U.S. PATENT DOCUMENTS

| | | | |
|---|---|---|---|
| 2002/0012264 A1* | 1/2002 | Ishiwara | G11C 11/22 365/145 |
| 2002/0089870 A1* | 7/2002 | Honda | H01L 27/11507 257/E21.664 |
| 2002/0089877 A1* | 7/2002 | Yi | G11C 11/5635 365/185.24 |
| 2003/0141528 A1* | 7/2003 | Ito | H01L 27/11507 257/295 |
| 2004/0090816 A1 | 5/2004 | Forbes | |
| 2009/0207649 A1 | 8/2009 | Tang et al. | |
| 2011/0249500 A1 | 10/2011 | Cha | |
| 2014/0016399 A1 | 1/2014 | Lu et al. | |
| 2015/0016180 A1 | 1/2015 | Lu et al. | |
| 2015/0098266 A1 | 4/2015 | Chen et al. | |
| 2016/0293640 A1* | 10/2016 | Yamazaki | H01L 29/7869 |
| 2019/0130956 A1* | 5/2019 | Müller | H01L 27/1159 |
| 2020/0357880 A1 | 11/2020 | Xu et al. | |
| 2021/0082801 A1* | 3/2021 | Ho | H01L 28/75 |
| 2021/0217454 A1 | 7/2021 | Ocker | |
| 2021/0375867 A1* | 12/2021 | Chiang | H01L 27/1259 |
| 2022/0139437 A1 | 5/2022 | Ocker | |
| 2022/0139936 A1 | 5/2022 | Ocker | |
| 2022/0270659 A1 | 8/2022 | Ocker | |

OTHER PUBLICATIONS

Ocker, U.S. Appl. No. 17/085,111, filed Oct. 30, 2020, Notice of Allowance and Fees Due, dated Jun. 2, 2022.

Ocker, U.S. Appl. No. 17/085,111, filed Oct. 30, 2020, Notice of Allowance and Fees Due, dated Apr. 28, 2022.

Ocker, U.S. Appl. No. 17/085,084, filed Oct. 30, 2020, Notice of Allowance and Fees Due, dated Feb. 9, 2022.

* cited by examiner

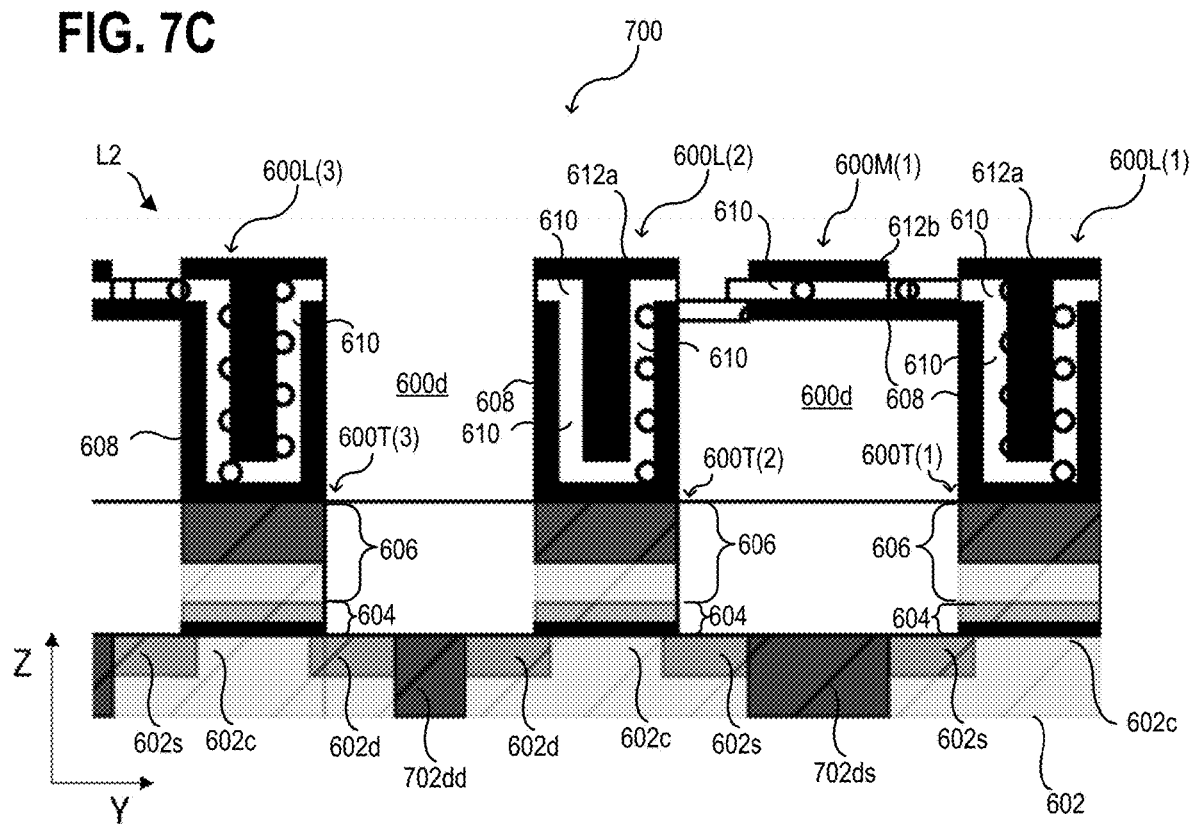

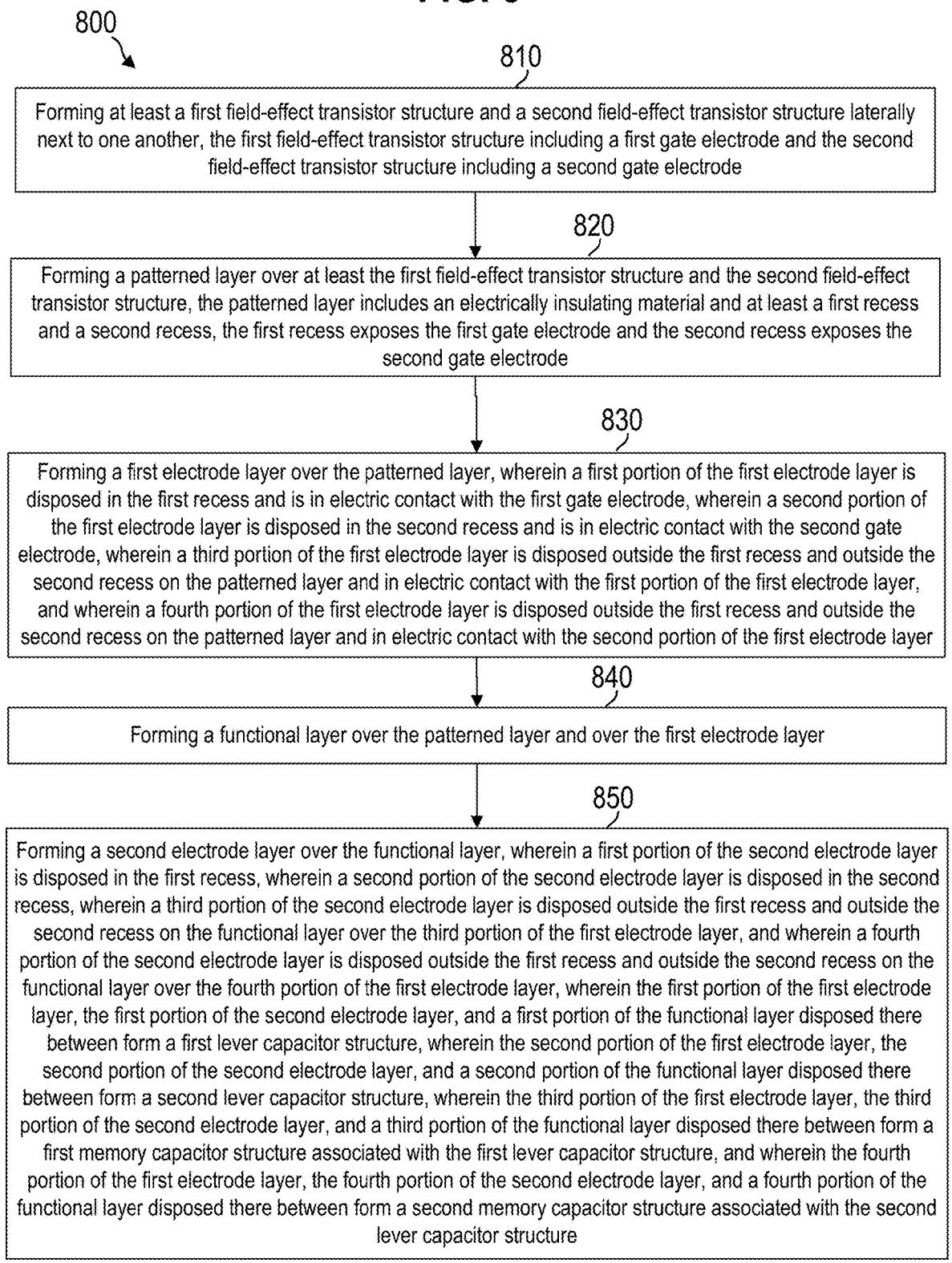

MEMORY CELL ARRANGEMENTS AND METHODS THEREOF

TECHNICAL FIELD

Various aspects relate to memory cell arrangements, and methods thereof, e.g., a method for operating a memory cell arrangement.

BACKGROUND

In general, various computer memory technologies have been developed in the semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is modified, e.g., in a controlled manner. The information stored in the memory cell may be obtained by determining in which of the memory states the memory cell is residing in. At present, various types of memory cells may be used to store data. Typically, a large number of memory cells may be implemented in a memory cell array, wherein each of the memory cells or predefined groups of memory cells may be individually addressable. In this case, the information may be read out by addressing the memory cells accordingly. Furthermore, various driver circuits have been developed in semiconductor industry to control an operation of one or more memory cells of a memory device. The memory cells may be implemented in such a way that each single memory cell or at least various groups of memory cells is unambiguously addressable, e.g., for writing (e.g., programming and/or erasing) and/or reading the respective memory cell or groups of memory cells.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIGS. 7A to 7F schematically show a memory cell arrangement and layouts thereof, according to various aspects; and FIG. 8 shows a flow diagram of a method for processing a memory cell arrangement, according to various aspects.

DESCRIPTION

Figure 1:
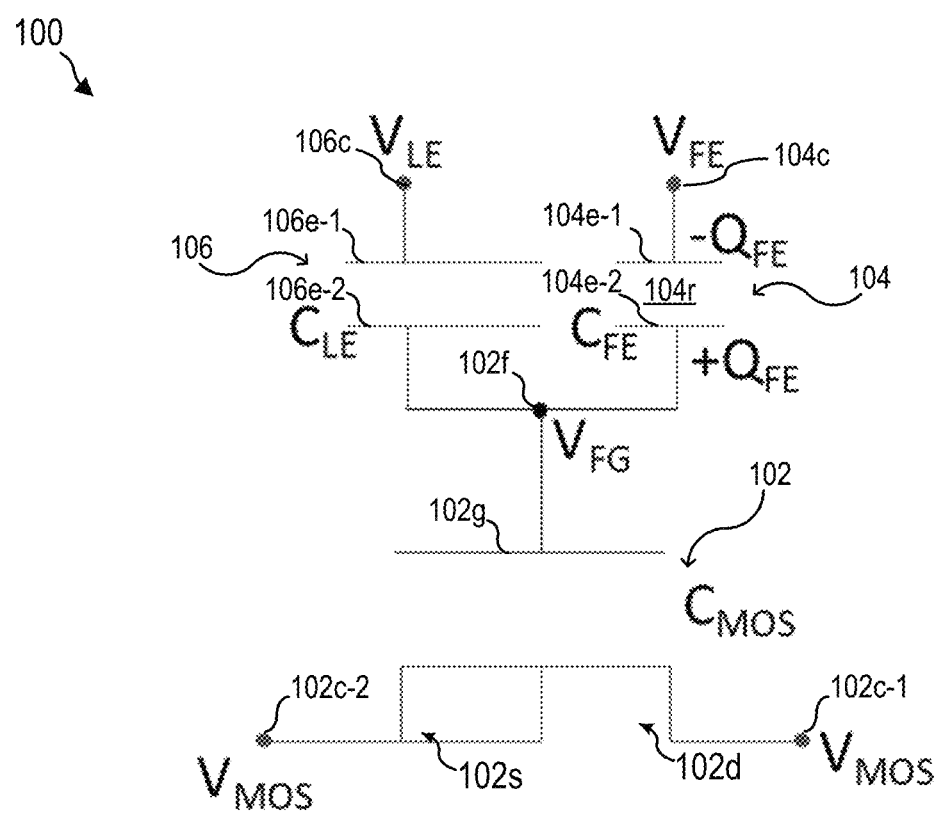
FIG. 1 schematically shows a memory cell, according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described in connection with methods and various aspects are described in connection with devices (e.g., arrangements). However, it may be understood that aspects described in connection with methods may similarly apply to the devices, and vice versa.

The terms "at least one" and "one or more" may be understood to include any integer number greater than or equal to one, i.e., one, two, three, four, [ . . . ], etc. The term "a plurality" may be understood to include any integer number greater than or equal to two, i.e., two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The phrase that an element or a group of elements "includes" another element or another group of elements may be used herein to mean that the other element or other group of elements may be part of the element or the group of elements or that the element or the group of elements may be configured or formed as the other element or the other group of elements (e.g., the element may be the other element).

The phrase "unambiguously assigned" may be used herein to mean a one-to-one-assignment (e.g., allocation, e.g., correspondence) or a bijective assignment. As an example, a first element being unambiguously assigned to a second element may include that the second element is unambiguously assigned to the first element. As another example, a first group of elements being unambiguously assigned to a second group of element may include that each element of the first group of elements is unambiguously assigned to a corresponding element of the second group of elements and that that corresponding element of the second group of elements is unambiguously assigned to the element of the first group of elements.

The term "connected" may be used herein with respect to nodes, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g., provided by a metal or degenerate semiconductor in absence of p-n junctions in the current path. The term "electrically conductively connected" may be also referred to as "galvanically connected".

The term "voltage" may be used herein with respect to "one or more bitline voltages", "one or more wordline voltages", "one or more leverline voltages", "one or more sourceline voltages", "one or more control line voltages", "one or more base voltages" and the like. As an example, the term "base voltage" may be used herein to denote a reference voltage and/or a reference potential for the circuit. With respect to an electrical circuit, the base voltage may be also referred to as ground voltage, ground potential, virtual ground voltage, or zero volts (0 V). The base voltage of an electrical circuit may be defined by the power supply used to operate the electronic circuit. As another example, the term "control line voltage" may be used herein to denote a voltage that is provided to a control line, e.g., of a memory cell arrangement (for example a "wordline voltage" may be provided to a "wordline", a "leverline voltage" may be provided to a "wordline", a "bitline voltage" may be provided to a bitline, and a "sourceline voltage" may be provided to a sourceline). The sign of a voltage difference (e.g., a voltage drop) may be defined as a potential inside a memory cell (e.g., at a first electrode portion) minus a potential at a second electrode portion of the memory cell.

Illustratively, a voltage provided to a node or a terminal may assume any suitable value depending on the intended operation of the circuit including the node or terminal. For example, a bitline voltage (referred to as $V_{BL}$ or VBL) may be varied depending on the intended operation of the memory cell arrangement. Analogously, a wordline voltage (referred to as $V_{WL}$ or VWL), a plateline voltage (referred to as $V_{PL}$ or VPL), and/or sourceline voltage (referred to as $V_{SL}$ or VSL) may be varied depending on the intended operation of a memory cell arrangement. A voltage provided to a node or terminal may be defined by the respective potential applied to that node or terminal relative to the base voltage (referred to as VB) of the circuit. Further, a voltage drop associated with two distinct nodes or terminals of a circuit may be defined by the respective voltages/potentials applied at the two nodes or terminals. As an example, a bitline voltage drop associated with a memory cell of a memory cell arrangement (e.g., an electrode of the memory cell) may be defined by the respective voltages/potentials applied at the corresponding memory cell (e.g., the electrode of the memory cell). As an example, an n-type or p-type field-effect transistor (FET) based memory cell may have a first threshold voltage, also referred to as low threshold voltage ($V_{L-th}$), and a second threshold voltage, also referred to as high threshold voltage ($V_{H-th}$). In the case of the n-type field-effect transistor (n-FET) based memory cell, the high threshold voltage, $V_{H-th}$, may be greater than the low threshold voltage, $V_{L-th}$, both with respect to the voltage value and the absolute voltage value (e.g., the $V_{L-th}$ may be 1 V and the $V_{H-th}$ may be 3 V, only as numerical examples), or the high threshold voltage, $V_{H-th}$, may be greater than the low threshold voltage, $V_{L-th}$, only with respect to the voltage value (e.g., the $V_{L-th}$ may be −1 V and the $V_{H-th}$ may be 1 V, or the $V_{L-th}$ may be −2 V and the $V_{H-th}$ may be 0 V, or the $V_{L-th}$ may be −3 V and the $V_{H-th}$ may be −1 V, only as numerical examples). In the case of the p-type field-effect transistor (p-FET) based memory cell, the high threshold voltage, $V_{H-th}$, may be lower than the low threshold voltage, $V_{L-th}$, with respect to the voltage value and higher than the low threshold voltage, $V_{L-th}$, with respect to the absolute voltage value (e.g., the $V_{L-th}$ may be −1 V and the $V_{H-th}$ may be −3 V, only as numerical examples), or the high threshold voltage, $V_{H-th}$, may be lower than the low threshold voltage, $V_{L-th}$, only with respect to the voltage value (e.g., the $V_{L-th}$ may be 1 V and the $V_{H-th}$ may be −1 V, or the $V_{L-th}$ may be 2 V and the $V_{H-th}$ may be 0 V, or the $V_{L-th}$ may be 3 V and the $V_{H-th}$ may be 1 V, only as numerical examples).

According to various aspects, a threshold voltage of a field-effect transistor or a field-effect transistor based memory cell may be defined as a constant-current threshold voltage (referred to as $V_{th(ci)}$). In this case, the constant-current threshold voltage, $V_{th(ci)}$, may be a determined gate-source voltage, $V_{GS}$, at which the drain current (referred to as $I_D$) is equal to a predefined (constant) current. The predefined (constant) current may be a reference current (referred to as $I_{D0}$) times the ratio of gate width (W) to gate length (L). The magnitude of the reference current, $I_{D0}$, may be selected to be appropriate for a given technology, e.g., 0.1 µA. In some aspects, the constant-current threshold voltage, $V_{th(ci)}$, may be determined based on the following equation:

$$V_{th(ci)} = V_{GS}(\text{at } I_D = I_{D0} \cdot W/L).$$

A threshold voltage of a field-effect transistor or a field-effect transistor based memory cell may be defined by the properties of the field-effect transistor or of the field-effect transistor based memory cell (e.g., the materials, the doping, etc.), and it may thus be a (e.g., intrinsic) property of the field-effect transistor or of the field-effect transistor based memory cell.

In some aspects, two voltages may be compared with one another by relative terms such as "greater", "higher", "lower", "less", or "equal", for example. It is understood that, in some aspects, a comparison may include the sign (positive or negative) of the voltage value or, in other aspects, the absolute voltage values (also referred to as the magnitude, or as the amplitude, e.g., of a voltage pulse) are considered for the comparison.

According to various aspects, a memory cell may be addressed via a corresponding access device. An access device may include or may be, for example, a field effect transistor (FET), such as an n-type or p-type field-effect transistor, a transmission gate, such as an n-type-based or p-type-based transmission gate, or the like. An access device may have a threshold voltage associated therewith. A threshold voltage of an access device (e.g., a field-effect transistor) may be defined by the properties of the access device (e.g., the field-effect transistor), such as the material(s), the doping(s), etc., and it may thus be a (e.g., intrinsic) property of the access device.

According to various aspects, a memory cell may have at least two distinct states associated therewith, for example with two distinct electrical conductivities that can be determined to evaluate in which of the at least two distinct states the memory cell is residing in. A memory cell in general may include a phase-change or phase-change-based memory cell, a ferroelectric or ferroelectric-based memory cell, an anti-ferroelectric or anti-ferroelectric-based memory cell, a remanent-polarizable memory cell, a spontaneous-polarizable memory cell, a capacitor or capacitor-based memory cell, and/or a ferroelectric-capacitor or ferroelectric-capacitor-based memory cell ("FeCAP"). A memory cell may include at least a first memory state and a second memory state. In some aspects, the memory state in which a memory cell is residing in may influence a current characteristic and/or voltage characteristic during readout of the memory cell. The first memory state may be, for example, associated with a logic "1" and the second memory state may be, for example, associated with a logic "0". However, the definition of the memory states and/or the definition of a logic "0" and a logic "1" may be selected arbitrarily. A FET based memory cell (e.g., a remanent-polarizable memory cell) may include a first memory state, for example a low threshold voltage state (referred to as LVT state), and a second memory state, for example a high threshold voltage state (referred to as HVT state). The high threshold voltage state may be, in some aspects, associated with a lower current flow during readout than the low threshold voltage state. The low threshold voltage state may be an electrically conducting state (e.g., associated with a logic "1") and the high threshold voltage state may be an electrically non-conducting state or at least less conducting than the low threshold voltage state (e.g., associated with a logic "0"). However, the definition of the LVT state and the HVT state and/or the definition of a logic "0" and a logic "1" may be selected arbitrarily. Illustratively, the first memory state may be associated with a first threshold voltage of the FET based memory cell, and the second memory state may be associated with a second threshold voltage of the FET based memory cell.

For example, a phase-change memory cell may include a phase change portion. The phase-change portion may be used to implement memory functions, e.g., in a memory cell. The phase-change portion may include a first phase state and a second phase state. For example, a phase-change memory cell may change from a first phase state to a second phase state or vice versa upon applying an electrical signal and may remain in the respective phase state for at least some time (referred to as retention time).

According to various aspects, a spontaneously-polarizable memory cell (e.g., a remanent-polarizable memory cell) may include a spontaneously-polarizable portion (also referred to as spontaneous-polarizable portion, e.g., a remanent-polarizable portion). The spontaneous-polarizable portion may be used to implement memory functions, e.g., in a memory cell. Therefore, according to various aspects, a memory cell may be implemented as a capacitor structure, e.g., as a spontaneous-polarizable capacitor (e.g., a remanent-polarizable capacitor). In general, a spontaneous polarization may be present in a material portion (e.g., a material layer) in the case that the material may have a non-zero electrical polarization, P, upon applying an electric field, E; therefore, a certain value for the material portion may be detected. For example, a spontaneous polarization may be a ferroelectric polarization or an anti-ferroelectric polarization. In general, a remanent polarization (also referred to as retentivity or remanence) may be present in a material portion (e.g., a material layer) in the case that the material may remain polarized upon reduction of an applied electric field, E, to zero; therefore, a certain value for the electrical polarization, P, of the material portion may be detected. Illustratively, a polarization remaining in a material when the electric field is reduced to zero may be referred to as remanent polarization or residual polarization. Therefore, the remanence of a material may be a measure of the residual polarization in the material in the case that an applied electric field is removed. In general, ferroelectricity and anti-ferroelectricity may be concepts to describe a polarization of a material similar to the concepts of ferromagnetism and anti-ferromagnetism that may be used to describe magnetization in magnetic materials.

Further, a remanent-polarizable material may include a spontaneously polarization, for example, with reference to the polarization capability of a material beyond dielectric polarization. The coercivity of a material may be a measure of the strength of the reverse polarizing electric field that may be required to remove a remanent polarization. According to various aspects, an electric coercive field (also referred to as coercive field) may be or represent the electric field required to depolarize a remanent-polarizable layer. A remanent polarization may be evaluated via analyzing one or more hysteresis measurements (e.g., hysteresis curves), e.g., in a plot of polarization, P, versus electric field, E, in which the material is polarized into opposite directions. The polarization capability of a material (dielectric, spontaneous and remanent polarization) may be analyzed using capacity spectroscopy, e.g., via a static (C-V) and/or time-resolved measurement or by polarization-voltage (P-V) or positive-up-negative-down (PUND) measurements.

The polarization state of the remanent-polarizable portion may be switched by means of a capacitor structure. The polarization state of the remanent-polarizable portion may be read out by means of the capacitor structure. The polarization state of the remanent-polarizable portion may define a memory state, e.g., of a memory cell. As an example, the polarization state of the remanent-polarizable portion may influence one or more electrical characteristics of the capacitor structure, e.g., a charging current during charging the capacitor structure.

In a usual capacitor structure, the amount of charge stored therein may be used to define a memory state (e.g., first amount of charge stored in the capacitor structure may define a first memory state and a second amount of charge stored in the capacitor structure may define a second memory state.

According to various aspects, writing a memory cell or performing a write operation of a memory cell may include an operation or a process that modifies the memory state the memory cell is residing in from a (e.g., first) memory state to another (e.g., second) memory state. According to various aspects, writing a memory cell may include programming a memory cell (e.g., performing a programming operation of a memory cell), wherein the memory state the memory cell is residing in after programming may be called "programmed state". For example, programming a remanent-polarizable memory cell may modify the polarization state of the remanent-polarizable memory cell from the first polarization state to the second polarization state (e.g., opposite to the first polarization state). According to various aspects, writing a memory cell may include erasing a memory cell (e.g., performing an erasing operation of a memory cell), wherein the memory state the memory cell is residing in after the erasing may be called "erased state". For example, erasing a remanent-polarizable memory cell may modify the polarization state of the remanent-polarizable memory cell from the second polarization state to the first polarization state. As an example, the programmed state may be associated with a logic "1" and the erased state may be associated with a logic "0". However, the definition of programmed state and erased state may be selected arbitrarily. For example, programming an n-type FET based memory cell may modify the state the memory cell is residing in from the HVT state to the LVT state, whereas programming a p-type FET based memory cell may modify the state the memory cell is residing in from the LVT state to the HVT state. According to various aspects, writing a memory cell may include erasing a memory cell (e.g., performing an erasing operation of a memory cell), wherein the memory state the memory cell is residing in after the erasing may be called "erased state". For example, erasing n-type FET based memory cell may modify the state the memory cell is residing in from the LVT state to the HVT state, whereas erasing a p-type FET based memory cell may modify the state the memory cell is residing in from the HVT state to the LVT state. As an example, the programmed state may be an electrically conducting state (e.g., associated with a logic "1") and the erased state may be an electrically non-conducting state or at least less conducting than the programmed state (e.g., associated with a logic "0"). However, the definition of programmed state and erased state may be selected arbitrarily.

The term "switch" may be used herein to describe a modification of the memory state a memory cell is residing in. For example, in the case that a memory cell is residing in a first memory state, the memory state the memory cell is residing in may be switched such that, after the switch, the memory cell may reside in a second memory state, different from the first memory state. The term "switch" may thus be used herein to describe a modification of the memory state a memory cell is residing in, from a first memory state to a second memory state. The term "switch" may also be used herein to describe a modification of a polarization, for example of a remanent-polarizable portion. For example, a polarization of a remanent-polarizable portion may be switched, such that the sign of the polarization varies from positive to negative or from negative to positive, while the absolute value of the polarization may remain in some aspects substantially unaltered.

According to various aspects, a ferroelectric-capacitor-based memory cell (also referred to as ferroelectric capacitor—"FeCAP") may include a capacitor structure including a ferroelectric material as a remanent-polarizable portion (e.g., a ferroelectric capacitor). The term "ferroelectric" may be used herein, for example, to describe a material that shows a hysteretic charge voltage relationship (Q-V). The ferroelectric material may be or may include ferroelectric $HfO_2$ and/or ferroelectric $ZrO_2$. Ferroelectric $HfO_2$ may include any form of hafnium oxide that may exhibit ferroelectric properties. The ferroelectric material may include, for example, $HfO_2$, $ZrO_2$, a solid solution of $HfO_2$ and $ZrO_2$ (e.g., but not limited to it a 1:1 mixture) or $HfO_2$ doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide. According to various aspects, a ferroelectric material may be an example of a material used in a remanent-polarizable portion. According to various aspects, a ferroelectric portion may be an example of a remanent-polarizable portion.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device. In some aspects, a non-volatile memory technology may be based on a memory cell arrangement as described below. The memory cell arrangement may include FeCAP memory cells. Since a ferroelectric material included in a FeCAP memory cell may have at least two stable polarization states, the ferroelectric capacitor may be used as a non-volatile memory cell. Thus, a FeCAP memory cell stores data by means of a ferroelectric material between at least a first electrode and a second electrode of a capacitor structure. According to various aspects, a non-volatile field-effect transistor based memory structure or memory cell may store data for a period of time from hours (e.g., more than 5 hours) to several tens of years (e.g., 10 years, 20 years, etc.), whereas a volatile memory cell may store data for a period of time from nanoseconds to hours (e.g., less than 5 hours).

In comparison to other emerging memory technologies, a remanent-polarizable memory cell, such as a FeCAP based memory cell, may be integrated in the Front-End-of-Line (FEoL) and/or in the Back-End-of-Line (BEoL) process flow, since it may be implemented as a capacitor-type of memory. Accordingly, the integration of the FeCAP based memory cell may comply with a standard FEoL and/or BEoL complementary metal-oxide-semiconductor (CMOS) process flow. Consequently, various integration schemes may be used to integrate a FeCAP based memory cell in different process technologies.

In some aspects, a memory cell arrangement (e.g., an array including a plurality of memory cells) may be operated based on one or more write operations (e.g., program and/or erase operations) and/or one or more readout operations. During a write operation, as example, predefined voltages may be provided to electrical lines (also referred to as control lines or driver-lines), wherein the electrical lines may be connected to the respective nodes (e.g., respective electrodes) of the memory cells to allow for the desired operation. The electrical lines may be referred to, for example, as bitlines, wordlines, platelines, and/or source-lines. All memory cells that are not intended to be written may see a voltage that is at least less than the programming voltage. The programming voltage may be defined by the type and/or design of memory cell. In some aspects, the programming voltage may be in the range from about 1 V to about 10 V. The programming voltage may be determined via one or more electrical measurements. Various timings may be used to provide the respective voltages, e.g., to provide the desired write voltages and/or the desired readout voltages.

In general, a memory cell arrangement may include a plurality of (e.g., volatile or non-volatile) memory cells, which may be accessed individually or on groups via a corresponding addressing scheme. The matrix architecture may be, for example, referred to as "NOR", "AND", or "NAND" architecture, depending on the way neighboring memory cells are connected to each other, i.e., depending on the way the terminals of neighboring memory cells are shared, but are not limited to these two types (another type is for example an "AND" architecture). For example, in a NAND architecture the memory cells may be organized in sectors (also referred to as blocks) of memory cells, wherein the memory cells are serially connected in a string (e.g., source and drain regions are shared by neighboring transistors), and the string is connected to a first control line and a second control line. For example, groups of memory cells in a NAND architecture may be connected in series with one another. In a NOR architecture the memory cells may be connected in parallel with one another. A NAND architecture may thus be more suited for serial access to data stored in the memory cells, whereas a NOR architecture may be more suited for random access to data stored in the memory cells.

Various aspects are related to a memory cell arrangement including one or more memory cells. The one or more memory cells may be, for example, one or more FeCAP memory cells. In some aspects, a control circuit may be configured to carry out and/or instruct one or more write operations associated with a writing of one or more memory cells of the memory cell arrangement. In some aspects, a control circuit may be used to control a writing of a single memory cell of the memory cell arrangement (illustratively, a memory cell that is intended to be written). According to various aspects, writing a memory cell may include bringing the memory cell from one of at least two memory states into another one of the at least two memory states of the memory cell.

According to various aspects, a memory cell arrangement may include a plurality of memory cells. A first memory cell of the plurality of memory cells may include a first field-effect transistor structure, a first capacitive memory structure coupled to a gate of the first field-effect transistor structure, and a first capacitive lever structure coupled to the gate of the first field-effect transistor structure. A second memory cell of the plurality of memory cells may include a second field-effect transistor structure, a second capacitive memory structure coupled to a gate of the first field-effect transistor structure, and a second capacitive lever structure coupled to the gate of the first field-effect transistor structure. The first capacitive lever structure may be disposed in a first recess formed over the gate of the first field-effect transistor structure. The second capacitive lever structure may include disposed in a second recess formed over the gate of the second field-effect transistor structure. In some aspects, e.g., in the case that the memory cell arrangement is in a NOR-configuration, the first capacitive memory structure and the second capacitive memory structure may be disposed in a memory structure region between the first recess and the second recess. In some aspects, e.g., in the case that the memory cell arrangement is in a NAND-configuration or AND-configuration, either the first capacitive memory structure or the second capacitive memory structure may be disposed in a memory structure region between the first recess and the second recess.

In the following various aspects, e.g., various configurations, read schemes, writing schemes, etc., of a memory cell arrangement that include lever-type memory cells are described with reference to FIGS. 1 to 5.

FIG. 1 schematically shows a memory cell 100 according to various aspects. The memory cell 100 may include a first control node 104c (e.g., a node to be connected to a word-line, a node to apply a write voltage $V_{FE}=V_{PP}$, a node to apply a read-voltage $V_{FE}=V_G$, as examples) and a second control node 106c (e.g., a node to be connected to a lever-line, a node to apply a lever-voltage $V_{LE}$, as examples). The first capacitor structure 104 may include a first electrode 104e-1, e.g., connected to the first control node 104c of the memory cell 100. The first capacitor structure 104 may further include a second electrode 104e-2 connected to the field-effect transistor structure 102, e.g., to a gate structure or a gate node of the field-effect transistor structure 102. In some aspects, the field-effect transistor structure 102 may include a gate structure 102g to control the field-effect transistor structure 102, e.g., to control a current flow through the field-effect transistor structure 102 or to control a conductivity of a channel of the field-effect transistor structure 102. According to some aspects, the field-effect transistor structure 102 may include or may be a long channel MOSFET. A long channel MOSFET may include a channel length greater than about 50 nm. The memory cell 100 may include a gate node 102f at which a gate voltage $V_{FG}$ may be provided to control the field-effect transistor structure 102. The gate structure 102g of the field-effect transistor structure 102 may be configured to be electrically floating. According to various aspects, the second electrode 104e-2 of the first capacitor structure 104 may be connected to the gate node 102f.

According to various aspects, the first capacitor structure 104 may include a memory layer or region 104r disposed between the first electrode 104e-1 and the second electrode 104e-2. In some aspects, the memory layer or region 104r may include or may be a remanent-polarizable layer or region. In other aspects, the memory layer or region 104r may include one or more spontaneously-polarizable layers or regions (e.g., one or more anti-ferroelectric layers or regions 104r) and one or more charge storage layers or regions. The one or more spontaneously-polarizable layers or regions may increase an efficiency of changing a charge of the one or more charge storage layers or regions due to the spontaneous polarization caused by applying an electric field. According to various aspects, the first capacitor structure 104 may have a layered design including one or more remanent-polarizable layers sandwiched between two electrode layers. One or more remanent-polarizable layers may be provided between the electrodes 104e-1, 104e-2 of the first capacitor structure 104. According to various aspects, the first capacitor structure may be a first capacitive memory structure. According to various aspects, the first capacitor structure may be a ferroelectric capacitor (also referred to as FeCAP). A FeCAP may be the storage element of the memory cell 100 used to bit-wise store information.

According to various aspects, the second capacitor structure 106 may include a first electrode 106e-1 connected to the second control node 106c and a second electrode 106e-2 connected to the field-effect transistor structure 102, e.g., to the gate of the field-effect transistor. According to various aspects, the second electrode 106e-2 of the second capacitor structure 106 may be connected to the gate node 102f.

According to various aspects, the second capacitor structure 106 may include an electrically isolating region 106i disposed between the first electrode 106e-1 and the second electrode 106e-2 of the second capacitor structure 106. According to various aspects, one or more dielectric layers (in other words one or more electrically insulating layers) may be provided between the electrodes 106e-1, 106e-2 of the second capacitor structure 106. In another aspect, one or more remanent-polarizable layers may be provided between the electrodes 106e-1, 106e-2 of the second capacitor structure 106. According to various aspects, the second capacitor structure may be a dielectric capacitor or a ferroelectric capacitor (also referred to as FeCAP). According to various aspects, the second capacitor structure 106 may have a layered design including one or more remanent-polarizable layers and/or one or more dielectric layer sandwiched between two electrode layers. However, if the integration would allow it, a gap between the electrodes 106e-1, 106e-2 of the second capacitor structure 106 may be provided that is free of any solid material. In this case, no dielectric material may be disposed between the electrodes 106e-1, 106e-2 of the second capacitor structure 106.

According to various aspects, the second capacitor structure 106 may be a capacitive lever structure. Therefore, even in the case that the second capacitor structure 106 includes one or more remanent-polarizable layers, these one or more remanent-polarizable layers may not be switch during operation as a lever capacitor. Illustratively, the second capacitor structure 106 may be effectively used as a dielectric (non-spontaneously polarizable) capacitor structure.

According to various aspects, the first capacitor structure 104 and the second capacitor structure 106 may include the same materials but may have a respective capacitance different from one another. In some aspects, the first capacitor structure 104 has a first capacitance $C_{FE}$ and the second capacitor structure 106 has a second capacitance $C_{LE}$, wherein the first capacitance $C_{FE}$ is different from the second capacitance $C_{LE}$. As an example, the capacitance $C_{LE}$ of the second capacitor structure 106 may be greater than the capacitance $C_{FE}$ of the first capacitor structure 104. This may allow, for example, an effective readout of the memory cell 100 and, e.g., at the same time, an effective writing of the memory cell 100. As an example, a lever voltage $V_{LE}$ having a first voltage value may be applied at the second control node 106c during a readout process and a lever voltage $V_{LE}$ having a second voltage value may be applied at the second control node 106c during a write process, wherein the first voltage value may be different from the second voltage value.

There may be various options to modify a capacitance of a capacitor structure, e.g., a distance of the capacitor's electrodes may be decreased to increase the capacitance of the capacitor structure and vice versa. Another possibility may include increasing the effective area of the capacitor's electrodes to increase the capacitance of the capacitor structure. Still another possibility may include using a dielectric material disposed between the capacitor's electrodes, the higher the relative permittivity of the dielectric material the higher the capacitance of the capacitor structure. According to various aspects, an effective area of a capacitor structure may be determined by a geometrical vertical projection of one electrode of the capacitor structure to the other electrode of the capacitor structure. To increase the effective area of a capacitor structure (e.g., while remaining a comparatively low footprint) may be to configure the capacitor structure as a three-dimensional capacitor structure including at least one curved or angled portion.

According to various aspects, the memory cell 100 may include a third control node (e.g., a first source/drain node) 102c-1 coupled to a first region (e.g., to a first source/drain region) 102d of the field-effect transistor structure 102 and a fourth control node (e.g., a second source/drain node) 102c-2 coupled to a second region (e.g., to a second source/drain region) 102s of the field-effect transistor structure 102.

According to various aspects, the field-effect transistor structure 102 may have a third capacitance $C_{MOS}$ associated therewith. In some aspects, the capacitance $C_{MOS}$ of the field-effect transistor structure 102 may result at least partially from the gated design thereof.

It may be noted that the first capacitor structure 104 and the second capacitor structure 106 are illustrated (e.g., in FIG. 1) as single capacitors. However, the first capacitor structure 104 may include more than one capacitor, e.g., a capacitor arrangement including at least two capacitors (e.g., at least two FeCAPs) coupled in parallel between the first control node 104c and the gate node 102f. Further, the second capacitor structure 106 may include more than one capacitor, e.g., a capacitor arrangement including at least two capacitors (e.g., at least two dielectric capacitors, e.g., at least two ferroelectric capacitors) coupled in parallel between the second control node 106c and the gate node 102f.

According to various aspects, the second capacitor structure 106 may be a non-ferroelectric capacitor structure, i.e., another material than a ferroelectric material may be disposed between the two electrodes 106e-1, 106e-2 of the second capacitor structure 106.

According to various aspects, the second capacitor structure 106 may be or may include a linear capacitor (such as a dielectric capacitor, as example). A linear capacitor may be configured to show a linear behavior in the current-voltage-characteristics, i.e. a linear I-V-curve.

In the following, one or more problems are described that would be relevant if the second capacitor structure 106 would not be included in the memory cell 100, i.e., relevant for a standard 1T1C memory cell having no lever capacitor structure included therein.

A 1T1C ferroelectric field-effect transistor (FeFET) may include a single ferroelectric capacitor (e.g., with a capacitance $C_{FE}$) connected to a gate of a single field-effect transistor structure (e.g., with a capacitance $C_{MOS}$). The charge created by the ferroelectric capacitor may modify the effective gate voltage to control the field-effect transistor. According to various aspects, the capacitances $C_{MOS}$ and $C_{FE}$ of the two elements may be adjusted and as a result, a voltage drop over the ferroelectric capacitor may be tuned to have either an efficient write operation or an efficient read operation, i.e., either to reduce the gate voltage or to reduce (e.g., minimize) read disturb, as explained in more detail below.

In a first case, the capacitance $C_{MOS}$ may be significantly greater than the capacitance $C_{FE}$. This may allow for a reduction of the write voltage $V_{PP}$. An advantage may be that the write voltage can be reduced, since most of the voltage may drop over the ferroelectric capacitor ($C_{FE}$). However, a disadvantage may be that—during a read operation—the read voltage $V_G$ may drop mainly over the ferroelectric capacitor ($C_{FE}$), which may reduce the control over the field-effect transistor structure ($C_{MOS}$). The field-effect transistor may in some cases not be controlled effectively in the case that the capacitance ratio of $C_{MOS}$ and $C_{FE}$ is high, because most of the voltage may drop over the ferroelectric capacitor ($C_{FE}$), which may potentially lead to a read disturb due to rewriting the memory state during reading. Furthermore, the capacitance of the field-effect transistor (e.g., of a MOSFET) may be non-linear, which may make it difficult to set a specific capacitance ratio $C_{MOS}/C_{FE}$.

In a second case, the $C_{FE}$ may be significantly greater than $C_{MOS}$. This may allow for a reduction of the read disturb. An advantage may be that a read disturb can be avoided, since most of the voltage may drop across the field-effect transistor ($C_{MOS}$). However, a disadvantage may be that during a write operation all the voltage may drop over the field-effect transistor, which increases the voltage that is necessary to write the memory cell. Further, the voltage drop over $C_{MOS}$ and $C_{FE}$ due to the ferroelectric charge may be increased with a decreasing $C_{MOS}/C_{FE}$ ratio, which may lead to a depolarization of the ferroelectric capacitor ($C_{FE}$).

Compared to commonly used approaches, the memory cell 100 described herein may include a lever capacitor structure in addition to the ferroelectric capacitor. In this case, the ferroelectric capacitor may be used to store the actual information in the memory cell and the lever capacitor may be used to modify the voltage regimes in the memory cell 100 for an improved operation. The lever capacitor (e.g., embodied by the second capacitor structure 106) may be used to modify the voltage distribution among the elements of the memory cell 100 so that reading and writing can be performed efficiently, as explained in more detail below.

According to various aspects, memory cell 100 including a lever capacitor ($C_{LE}$) is provided, e.g., wherein the lever capacitor ($C_{LE}$) may be used to change the voltage that drops over the ferroelectric capacitor during write and read. The use of a lever capacitor may allow, for example, a reduction of write voltages and an avoidance of a destructive read or any other read disturb. The lever capacitor may be a ferroelectric capacitor, a dielectric capacitor, e.g., any suitable capacitor structure. The ferroelectric capacitor that stores the actual information (e.g., embodied by the first capacitor structure 104) and the lever capacitor can be of different capacitances. The equation to calculate the floating gate potential may be given by as follows:

$$V \approx (V_{FE}C_{FE} + V_{LE}C_{LE} + V_{MOS}C_{MOS} + Q_{FE})/(C_{FE} + C_{LE} + C_{MOS}),$$

wherein $V_{FE}$ may be the voltage applied to the ferroelectric capacitor, $V_{LE}$ may be the voltage applied to the level capacitor, $V_{MOS}$ may be the voltage applied to the field-effect transistor (e.g., to the source/bulk and drain of the field-effect transistor), $Q_{FE}$ may be the ferroelectric charge, $C_{LE}$ may be the capacitance of the lever capacitor, and $C_{FE}$ may be the capacitance of the ferroelectric capacitor (see FIG. 1).

As an example, during a write operation, a voltage/potential $V_{PP}$ may be applied to the ferroelectric capacitor node such that $V_{FE}$ may be substantially equal to $V_{PP}$ whereas the lever capacitor and the field-effect transistor (e.g., embodied by the field-effect transistor structure 102) may be grounded such that $V_{SS}$ (a base voltage) may be substantially equal to $V_{LE}$ and such that $V_{LE}$ may be substantially equal to $V_{MOS}$. Depending on the lever capacitance $C_{LE}$ and the field-effect transistor capacitance $C_{MOS}$, the voltage drop over the ferroelectric capacitor may be tuned to $C_{MOS}+C_{LE}$ being substantially greater than $C_{FE}$ and most of the voltage $V_{PP}$ may drop over the ferroelectric capacitor. This may reduce the write voltage significantly and create a ferroelectric polarization charge $Q_{FE}$.

Under the assumption that $C_{MOS}+C_{LE}$ is substantially greater than $C_{FE}$, the equation to calculate the floating gate potential gives the following result:

$$V_{FG} \approx V_{FE}C_{FE}/(C_{LE}+C_{MOS}) \approx V_{SS}.$$

It may be noted that this goal can be achieved with a classical FeFET structure that has only one capacitor connected to the gate in the case that $C_{MOS}$ is chosen large enough. However, this may cause read disturb issues as described above. However, a read disturb may be prevented by using the configuration described herein with respect to the memory cell 100, as explained in more detail below.

During reading the memory cell (e.g., to detect the ferroelectric charge $Q_{FE}$), a read voltage $V_G$ may be applied to both the ferroelectric capacitor node (such that $V_{FE}$ may be substantially equal to $V_G$) and to the lever capacitor node (such that VSE may be substantially equal to $V_G$). However, a voltage that is lower than the read voltage $V_G$ may be applied to the lever capacitor node, e.g., a voltage in the range from $V_G/2$ to $V_G$. As an example, the read voltage may be applied to both the first control node 104c and the second control node 106c of the memory cell 100. Hence the capacitance divider provided by the two capacitors 104, 106 and the field-effect transistor structure 102 of the memory cell 100 may be changed by the applied voltages and provide the condition that $C_{MOS}$ may be significantly less than $C_{LE}+C_{FE}$ and, as a result, most of the voltage may drop over the field-effect transistor structure 102 that allows a non-destructive read.

According to various aspects, due to the additional terminal connected to the lever capacitor (e.g., due to the second control terminal 106c), it may be possible to change the effective capacitance divider of the memory cell 100 during write and/or read. This allows, for example, for an avoidance of the disadvantages described above with reference to a standard 1T1C memory cell. If $C_{LE}$ may be substantially greater than $C_{MOS}$ and if $C_{LE}$ may be substantially greater than $C_{FE}$, the non-linearity of the MOS capacitance may be reduced significantly in the case that the lever capacitor $C_{LE}$ is a linear capacitor.

Under the assumption that $C_{MOS}$ is substantially less than $C_{LE}+C_{FE}$, the equation to calculate the floating gate potential gives the following result:

$$V_{FG} \approx V_G + Q_{FE}/C_{LE}.$$

According to various aspects, the drain voltage applied to the third control node 102c-1 may be utilized to transfer charge over the inversion layer of the field-effect transistor structure 102 and to read out the ferroelectric state of the first capacitor structure 104.

During retention, all terminals (in other words all control nodes 102c-1, 102c-2, 104c, 106c) of the memory cell 100 may be grounded and the floating gate potential ($V_{FG}$) may depend mainly on the lever capacitance ($C_{LE}$) provided that $C_{LE}$ may be substantially greater than $C_{MOS}$ and if $C_{LE}$ may be substantially greater than $C_{FE}$, which may be utilized to reduce the depolarization field of the ferroelectric, as can be seen from the following equation:

$$V_{FG} \approx Q_{FE}/C_{LE}.$$

According to various aspects, the lever capacitance value may be selected accordingly to get a sufficiently high change in the gate voltage of the field-effect transistor during a read operation and a low floating gate potential during retention phase.

Figure 2:
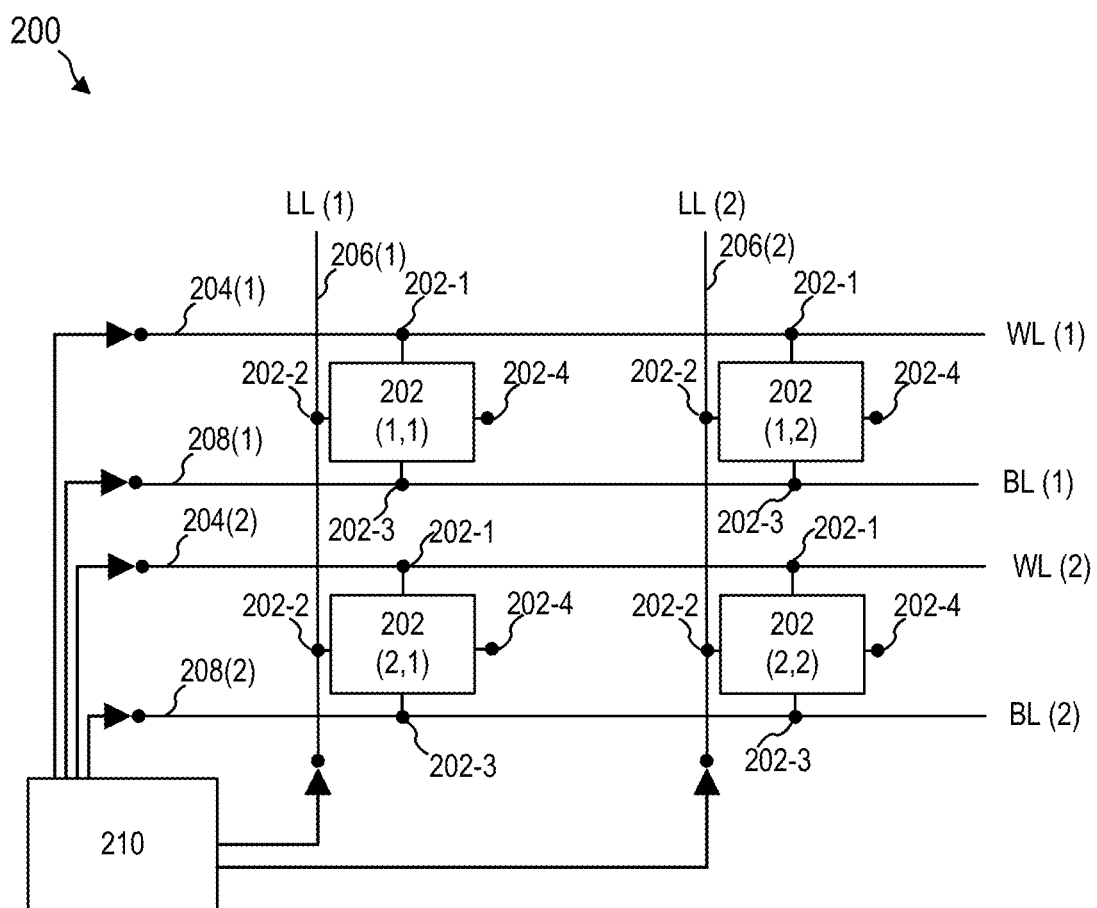
FIG. 2 schematically shows a memory cell arrangement, according to various aspects.

FIG. 2 illustrates schematically an exemplary configuration of a memory cell arrangement 200, according to various aspects. In some aspects, the memory cell arrangement 200 may include a plurality of memory cells 100, as described herein. However, other suitable memory cells may be used in the same or on a similar way. As an example, each memory cell 202 of the memory cell arrangement 200 may include a field-effect transistor structure (referred to as field-effect transistor, FET), a ferroelectric capacitor structure (referred to as ferroelectric capacitor, FeCAP), and an additional capacitor structure (referred to as lever capacitor, LeCAP). The additional capacitor structure may include or may be a ferroelectric capacitor, a dielectric capacitor, or any other suitable capacitor. In some aspects, the memory cells 202 of the memory cell arrangement 200 may be configured as described with reference to memory cell 100 illustrated in FIG. 1. In another aspect, each memory cell 202 of the memory cell arrangement 200 may be configured so that the ferroelectric capacitor structure and the additional capacitor structure have the same capacitance. In some aspects, each memory cell 202 of the memory cell arrangement 200 may include two ferroelectric capacitors, wherein one of the two ferroelectric capacitors may be configured to store a charge representing the actual information (e.g., representing a logic "0" or a logic "1") of the memory cell 202 and wherein the other one of the two ferroelectric capacitors may be configured as a lever capacitor.

According to various aspects, each memory cell 202 of the memory cell arrangement 200 may include four nodes or, in other words, four terminals. The nodes/terminals may be used to address the memory cells 202 of the memory cell arrangement 200 to read and/or write the respective memory cells 202. As illustrated in FIG. 4B, each memory cell 202 may include a first control node 202-1, a second control node 202-2, a third control node 202-3, and a fourth control node 202-4. The first control node 202-1 may be connected to the ferroelectric capacitor of the memory cell 202. The second control node 202-2 may be connected to the lever capacitor of the memory cell 202. The third control node 202-3 may be connected to the field-effect transistor of the memory cell 202 (e.g., to a first source/drain region of the field-effect transistor, referred to as drain). The fourth control node 202-4 may be connected to the field-effect transistor of the memory cell 202 (e.g., to a second source/drain region of the field-effect transistor, referred to as source).

As an example, by applying respective voltages at the control nodes, an electrical behavior of the third control node 202-3 and the fourth control node 202-4 of the respective memory cell 202 may be controlled. As an example, a current flow between the third control node 202-3 and the fourth control node 202-4 may be controlled by applying respective voltages to the first control node 202-1 and the second control node 202-2. As another example, a voltage output at the third control node 202-3 may be controlled by applying respective voltages to the first control node 202-1 and the second control node 202-2).

According to various aspects, each memory cell of the plurality of memory cells 202 of the memory cell arrangement 200 may be a field-effect transistor (FET) based memory cell, and may include two source/drain regions and a gate region (also referred to as gate structure) to control a current flow between the two source/drain regions. In various aspects, each of the one or more memory cells 202 may include a field-effect transistor structure. As an example, each memory cell 202 may include a gate node, a source node, and a drain node. The gate node may be coupled to the gate region of the memory cell 202 via the first capacitor structure 104 (e.g., via the ferroelectric capacitor). The source node may be coupled to the source region of the memory cell. The drain node may be coupled to the drain region of the memory cell 202.

The memory cells 202 of the memory cell arrangement 200 may be arranged, for example, in a matrix architecture. The memory cells 202 may be arranged in a number, n, of columns, and in a number, m, of rows, with m and n integer numbers greater than 1. FIG. 2 illustrates two columns (e.g., a first column and a second column) and two rows (a first row and a second row) of a memory cell arrangement 200 including two memory cells 202 each, only as an example. The memory cell arrangement 200 may include any suitable number of memory cells 202, arranged in any suitable number, n, of columns, and in any suitable number, m, of rows. The memory cells 202 in each row may from a respective first subset of memory cells and the memory cells 202 in each column may from a respective second subset of memory cells.

According to various aspects, the memory cell arrangement 200 may include a plurality of control-lines 204, 206, 208 (e.g., one or more word-lines, WL, one or more bit-lines, BL, and one or more lever-lines, LL), coupled to the memory cells 202. The control-lines 204, 206, 208 may be used to supply voltages/potentials to control nodes of the memory cells 202. The plurality of control-lines 204, 206, 208 may be arranged in any suitable way defined, for example, by the desired matrix architecture of the memory cell arrangement 200.

According to various aspects, the first control node 202-1 of each memory cell 202 may be connected to a corresponding first control-line 204(1), 204(2) (e.g., to a corresponding word-line, WL). The second control node 202-2 of each memory cell 202 may be connected to a corresponding second control-line 206(1), 206(2) (e.g., to a corresponding lever-line, LL).

According to various aspects, the third control node 202-3 of each memory cell 202 may be connected to a corresponding third control-line 208(1), 208(2) (e.g., to a corresponding bit-line, BL).

According to various aspects, the fourth control node 202-4 of each memory cell 202 may be connected to a common control node (e.g., a common source-node or a common source region). However, if desired, the fourth control nodes 202-4 could be addressed via one or more corresponding fourth control-lines (not shown), e.g., via one or more corresponding source-lines (not shown).

Illustratively, each memory cell 202 of the memory cell arrangement 200 may be unambiguously assigned to one word-line, WL, one lever-line, LL, and one bit-line, BL. According to various aspects, the memory cell arrangement 202 may include a set of word-lines, (e.g., a first word-line, WL(1), and a second word-line, WL(2), as an example), a set of bit-lines (e.g., a first bit-line, BL(1), and a second bit-line, BL(2), as an example), and a set of lever-lines (e.g., a first lever-line, LL(1), and a second lever-line, LL(2), as an example). The memory cell arrangement 200 may include any suitable number of control lines.

According to various aspects, each word-line, WL, may be coupled to each memory cell 202 in a same row of memory cells 202. Each bit-line, BL, may be coupled to each memory cell 202 in a same row of memory cells 202. Each lever-line, LL, may be coupled to each memory cell 202 in a same column of memory cells 102.

According to various aspects, the word-lines and the lever-lines may be connected to different subsets of memory cells 202 of the memory cell arrangement 200. According to various aspects, the bit-lines and the lever-lines may be connected to different subsets of memory cells 202 of the memory cell arrangement 200. According to various aspects, the bit-lines and the word-lines may be connected to same subsets of memory cells 202 of the memory cell arrangement 200.

According to various aspects, each memory cell 202 of the memory cell arrangement 200 may include a remanent-polarizable layer (as an example, each of the one or more memory cells 102 may include a FeCAP). Therefore, the memory state a memory cell 202 is residing in may be associated with one of at least two polarization states of the respective remanent-polarizable layer. A first threshold voltage, $V_{L\text{-}th}$, of the field-effect transistor of the memory cell 202 may be associated with a first (e.g., positive) residual polarization of the remanent-polarizable layer (e.g., it may be a function of the first residual polarization) and the second threshold voltage, $V_{H\text{-}th}$, of the field-effect transistor of the memory cell 202 may be associated with a second (e.g., negative) residual polarization of the remanent-polarizable layer (e.g., it may be a function of the second residual polarization).

According to various aspects, the memory cell arrangement 200 may include a control circuit 210. The control circuit 210 may be configured to carry out and/or instruct one or more read operations and/or one or more write operations associated with a reading and/or writing of the memory cells 202 of the memory cell arrangement 200. The control circuit 210 may be configured to supply one or more control signals (e.g., one or more read signals, one or more write signals, etc.) to the memory cells 202. Illustratively, one or more read signals and one or more write signals may be provided to the respective memory cell that is intended to be read and/or written. The control signals may be understood as any (e.g., constant or time-varying) potential or voltage provided at the respective nodes of the memory cells and/or to the control lines of the memory cell arrangement 200.

According to various aspects, the control circuit 210 may include or may control one or more voltage supply circuits. The one or more voltage supply circuits may be used for supplying control voltages (e.g., a read voltage, $V_G$, a write voltage, $V_{PP}$, a base voltage, $V_{SS}$, as examples) to the control-lines 204, 206, 208 of the memory cell arrangement 200, e.g., for supplying voltages to the respective control nodes 201-1, 201-2, 201-3, 201-4 of the one or more memory cells 202. According to various aspects, the control circuit 210 may define a base voltage, e.g., $V_{SS}$, e.g., a ground voltage (for example 0 V) associated with the memory cell arrangement 200.

According to various aspects, during readout of a memory cell, a drain current, $I_D$, may be created at the bit-line corresponding to the memory cell to be read out (e.g., by applying a readout voltage and a lever voltage accordingly), wherein the drain current may vary as a function of a gate-source voltage drop and, therefore, as a function of the memory state (e.g., LVT state or HVT state) the memory cell is residing in. As an example, a current flow through the memory cell may reflect the memory state the memory cell is residing in in the case that a gate-source voltage drop falls between the first threshold voltage, $V_{L-th}$, and the second threshold voltage, $V_{H-th}$.

In the following, one or more problems are described that may be relevant for a conventional AND architecture used to implement a memory cell arrangement based on standard 1T1C-FeFET memory cells having no lever capacitor structure included therein.

In general, ferroelectric transistors (FeFETs) may be organized in AND architectures, which may allow, for example, a single bit programming but only a word based erase. As an example, if the memory cells of the memory cell arrangement include long channel MOS transistors, only a whole row of memory cells may be erased at once. For short channel MOS transistors, where the depletion zone merges by applying a voltage to source and drain region, a bit erase may be possible. However, a high voltage at the source and drain regions has to be used during inhibition or during bit erase, which may cause substantial reverse junction leakages that increase the power consumption of the memory cell arrangement during operation.

Compared to commonly used approaches, the memory cells described herein may include at least two capacitors; and, in some aspects, the memory cells may be embed into an array to prevent disadvantages mentioned above, e.g., to prevent a substantial reverse junction leakage during a bit erase, to avoid substantial read and write disturbs, as examples.

Figure 3A:
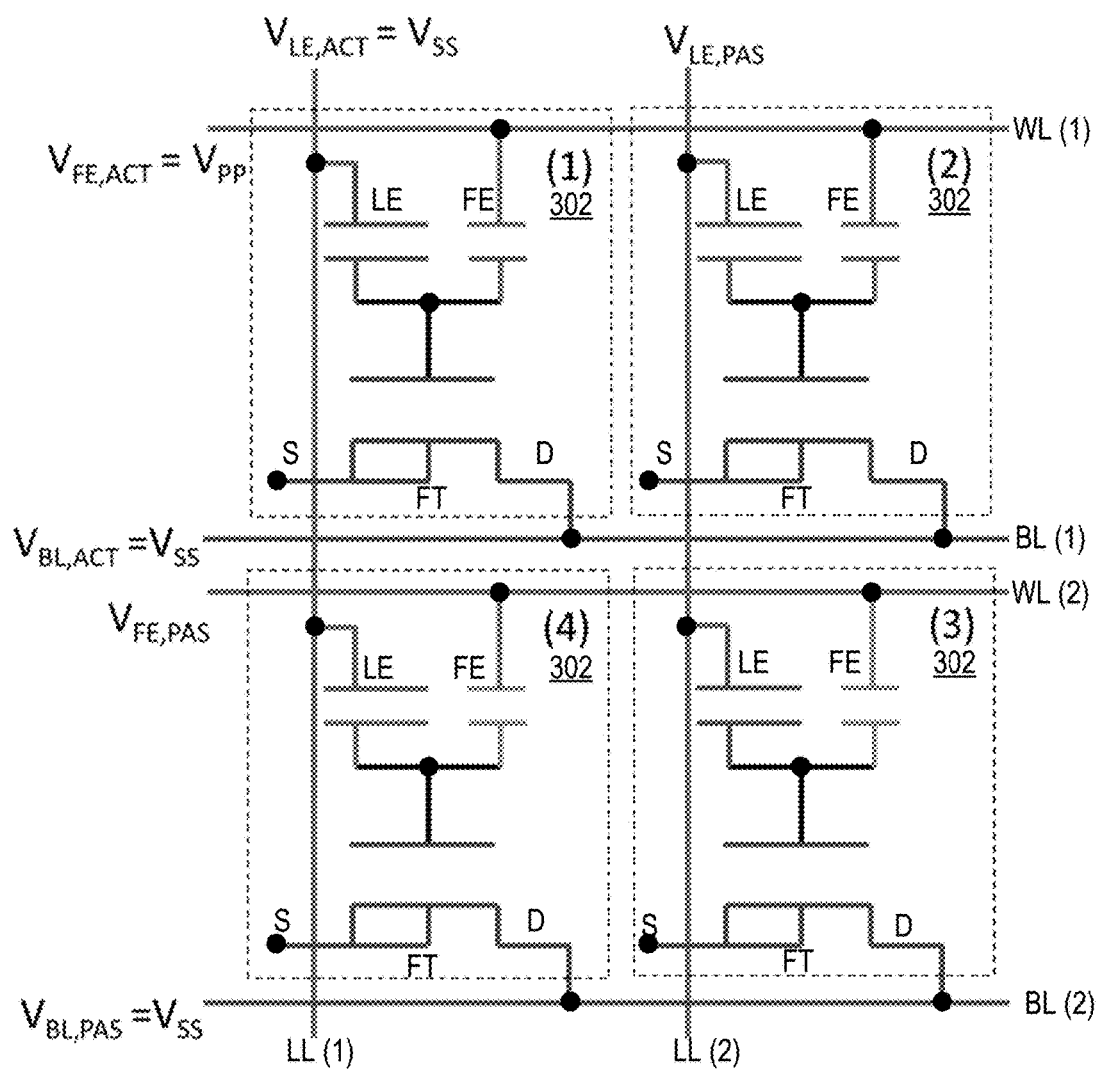
FIG. 3A schematically shows a memory cell arrangement having a NOR architecture during writing a memory cell of the memory cell arrangement, according to various aspects.
Figure 3B:
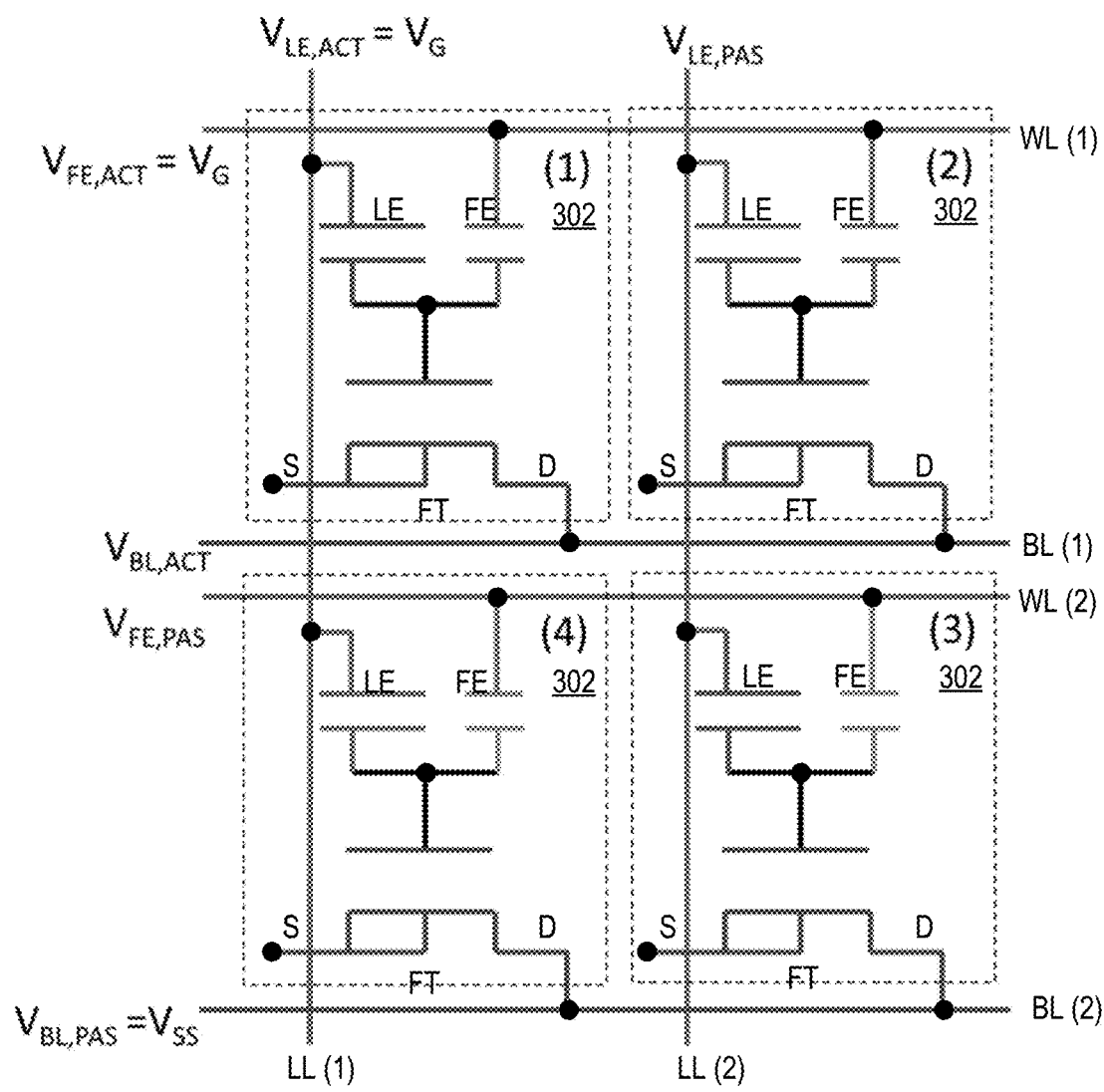
FIG. 3B schematically shows a memory cell arrangement having a NOR architecture during reading a memory cell of the memory cell arrangement, according to various aspects.
Figure 3C:
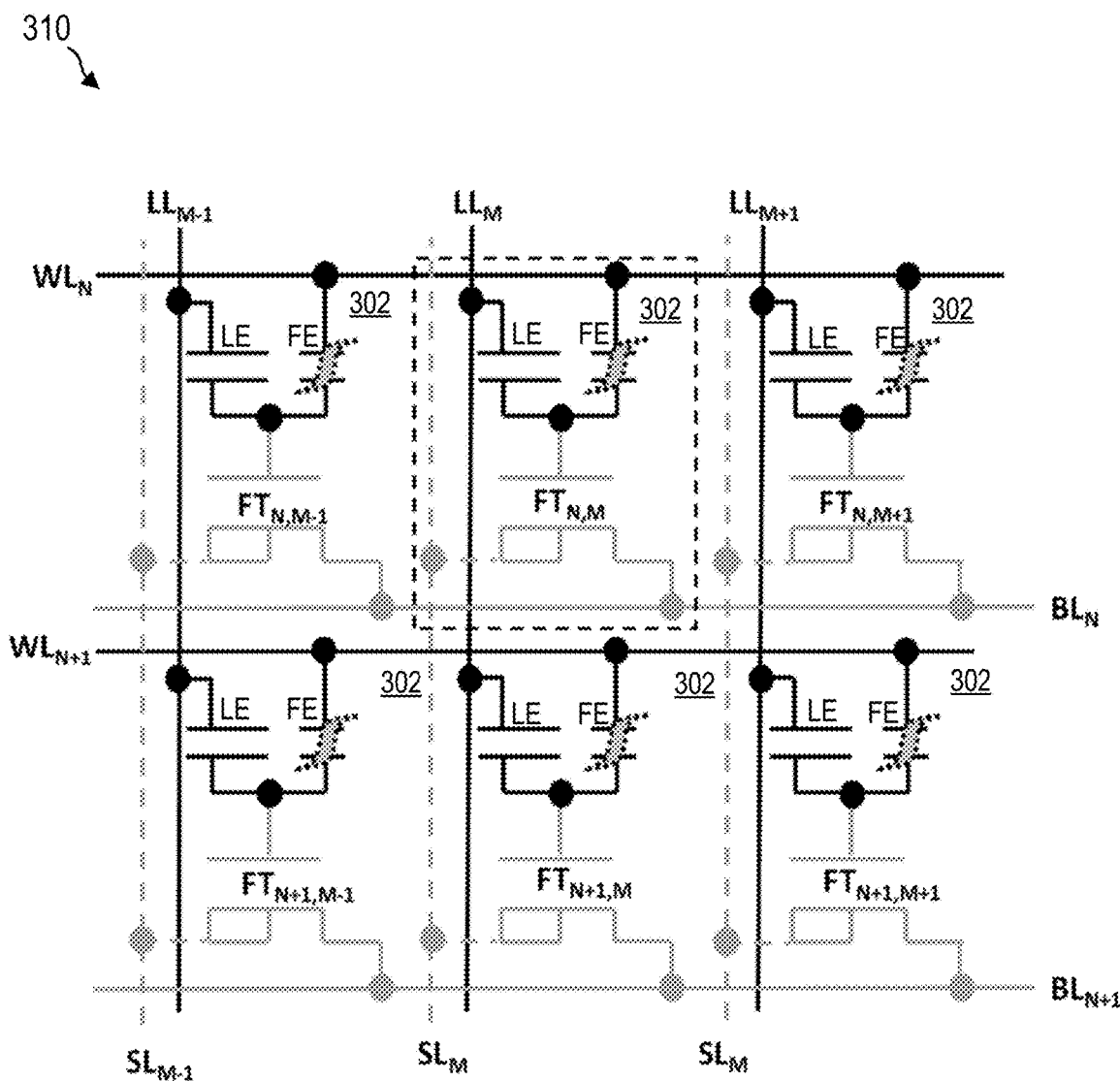
FIG. 3C schematically shows a memory cell arrangement having a NOR architecture, according to various aspects.

According to various aspects, the 1T2C memory cells of a memory cell arrangement (e.g., of memory cell arrangement 200 described herein with reference to FIG. 1) may be organized as an array based on a NOR architecture, as illustrated in FIG. 3A, FIG. 3B, and FIG. 3C.

FIG. 3A shows exemplarily a writing of a memory cell (1) of a memory cell arrangement 300, according to various aspects. The memory cell arrangement 300 may be configured in the same way or in a similar way as described herein with reference to the memory cell arrangement 200, see FIG. 1. Each memory cell 302 of the memory cell arrangement 300 may include a lever capacitor LE, a ferroelectric capacitor FE, and a field-effect transistor FT. The lever capacitor LE of the respective memory cell 302 may be connected to a corresponding lever-line LL(1), LL(2) and to the floating gate of the field-effect transistor FT of the respective memory cell 302. The ferroelectric capacitor FE of the respective memory cell 302 may be connected to a corresponding word-line WL(1), WL(2) and to the floating gate of the field-effect transistor FT of the respective memory cell 302. The field-effect transistor FT may be connected with its source S to a common source potential and with its drain D to a corresponding bit-line BL(1), BL(2).

In this example, it may be assumed that only memory cell (1) of the memory cell arrangement 300 is intended to be written (is selected to be written, e.g., referred to as selected memory cell). To program or erase the memory cell (1), a write voltage $V_{PP}$ may be applied to the active word-line connected to the ferroelectric capacitor FE of the selected memory cell (1). In this case, the voltage ($V_{FE,ACT}$) applied at the corresponding word-line (WL(1)) may be the write voltage $V_{PP}$ (also referred to as programming voltage $V_{PP}$). Further, to program or erase the memory cell (1), a base voltage (e.g., $V_{SS}$) or a voltage close to the base voltage may be applied to the active lever-line connected to the lever capacitor LE of the selected memory cell (1). In this case, the voltage ($V_{LE,ACT}$) applied to the corresponding lever-line (LL(1)) may be, for example, a base voltage (e.g., 0 V) or a voltage close to a base voltage (e.g., a voltage in the range from about −0.25V to about 0.25 V). However, voltage greater than the base voltage may be applied to the active lever-line connected to the lever capacitor LE of the selected memory cell (1), e.g., a voltage in the range from about $V_{SS}$ to about $V_{PP}/2$. Further, to program or erase the memory cell (1), a base voltage (e.g., $V_{SS}$) or a voltage close to the base voltage may be applied to the active bit-line connected to the field-effect transistor FT of the selected memory cell (1). In this case, the voltage ($V_{BL,ACT}$) applied to the corresponding bit-line (BL(1)) may be, for example, a base voltage (e.g., 0 V) or a voltage close to a base voltage (e.g., a voltage in the range from about −0.25V to about 0.25 V).

According to various aspects, the field-effect transistor structure may be in a non-conducting state during writing the selected memory cell. Illustratively, the field-effect transistor structure may be closed during writing the selected memory cell. This may, for example, increase the speed of writing the selected memory cell (e.g., with a write time of less than 15 ns, e.g., with a write time of less than 10 ns).

According to various aspects, the write voltage $V_{PP}$ may be, for example, in the range from about 1 V to about 10 V, e.g. from about 1.5 V to about 6 V.

According to various aspects, a voltage value of the write voltage $V_{PP}$ and a voltage value of the voltage ($V_{LE,ACT}$) applied to the corresponding lever-line (in the following also referred to as first lever voltage) may be bipolar (e.g., of opposite sign). For example, the write-voltage ($V_{PP}$) may have a positive voltage value and the first (active) lever-voltage ($V_{LE,ACT}$) may have a negative voltage value, or vice versa. According to an example, the write voltage $V_{PP}$ may have a voltage value of +1.0 V and the first lever voltage $V_{LE,ACT}$ may have a voltage value of −1.0 V.

According to various aspects, a disturbance of the other memory cells 302 of the memory cell arrangement 300 may be prevented during writing the selected memory cell (1).

As an example, to avoid a disturbance of the memory cell (2) of the memory cell arrangement 300 during writing the memory cell (1), a voltage different from $V_{SS}$ may be applied to the passive lever-line connected to the lever capacitor LE of the non-selected memory cell (2). A voltage different from $V_{SS}$ may be applied to all passive lever-lines connected to the lever capacitors LE of the non-selected memory cells of the memory cell arrangement 300 that share the same word-line (WL(1)) as the selected memory cell (1). According to various aspects, the voltage ($V_{LE,PAS}$) applied to the corresponding lever-line (LL(2)) may be, for example, in the range from about ½*|$V_{PP}$| to about |$V_{PP}$|.

According to various aspects, a voltage value of the first lever voltage ($V_{LE,ACT}$) and a voltage value of the voltage ($V_{LE,PAS}$) applied to all passive lever-lines connected to the lever capacitors LE of the non-selected memory cells of the memory cell arrangement 300 (in the following also referred to as second lever voltage) may be bipolar. For example, the first (active) lever voltage ($V_{LE,ACT}$) may have a negative voltage value and the second (passive) lever-voltage ($V_{LE,PAS}$) may have a positive voltage value, or vice versa. According to an example, the first lever voltage $V_{LE,ACT}$ may have a voltage value of −1.0 V and the second lever voltage $V_{LE,PAS}$ may have a voltage value of +0.4 V.

According to various aspects, applying second (passive) lever-voltages ($V_{LE\,PAS}$) of opposite sign as compared to the first lever voltage ($V_{LE,ACT}$) and/or as compared to the write voltage ($V_{PP}$) may ensure that the memory state of the non-selected memory cells is not changed (e.g., neither written nor erased).

As an example, to avoid disturb of the memory cells (3), (4) of the memory cell arrangement 300 during writing the memory cell (1), a voltage different from $V_{PP}$ may be applied to the passive word-line connected to the ferroelectric capacitor FE of the non-selected memory cells (3), (4). A voltage different from $V_{PP}$ may be applied to all passive word-lines connected to the ferroelectric capacitors FE of the non-selected memory cells of the memory cell arrangement 300 that do not share the same word-line (WL(1)) as the selected memory cell (1). According to various aspects, the voltage ($V_{FE,PAS}$) applied to the corresponding word-line (WL(2)) may be, for example, in the range from about 0 V (or $V_{SS}$) to about ½*|$V_{PP}$|.

According to various aspects, a voltage value of the write voltage ($V_{PP}$) and a voltage value of the voltage ($V_{FE,PAS}$) applied to all passive word-lines connected to the ferroelectric capacitors FE of the non-selected memory cells of the memory cell arrangement 300 (in the following also referred to as inhibit voltage) may be bipolar. For example, the write voltage ($V_{PP}$) may have a positive voltage value and the inhibit voltage ($V_{FE,PAS}$) may have a negative voltage value, or vice versa. According to an example, the write voltage $V_{PP}$ may have a voltage value of +1.0 V and the inhibit voltage $V_{FE,PAS}$ may have a voltage value of −0.2 V.

Further, to avoid disturb of the memory cells (3), (4) of the memory cell arrangement 300 during writing the memory cell (1), a base voltage (e.g., $V_{SS}$) or a voltage close to the base voltage may be applied to the passive bit-line connected to the field-effect transistor FT of the non-selected memory cells (3), (4). In this case, the voltage ($V_{BL,PAS}$) applied to the corresponding bit-line (BL(2)) may be, for example, 0 V or a voltage close to 0 V (e.g., a voltage in the range from about −0.25V to about 0.25 V).

As described exemplarily above, individual cells of the memory cell arrangement 300 can be erased. It is noted that some or all of the voltages described are only examples and that deviations from the described voltages may be possible.

As further described exemplarily above, the terminals of the memory cell 302 connected to the bit-line (e.g., connected to the source/drain regions of the field-effect transistor of the memory cell 302) may be kept at $V_{SS}$ (or at least close to $V_{SS}$) eliminating the power consumption from reverse junction leakage from bulk to source and drain during inhibition.

FIG. 3B shows exemplarily a reading of a memory cell (1) of the memory cell arrangement 300, according to various aspects.

In this example, it may be assumed that only memory cell (1) of the memory cell arrangement 300 is intended to be read (is selected to be read, referred to as selected memory cell). To read the memory cell (1), a read voltage $V_G$ may be applied to the active word-line connected to the ferroelectric capacitor FE of the selected memory cell (1). In this case, the voltage ($V_{FE,ACT}$) applied to the corresponding word-line (WL(1)) may be the read voltage $V_G$.

Further, to read the memory cell (1), a voltage ($V_{LE,ACT}$) may be applied to the active lever-line connected to the lever capacitor LE of the selected memory cell (1). In this case, the voltage ($V_{LE,ACT}$) applied to the corresponding lever-line (LL(1)) may be substantially equal to the read voltage $V_G$.

Further, to read the memory cell (1), a potential/voltage greater than $V_{SS}$ may be applied to the active bit-line connected to the field-effect transistor FT of the selected memory cell (1). In this case, the voltage ($V_{BL,ACT}$) applied to the corresponding bit-line (BL(1)) may be, for example, greater than 0 V. In an example, the voltage ($V_{BL,ACT}$) applied to the corresponding bit-line (BL(1)) may be 1 V The bulk and source terminals of the field-effect transistors of the memory cells may be kept at a voltage at or close to $V_{SS}$ (e.g., a voltage of 0 V or in the range from about −0.25V to about 0.25 V.

According to various aspects, a voltage value of the read voltage $V_G$ and a voltage value of the voltage ($V_{LE,ACT}$) applied to the corresponding lever-line (in the following also referred to as first lever voltage) may be bipolar. For example, the read-voltage ($V_G$) may have a positive voltage value and the first (active) lever-voltage ($V_{LE,ACT}$) may have a negative voltage value, or vice versa.

According to various aspects, disturb of the other memory cells 302 of the memory cell arrangement 300 may be prevented during reading the selected memory cell (1).

As an example, to avoid disturb of the memory cell (2) of the memory cell arrangement 300 during reading the memory cell (1), a voltage different from $V_G$ may be applied to the passive lever-line connected to the lever capacitor LE of the non-selected memory cell (2). A voltage different from $V_G$ may be applied to all passive lever-lines connected to the lever capacitors LE of the non-selected memory cells of the memory cell arrangement 300 that share the same word-line (WL(1)) as the selected memory cell (1). According to various aspects, the voltage ($V_{LE,PAS}$) applied to the corresponding lever-line (LL(2)) may be, for example, in the range from about $V_{SS}$ (e.g., 0 V) to about ½*|$V_G$|.

According to various aspects, a voltage value of the first lever voltage ($V_{LE,ACT}$) and a voltage value of the voltage ($V_{LE,PAS}$) applied to all passive lever-lines connected to the lever capacitors LE of the non-selected memory cells of the memory cell arrangement 300 (in the following also referred to as second lever voltage) may be bipolar. For example, the first (active) lever voltage ($V_{LE,ACT}$) may have a positive voltage value and the second (passive) lever-voltage ($V_{LE\,PAS}$) may have a negative voltage value, or vice versa. According to an example, the first lever voltage $V_{LE,ACT}$ may have a voltage value of +0.6 V and the second lever voltage $V_{LE,PAS}$ may have a voltage value of −0.1 V.

According to various aspects, applying second (passive) lever-voltages ($V_{LE\,PAS}$) of opposite sign as compared to the first lever voltage ($V_{LE,ACT}$) and/or as compared to the read voltage ($V_G$) may ensure that the memory state of the non-selected memory cells is not changed (e.g., neither written nor erased).

As an example, to avoid disturb of the memory cells (3), (4) of the memory cell arrangement 300 during reading the memory cell (1), a voltage different from $V_G$ may be applied to the passive word-line connected to the ferroelectric capacitor FE of the non-selected memory cells (3), (4). A voltage different from $V_G$ may be applied to all passive word-lines connected to the ferroelectric capacitors FE of the non-selected memory cells of the memory cell arrangement 300 that do not share the same word-line (WL(1)) as the selected memory cell (1). According to various aspects, the voltage ($V_{FE,PAS}$) applied to the corresponding word-line (WL(2)) may be, for example, in the range from about $V_{SS}$ (e.g., 0 V) to about $\frac{1}{2} * |V_G|$.

According to various aspects, a voltage value of the read voltage ($V_G$) and a voltage value of the voltage ($V_{FE,PAS}$) applied to all passive word-lines connected to the ferroelectric capacitors FE of the non-selected memory cells of the memory cell arrangement 300 (in the following also referred to as inhibit voltage) may be bipolar. For example, the read voltage ($V_G$) may have a positive voltage value and the inhibit voltage ($V_{FE,PAS}$) may have a negative voltage value, or vice versa.

Further, to avoid disturb of the memory cells (3), (4) of the memory cell arrangement 300 during reading the memory cell (1), a base voltage (e.g., $V_{SS}$) or a voltage close to the base voltage may be applied to the passive bit-line connected to the field-effect transistor FT of the non-selected memory cells (3), (4). A voltage that equals the base voltage or that is close to the base voltage may be applied to all passive bit-lines connected to the field-effect transistors of the non-selected memory cells of the memory cell arrangement 300 that do not share the same bit-line (BL(1)) as the selected memory cell (1). In this case, the voltage ($V_{BL,PAS}$) applied to the corresponding bit-line (BL(2)) may be, for example, 0 V or a voltage close to 0 V (e.g., a voltage in the range from about −0.25V to about 0.25 V).

As described exemplarily above, individual cells of the memory cell arrangement 300 can be read. It is noted that some or all of the voltages described are only examples and that deviations from the described voltages may be possible.

According to various aspects, the bulk and source terminals of the transistors of the memory cells 302 (that includes semiconductor material) may be kept at $V_{SS}$ but the active bit-line potential may be charged to a potential greater than $V_{SS}$ to detect a charge created by the ferroelectric capacitor FE.

According to various aspects, a memory cell is described herein including or consisting of one transistor and two capacitors, one of the two capacitors being a ferroelectric capacitor. By increasing the capacitance of the capacitor which does not exhibit the ferroelectric charge (e.g., the lever capacitor), a program voltage can be obtained that is close to a program voltage of a standalone ferroelectric capacitor. During read, the voltage distribution may be changed (compared to writing) such that a disturbance of the ferroelectric material in the ferroelectric capacitor can be avoided and such that a good control over the transistor (e.g., a MOS transistor) can be obtained. During retention condition, the voltage over the ferroelectric material can be reduced to avoid depolarization of the ferroelectric portion.

According to various aspects, a NOR architecture is described herein to organize the 1T2C memory cell into an array structure to build memory arrays. By tuning the voltages applied on both capacitors, a disturbance during read and write can be reduced effectively. For write inhibition, junction leakages may be avoided, since all semiconductor terminals can be kept at ground. The structure allows bit-alterability for long channel transistors. According to various aspects, another memory element may be used instead of the ferroelectric capacitor, if desired. According to various aspects, another transistor may be used instead of the field-effect transistor, if desired.

According to various aspects, the lever capacitor may (or the second capacitor structure) may be configured such that it has a capacitance in the range from about 0.01 fF to about 100 fF, 0.1 fF to about 10 fF. However, the capacitance of the lever capacitor may be adapted to the other elements of the memory cell as desired.

An exemplary configuration of a memory cell arrangement 310 including six memory cells 302 having a NOR configuration and is shown in FIG. 3C. A memory cell 302 of the memory cell arrangement 310 may be written as described with respect to FIG. 3A. A memory cell 302 of the memory cell arrangement 310 may be read as described with respect to FIG. 3B. In an example, to read a selected memory cell, a read voltage with a voltage value of about 0.6 V may be applied to the wordline (WL) corresponding to the selected memory cell and a first (active) lever voltage with a voltage value of about 0.9 V may be applied to the leverline (LL) corresponding to the selected memory cell. For example, a second (passive) lever voltage with a voltage value of about 0.3 V may be applied to the passive leverlines corresponding to the non-selected memory cells.

Figure 4A:
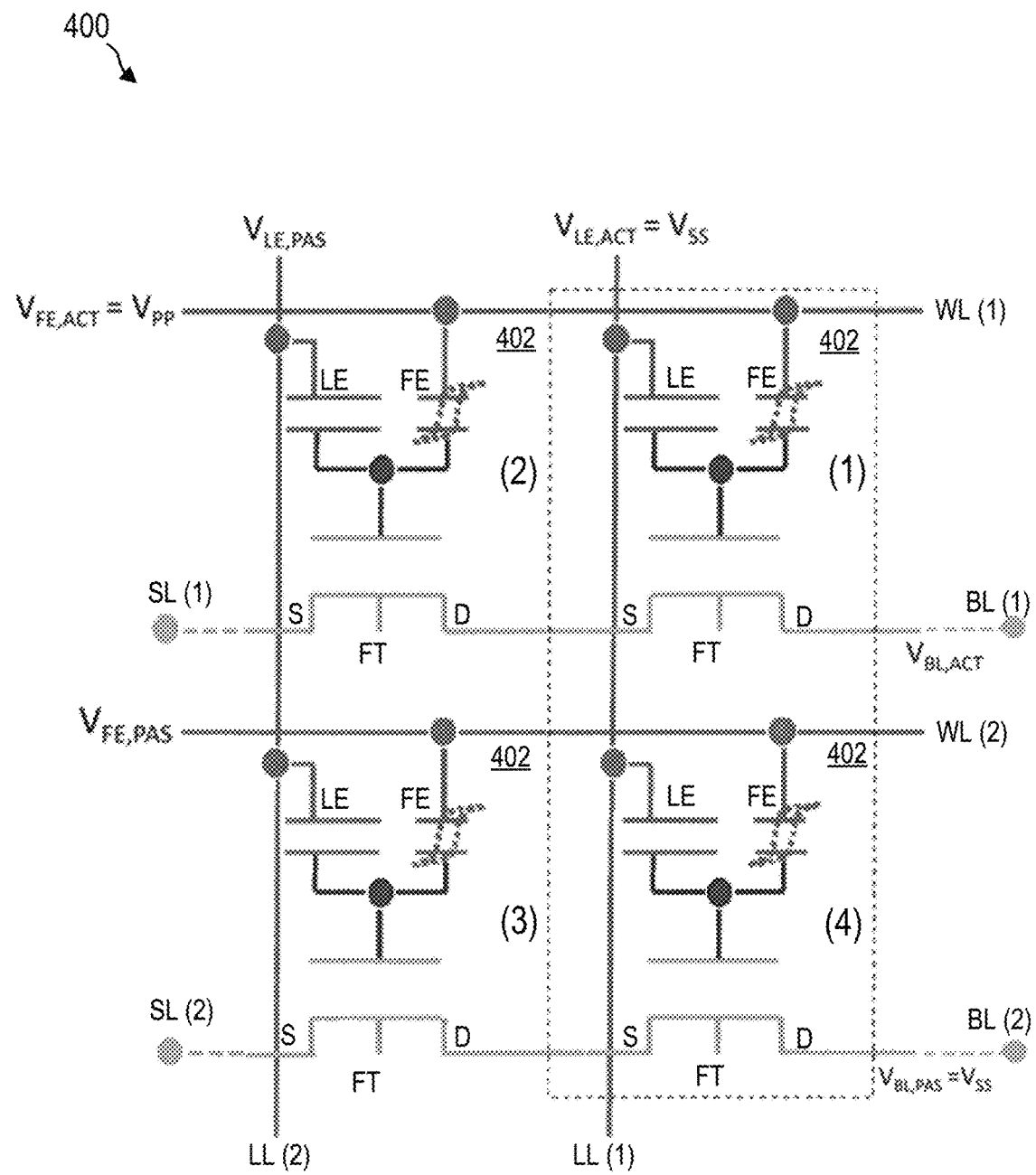
FIG. 4A schematically shows a memory cell arrangement having a NAND architecture during writing a memory cell of the memory cell arrangement, according to various aspects.
Figure 4B:
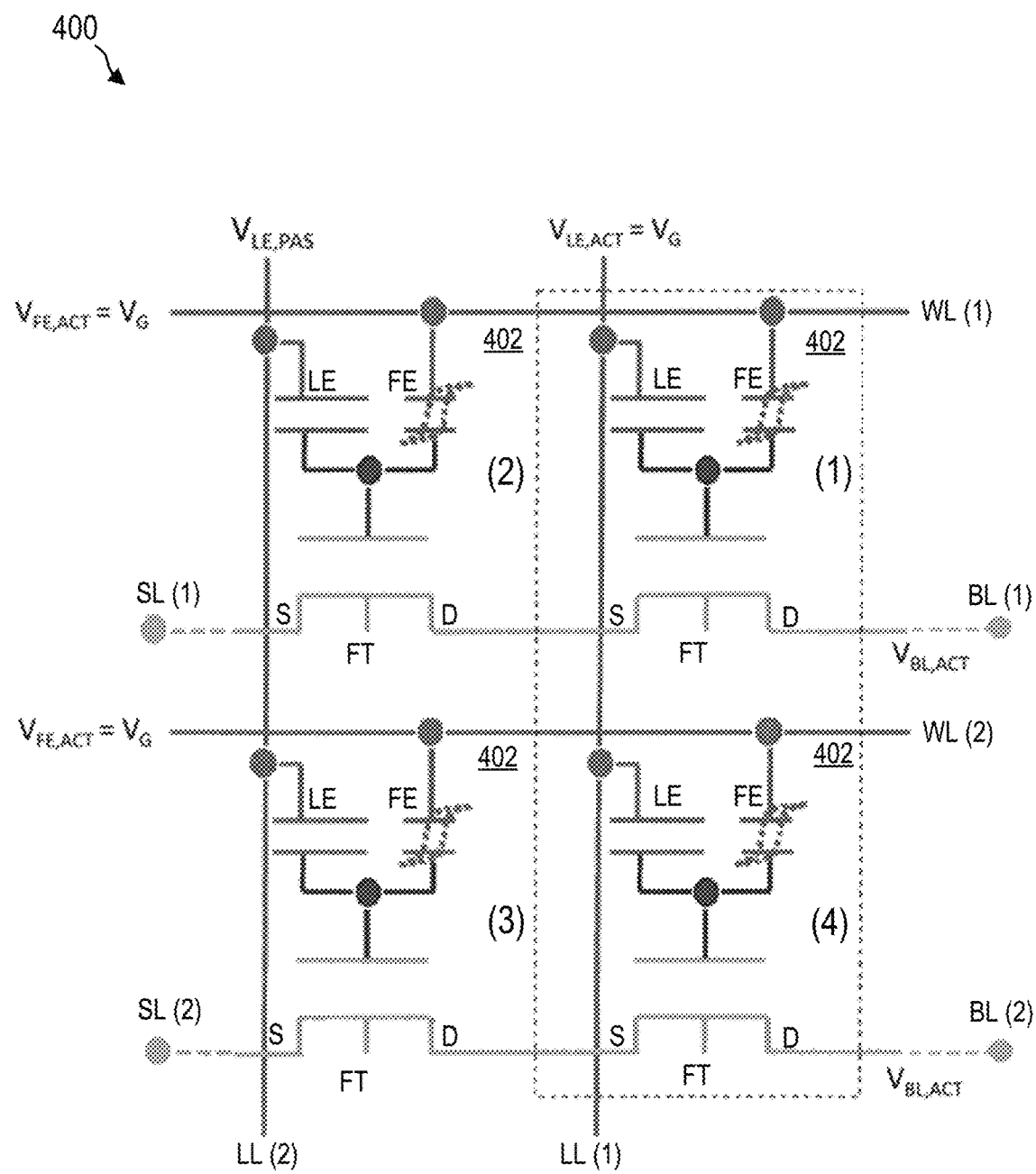
FIG. 4B schematically shows a memory cell arrangement having a NAND architecture during reading memory cells of the memory cell arrangement, according to various aspects.
Figure 4C:
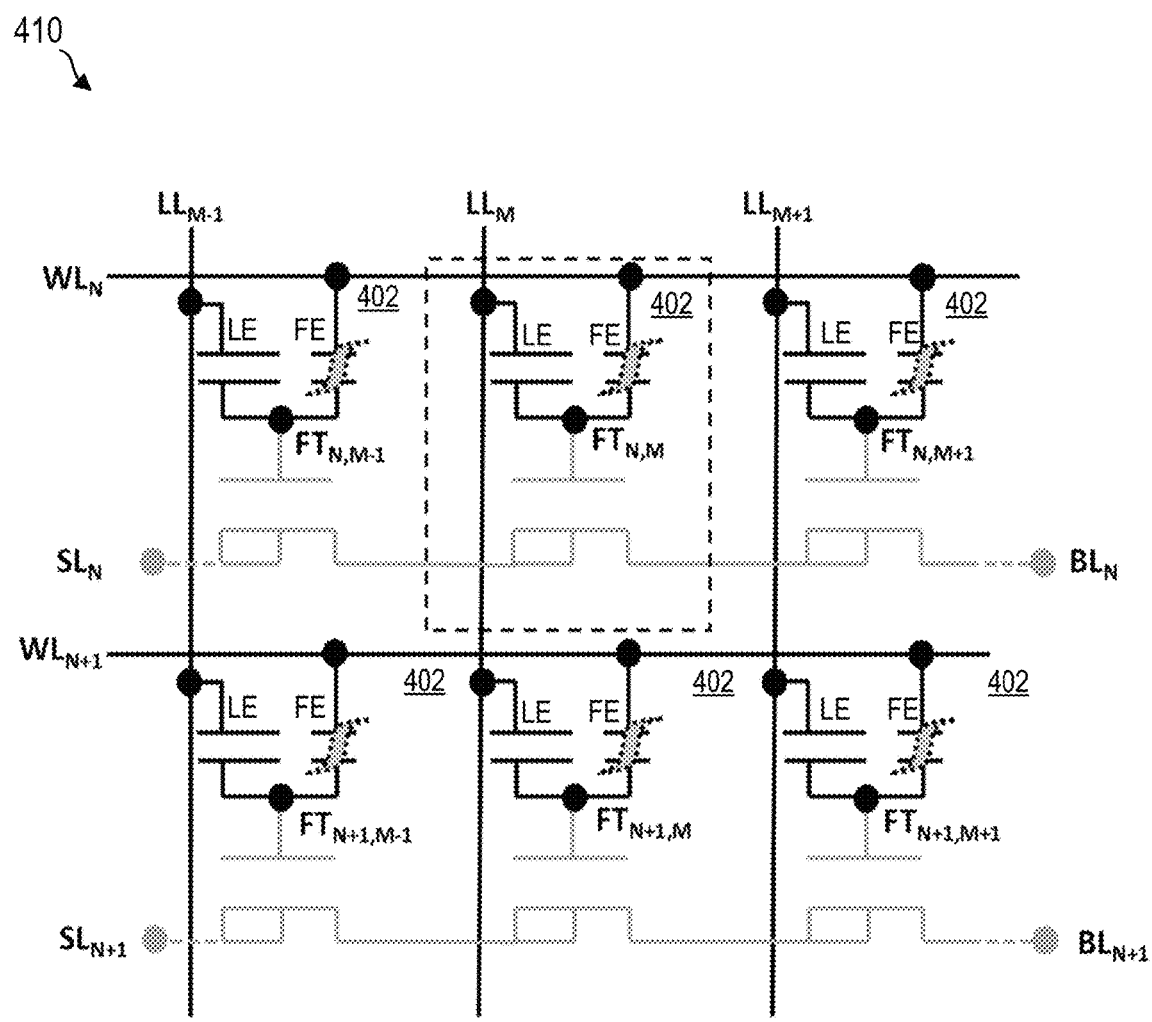
FIG. 4C schematically shows a memory cell arrangement having a NAND architecture, according to various aspects.

According to various aspects, the 1T2C memory cells of a memory cell arrangement (e.g., of memory cell arrangement 200 described herein with reference to FIG. 1) may be organized as an array based on a NAND architecture (e.g., the memory cells of the plurality of memory cells may be in a NAND configuration), as illustrated in FIG. 4A, FIG. 4B, and FIG. 4C.

In the NAND configuration, the field-effect-transistor structures associated with memory cells that share a corresponding word-line (e.g., WL(1), e.g., WL(2)) may be in a serial connection. For example, the first and second regions of the field-effect-transistor structures may be in a serial connection. For example, two respective neighboring memory cells are first region to second region connected. For example, two respective neighboring memory cells may have a shared first/second region including a first region of one field-effect transistor structure and the second region of another field-effect transistor structure. Illustratively, the first and second regions of the field-effect-transistor structures which are in a serial connection may form the bit-line. The memory cell arrangement may include one or more third control nodes. Each of the one or more third control nodes may be connected to the first region of each field-effect transistor structure of the field-effect-transistor structures, which are in a serial connection. The memory cell arrangement may include one or more fourth control nodes. Each of the one or more fourth control nodes may be connected to the second region of each field-effect transistor structure of the field-effect-transistor structures which are in a serial connection.

FIG. 4A shows exemplarily a writing of a memory cell (1) of a memory cell arrangement 400, according to various aspects. The memory cell arrangement 400 may be configured in the same way or in a similar way as described herein with reference to the memory cell arrangement 200, see FIG. 1. Each memory cell 402 of the memory cell arrangement 400 may include a lever capacitor LE, a ferroelectric capacitor FE, and a field-effect transistor FT. The lever capacitor LE of the respective memory cell 402 may be connected to a corresponding lever-line LL(1), LL(2) and to the floating gate of the field-effect transistor FT of the respective memory cell 402. The ferroelectric capacitor FE of the respective memory cell 402 may be connected to a corresponding word-line WL(1), WL(2) and to the floating gate of the field-effect transistor FT of the respective memory cell 402. The field-effect-transistor structures associated with memory cells that share a corresponding word-line WL(1), WL(2)) may be in a serial connection. Illustratively, the serial connection of the memory cells may form a corresponding control-line. For example, a voltage applied to a control-line may be applied to a common drain D connection of the memory cells corresponding to the control-line. For example, a voltage applied to a control-line may be applied to a common source S connection of the memory cells corresponding to the control-line. According to various aspects, a bit-line voltage may be applied to a common drain D connection (e.g., a third terminal BL(1), BL(2) of the memory cell arrangement 400) of the memory cells corresponding to the control-line and a source-line voltage may be applied to a common source S connection (e.g., a fourth terminal SL(1), SL(2) of the memory cell arrangement 400) of the memory cells corresponding to the control-line.

According to various aspects, each third terminal may be connected to a corresponding bitline (e.g., BL(1), BL(2)). According to various aspects, each fourth terminal may be connected to a corresponding sourceline (e.g., SL(1), SL(2)).

In this example, it may be assumed that only memory cell (1) of the memory cell arrangement 400 is intended to be written (is selected to be written, e.g., referred to as selected memory cell). To program or erase the memory cell (1), a write voltage $V_{PP}$ may be applied to the active word-line connected to the ferroelectric capacitor FE of the selected memory cell (1). In this case, the voltage ($V_{FE,ACT}$) applied at the corresponding word-line (WL(1)) may be the write voltage $V_{PP}$ (also referred to as programming voltage $V_{PP}$). Further, to program or erase the memory cell (1), a base voltage (e.g., $V_{SS}$) or a voltage close to the base voltage may be applied to the active lever-line connected to the lever capacitor LE of the selected memory cell (1). In this case, the voltage ($V_{LE,ACT}$) applied to the corresponding lever-line (LL(1)) may be, for example, a base voltage (e.g., 0 V) or a voltage close to a base voltage (e.g., a voltage in the range from about −0.25V to about 0.25 V). However, voltage greater than the base voltage may be applied to the active lever-line connected to the lever capacitor LE of the selected memory cell (1), e.g., a voltage in the range from about $V_{SS}$ to about $V_{PP}/2$. Further, to program or erase the memory cell (1), a base voltage (e.g., $V_{SS}$) or a voltage close to the base voltage may be applied to the active bit-line connected to the field-effect transistor FT of the selected memory cell (1). In this case, the voltage ($V_{BL,ACT}$) applied to the corresponding bit-line (BL(1)) may be, for example, a base voltage (e.g., 0 V) or a voltage close to a base voltage (e.g., a voltage in the range from about −0.25V to about 0.25 V). For example, the voltage ($V_{BL,ACT}$) applied to the corresponding bit-line (BL(1)) may be applied to the third terminal. Further, to program or erase the memory cell (1), a base voltage (e.g., $V_{SS}$) or a voltage close to the base voltage may be applied to the active source-line connected to the field-effect transistor FT of the selected memory cell (1). In this case, the voltage applied to the corresponding source-line (BL(1)) may be, for example, a base voltage (e.g., 0 V) or a voltage close to a base voltage (e.g., a voltage in the range from about −0.25V to about 0.25 V). For example, the voltage applied to the corresponding source-line (SL(1)) may be applied to the fourth terminal.

According to various aspects, the field-effect transistor structure may be in a non-conducting state during writing the selected memory cell. Illustratively, the field-effect transistor structure may be closed during writing the selected memory cell. This may, for example, increase the speed of writing the selected memory cell (e.g., with a write time of less than 15 ns, e.g., with a write time of less than 10 ns).

According to various aspects, the write voltage $V_{PP}$ may be, for example, in the range from about 1 V to about 10 V, e.g. from about 1.5 V to about 6 V.

According to various aspects, a voltage value of the write voltage $V_{PP}$ and a voltage value of the voltage ($V_{LE,ACT}$) applied to the corresponding lever-line (in the following also referred to as first lever voltage) may be bipolar (e.g., of opposite sign). For example, the write-voltage ($V_{PP}$) may have a positive voltage value and the first (active) lever-voltage ($V_{LE,ACT}$) may have a negative voltage value, or vice versa. According to an example, the write voltage $V_{PP}$ may have a voltage value of +1.0 V and the first lever voltage $V_{LE,ACT}$ may have a voltage value of −1.0 V.

According to various aspects, a disturbance of the other memory cells 402 of the memory cell arrangement 400 may be prevented during writing the selected memory cell (1).

As an example, to avoid a disturbance of the memory cell (2) of the memory cell arrangement 400 during writing the memory cell (1), a voltage different from $V_{SS}$ may be applied to the passive lever-line connected to the lever capacitor LE of the non-selected memory cell (2). A voltage different from $V_{SS}$ may be applied to all passive lever-lines connected to the lever capacitors LE of the non-selected memory cells of the memory cell arrangement 400 that share the same word-line (WL(1)) as the selected memory cell (1). According to various aspects, the voltage ($V_{LE,PAS}$) applied to the corresponding lever-line (LL(2)) may be, for example, in the range from about ½*|$V_{PP}$| to about |$V_{PP}$|.

According to various aspects, a voltage value of the first lever voltage ($V_{LE,ACT}$) and a voltage value of the voltage ($V_{LE,PAS}$) applied to all passive lever-lines connected to the lever capacitors LE of the non-selected memory cells of the memory cell arrangement 400 (in the following also referred to as second lever voltage) may be bipolar. For example, the first (active) lever voltage ($V_{LE,ACT}$) may have a negative voltage value and the second (passive) lever-voltage ($V_{LE,PAS}$) may have a positive voltage value, or vice versa. According to an example, the first lever voltage $V_{LE,ACT}$ may have a voltage value of −1.0 V and the second lever voltage $V_{LE,PAS}$ may have a voltage value of +0.4 V.

According to various aspects, the second lever voltage $V_{LE,PAS}$ may be selected such that the field-effect-transistor structures of the non-selected memory cells of the memory cell arrangement 400 may be in an inversion state.

According to various aspects, applying second (passive) lever-voltages ($V_{LE\_PAS}$) of opposite sign as compared to the first lever voltage ($V_{LE,ACT}$) and/or as compared to the write voltage ($V_{PP}$) may ensure that the memory state of the non-selected memory cells is not changed (e.g., neither written nor erased).

According to various aspects, in a NAND-configuration of the plurality of memory cells each field-effect transistor structure of the plurality of memory cells may be configured such (e.g., via implantation of a channel of the respective field-effect transistor structure) the LVT-state of the respective memory cell corresponds to an always-open state of the field-effect transistor structure.

As an example, to avoid disturb of the memory cells (3), (4) of the memory cell arrangement 400 during writing the memory cell (1), a voltage different from $V_{PP}$ may be applied to the passive word-line connected to the ferroelectric capacitor FE of the non-selected memory cells (3), (4). A voltage different from $V_{PP}$ may be applied to all passive word-lines connected to the ferroelectric capacitors FE of the non-selected memory cells of the memory cell arrangement 400 that do not share the same word-line (WL(1)) as the selected memory cell (1). According to various aspects, the voltage ($V_{FE,PAS}$) applied to the corresponding word-line (WL(2)) may be, for example, in the range from about 0 V (or $V_{SS}$) to about ½*|$V_{PP}$|.

According to various aspects, a voltage value of the write voltage ($V_{PP}$) and a voltage value of the voltage ($V_{FE,PAS}$) applied to all passive word-lines connected to the ferroelectric capacitors FE of the non-selected memory cells of the memory cell arrangement 400 (in the following also referred to as inhibit voltage) may be bipolar. For example, the write voltage ($V_{PP}$) may have a positive voltage value and the inhibit voltage ($V_{FE,PAS}$) may have a negative voltage value, or vice versa. According to an example, the write voltage $V_{PP}$ may have a voltage value of +1.0 V and the inhibit voltage $V_{FE,PAS}$ may have a voltage value of −0.2 V.

Further, to avoid disturb of the memory cells (3), (4) of the memory cell arrangement 400 during writing the memory cell (1), a base voltage (e.g., $V_{SS}$) or a voltage close to the base voltage may be applied to the passive bit-line connected to the field-effect transistor FT of the non-selected memory cells (3), (4). In this case, the voltage ($V_{BL,PAS}$) applied to the corresponding bit-line (BL(2)) may be, for example, 0 V or a voltage close to 0 V (e.g., a voltage in the range from about −0.25V to about 0.25 V). For example, the voltage ($V_{BL,ACT}$) applied to the corresponding bit-line (BL(2)) may be applied to the third terminal corresponding to the bit-line (BL(2)).

Further, to avoid disturb of the memory cells (3), (4) of the memory cell arrangement 400 during writing the memory cell (1), a base voltage (e.g., $V_{SS}$) or a voltage close to the base voltage may be applied to the passive source-line connected to the field-effect transistor FT of the non-selected memory cells (3), (4). In this case, the voltage applied to the corresponding source-line (SL(2)) may be, for example, 0 V or a voltage close to 0 V (e.g., a voltage in the range from about −0.25V to about 0.25 V). For example, the voltage applied to the corresponding source-line (SL(2)) may be applied to the fourth terminal corresponding to the source-line (SL(2)).

As described exemplarily above, individual cells of the memory cell arrangement 400 can be erased. It is noted that some or all of the voltages described are only examples and that deviations from the described voltages may be possible.

As further described exemplarily above, the terminals of the memory cell 402 connected to the bit-line (e.g., connected to the source/drain regions of the field-effect transistor of the memory cell 402) may be kept at $V_{SS}$ (or at least close to $V_{SS}$) eliminating the power consumption from reverse junction leakage from bulk to source and drain during inhibition.

According to various aspects, a memory cell of the memory cell arrangement 400 may be read. To increase a reading speed, more than one memory cell of the memory cell arrangement 400 may be read substantially simultaneously. In the following example, reading two memory cells (1), (2) of the memory cell arrangement 400 is described. It is noted that reading a single memory cell of the memory cell arrangement 400 may be performed in a similar way.

FIG. 4B shows exemplarily a reading of memory cells (1), (2) of the memory cell arrangement 400, according to various aspects.

In this example, it may be assumed that two corresponding memory cells (1) and (4) of the NAND-configured memory cell arrangement 400 are intended to be read (are selected to be read, referred to as selected memory cells). To read the memory cells (1), (2), a read voltage $V_G$ may be applied to the active word-lines connected to the ferroelectric capacitors FE of the selected memory cells (1), (2). In this case, the voltage ($V_{FE,ACT}$) applied to the corresponding word-lines (WL(1), WL(2)) may be the read voltage $V_G$.

Further, to read the memory cells (1), (2), a voltage ($V_{LE,ACT}$) may be applied to the active lever-line connected to the lever capacitor LE of the selected memory cells (1), (2). In this case, the voltage ($V_{LE,ACT}$) applied to the corresponding lever-line (LL(1)) may be substantially equal to the read voltage $V_G$.

Further, to read the memory cells (1), (2), a potential/voltage greater than $V_{SS}$ may be applied to the active bit-lines connected to the field-effect transistors FT of the selected memory cells (1), (2). In this case, the voltage ($V_{BL,ACT}$) applied to the corresponding bit-lines (BL(1), BL(2)) may be, for example, greater than 0 V. In an example, the voltage ($V_{BL,ACT}$) applied to the corresponding bit-lines (BL(1), BL(2)) may be 1 V. For example, the voltage ($V_{BL,ACT}$) applied to the corresponding bit-lines (BL(1), BL(2)) may be applied to the third terminals corresponding to the respective bit-line (BL(1), BL(2)).

Further, to read the memory cells (1), (2), a potential/voltage greater than $V_{SS}$ may be applied to the active source-lines connected to the field-effect transistors FT of the selected memory cells (1), (2). In this case, the voltage applied to the corresponding source-lines (SL(1), SL(2)) may be, for example, substantially equal to 0 V. In an example, the voltage applied to the corresponding source-lines (SL(1), SL(2)) may be 0 V. For example, the voltage applied to the corresponding source-lines (SL(1), SL(2)) may be applied to the fourth terminals corresponding to the respective source-line (SL(1), SL(2)). Reading the selected memory cells (1), (2) may include providing the voltages to the third terminals and the fourth terminals such that each field-effect transistor structure associated with the other memory cells of the respective first subsets of memory cells, the selected memory cells are included in, are in a conducting state. For example, the voltages may be applied to the third terminals and the fourth terminals such that each field-effect transistor structure that is in a serial connection with the selected memory cells (1), (2) is in a conducting state.

The bulk and source terminals of the field-effect transistors of the memory cells may be kept at a voltage at or close to $V_{SS}$ (e.g., a voltage of 0 V or in the range from about −0.25V to about 0.25 V.

According to an example, the read voltage $V_G$ may have a voltage value of 0.7 V and the voltage ($V_{LE,ACT}$) applied to the corresponding lever-line may have a voltage value of 0.5 V.

According to various aspects, a voltage value of the read voltage $V_G$ and a voltage value of the voltage ($V_{LE,ACT}$) applied to the corresponding lever-line (in the following also referred to as first lever voltage) may be bipolar. For example, the read-voltage ($V_G$) may have a positive voltage value and the first (active) lever-voltage ($V_{LE,ACT}$) may have a negative voltage value, or vice versa.

According to various aspects, disturb of the other memory cells 402 of the memory cell arrangement 400 may be prevented during reading the selected memory cells (1), (2).

As an example, to avoid disturb of the memory cell (2) of the memory cell arrangement 400 during reading the memory cells (1), (2), a voltage different from $V_G$ may be applied to the passive lever-line connected to the lever capacitor LE of the non-selected memory cell (2). A voltage different from $V_G$ may be applied to all passive lever-lines connected to the lever capacitors LE of the non-selected memory cells of the memory cell arrangement 400 that share the same word-lines (WL(1), WL(2)) as the selected memory cells (1), (2). According to various aspects, the voltage ($V_{LE,PAS}$) applied to the corresponding lever-line (LL(2)) may be, for example, in the range from about $V_{SS}$ (e.g., 0 V) to about $\frac{1}{2}*|V_G|$. According to an example, the first lever voltage $V_{LE,ACT}$ may be +0.5 V and the second lever voltage $V_{LE,PAS}$ may be 1.0 V.

According to various aspects, a voltage value of the first lever voltage ($V_{LE,ACT}$) and a voltage value of the voltage ($V_{LE,PAS}$) applied to all passive lever-lines connected to the lever capacitors LE of the non-selected memory cells of the memory cell arrangement 400 (in the following also referred to as second lever voltage) may be bipolar. For example, the first (active) lever voltage ($V_{LE,ACT}$) may have a positive voltage value and the second (passive) lever-voltage ($V_{LE\_PAS}$) may have a negative voltage value, or vice versa.

According to various aspects, applying second (passive) lever-voltages ($V_{LE\_PAS}$) of opposite sign as compared to the first lever voltage ($V_{LE\_PAS}$) and/or as compared to the read voltage ($V_G$) may ensure that the memory state of the non-selected memory cells is not changed (e.g., neither written nor erased).

As an example, the memory cell arrangement 400 may include additional memory cells and to avoid disturb of one or more of the additional memory cells of the memory cell arrangement 400 during reading the memory cells (1), (2), a voltage different from $V_G$ may be applied to the passive word-line connected to the ferroelectric capacitor FE of the non-selected memory cells. A voltage different from $V_G$ may be applied to all passive word-lines connected to the ferroelectric capacitors FE of the non-selected memory cells of the memory cell arrangement 400 that do not share the same word-lines (WL(1), WL(2)) as the selected memory cells (1), (2). According to various aspects, the voltage ($V_{FE,PAS}$) applied to the corresponding word-lines of the non-selected memory cells may be, for example, in the range from about $V_{SS}$ (e.g., 0 V) to about $\frac{1}{2}*|V_G|$.

According to various aspects, a voltage value of the read voltage ($V_G$) and a voltage value of the voltage ($V_{FE,PAS}$) applied to all passive word-lines connected to the ferroelectric capacitors FE of the non-selected memory cells of the memory cell arrangement 400 (in the following also referred to as inhibit voltage) may be bipolar. For example, the read voltage ($V_G$) may have a positive voltage value and the inhibit voltage ($V_{FE,PAS}$) may have a negative voltage value, or vice versa.

Further, to avoid disturb of the one or more of the additional memory cells of the memory cell arrangement 400 during reading the memory cells (1), (2), a base voltage (e.g., $V_{SS}$) or a voltage close to the base voltage may be applied to the passive bit-line connected to the field-effect transistor FT of the non-selected memory cells. A voltage that equals the base voltage or that is close to the base voltage may be applied to all passive bit-lines and source-lines connected to the field-effect transistors of the non-selected memory cells of the memory cell arrangement 400 that do not share the same word-lines (WL(1), WL(2)) as the selected memory cells (1), (2). In this case, the voltage ($V_{BL,PAS}$) applied to the corresponding bit-lines and/or source-lines of the non-selected memory cells may be, for example, 0 V or a voltage close to 0 V (e.g., a voltage in the range from about −0.25V to about 0.25 V).

As described exemplarily above, individual NAND cell pairs of the memory cell arrangement 400 can be read. It is noted that some or all of the voltages described are only examples and that deviations from the described voltages may be possible.

According to various aspects, the bulk and source terminals of the transistors of the memory cells 402 (that includes semiconductor material) may be kept at $V_{SS}$ but the active bit-line potential may be charged to a potential greater than $V_{SS}$ to detect a charge created by the ferroelectric capacitor FE.

According to various aspects, a memory cell is described herein including or consisting of one transistor and two capacitors, one of the two capacitors being a ferroelectric capacitor. By increasing the capacitance of the capacitor which does not exhibit the ferroelectric charge (e.g., the lever capacitor), a program voltage can be obtained that is close to a program voltage of a standalone ferroelectric capacitor. During read, the voltage distribution may be changed (compared to writing) such that a disturbance of the ferroelectric material in the ferroelectric capacitor can be avoided and such that a good control over the transistor (e.g., a MOS transistor) can be obtained. During retention condition, the voltage over the ferroelectric material can be reduced to avoid depolarization of the ferroelectric portion.

According to various aspects, a NAND architecture is described herein to organize the 1T2C memory cell into an array structure to build memory arrays. By tuning the voltages applied on both capacitors, a disturbance during read and write can be reduced effectively. For write inhibition, junction leakages may be avoided, since all semiconductor terminals can be kept at ground. The structure allows bit-alterability for long channel transistors. According to various aspects, another memory element may be used instead of the ferroelectric capacitor, if desired. According to various aspects, another transistor may be used instead of the field-effect transistor, if desired.

According to various aspects, the lever capacitor may (or the second capacitor structure) may be configured such that it has a capacitance in the range from about 0.01 fF to about 100 fF, 0.1 fF to about 10 fF. However, the capacitance of the lever capacitor may be adapted to the other elements of the memory cell as desired.

An exemplary configuration of a memory cell arrangement 410 including six memory cells 402 having a NAND configuration and is shown in FIG. 4C. A memory cell 402 of the memory cell arrangement 410 may be written as described with respect to FIG. 4A. A memory cell 402 of the memory cell arrangement 410 may be read as described with respect to FIG. 4B. In an example, to read a selected memory cell, a read voltage with a voltage value of about 1.7 V may be applied to the wordline (WL) corresponding to the selected memory cell and a first (active) lever voltage with a voltage value of about 1.3 V may be applied to the leverline (LL) corresponding to the selected memory cell. For example, a second (passive) lever voltage with a voltage value of about 2.0 V may be applied to the passive leverlines corresponding to the non-selected memory cells.

According to various aspects, both capacitors of a 1T2C memory cell may be memory capacitors (in some aspects also referred to as memory capacitor structure). Both memory capacitor structures may include a spontaneously-polarizable material as a dielectric material. In the following, the memory capacitor structures are described exemplarily as being ferroelectric capacitors (e.g., including a ferroelectric material as spontaneously-polarizable material). Both ferroelectric capacitors may be configured to store a charge representing the actual information (e.g., representing a logic "0" or a logic "1") of the memory cell. Thus, each memory cell may be configured to store two bits. In the following, a memory cell configured to store more than one bit may also be referred to as multi-bit memory cell.

Figure 5:
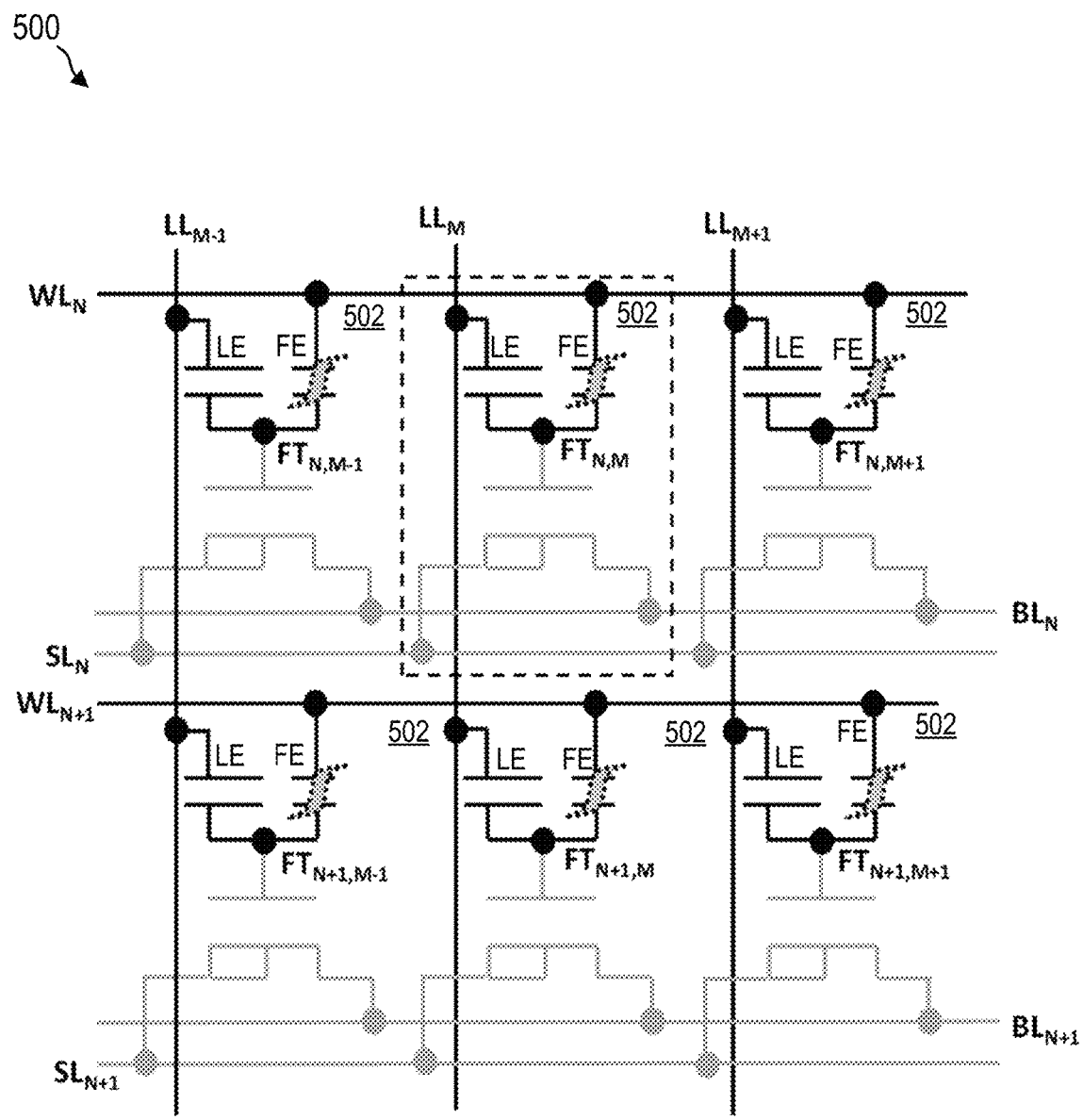
FIG. 5 schematically shows a memory cell arrangement having an AND architecture, according to various aspects.

According to various aspects, a plurality of 1T2C memory cells may be organized in an AND architecture. An exemplary configuration of a memory cell arrangement 500 including six memory cells 502 having an AND configuration is shown in FIG. 5. A memory cell 502 of the memory cell arrangement 500 may be written or read in a similar way as described with respect to NOR configurations, wherein further voltages at respective source-lines SL may be applied. In an example, to read a selected memory cell, a read voltage with a voltage value of about 0.6 V may be applied to the wordline (WL) corresponding to the selected memory cell and a first (active) lever voltage with a voltage value of about 0.9 V may be applied to the leverline (LL) corresponding to the selected memory cell. For example, a second (passive) lever voltage with a voltage value of about 0.3 V may be applied to the passive leverlines corresponding to the non-selected memory cells.

In the following, various aspects of a memory cell arrangement layout are described with reference to FIGS. 6A to 7F. The respective memory cell arrangement layout may include an efficient manufacturing of a memory cell arrangement including lever-type memory cells.

Figure 6A:
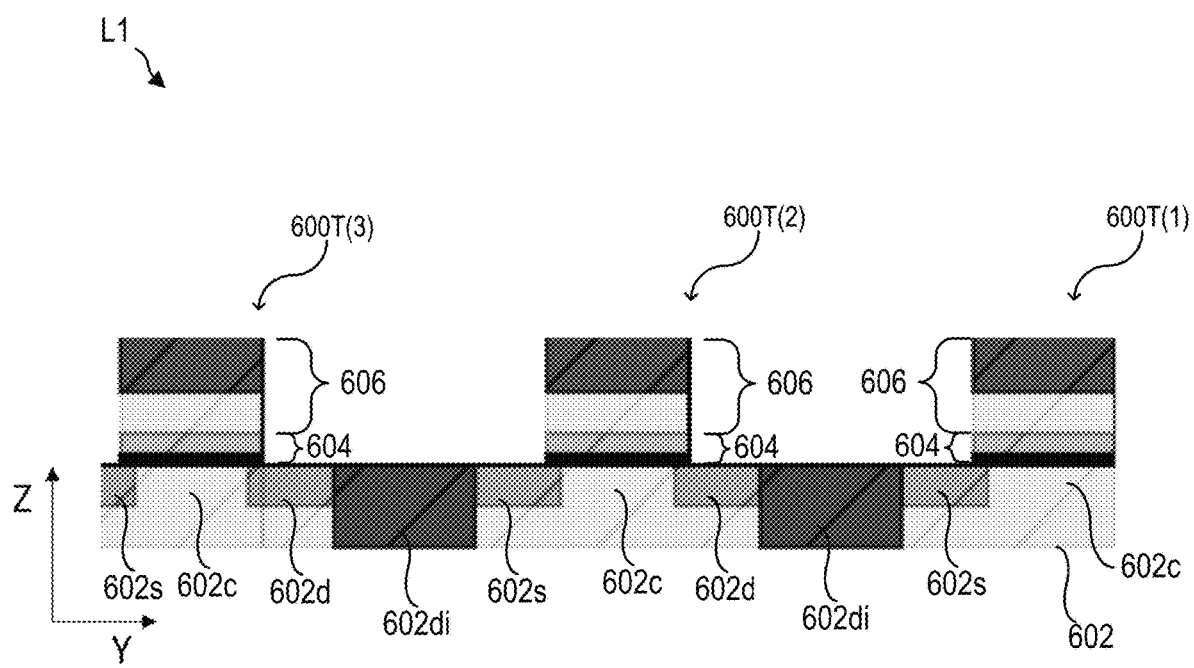
FIGS. 6A to 6F schematically show a memory cell arrangement and layouts thereof, according to various aspects.
Figure 6B:
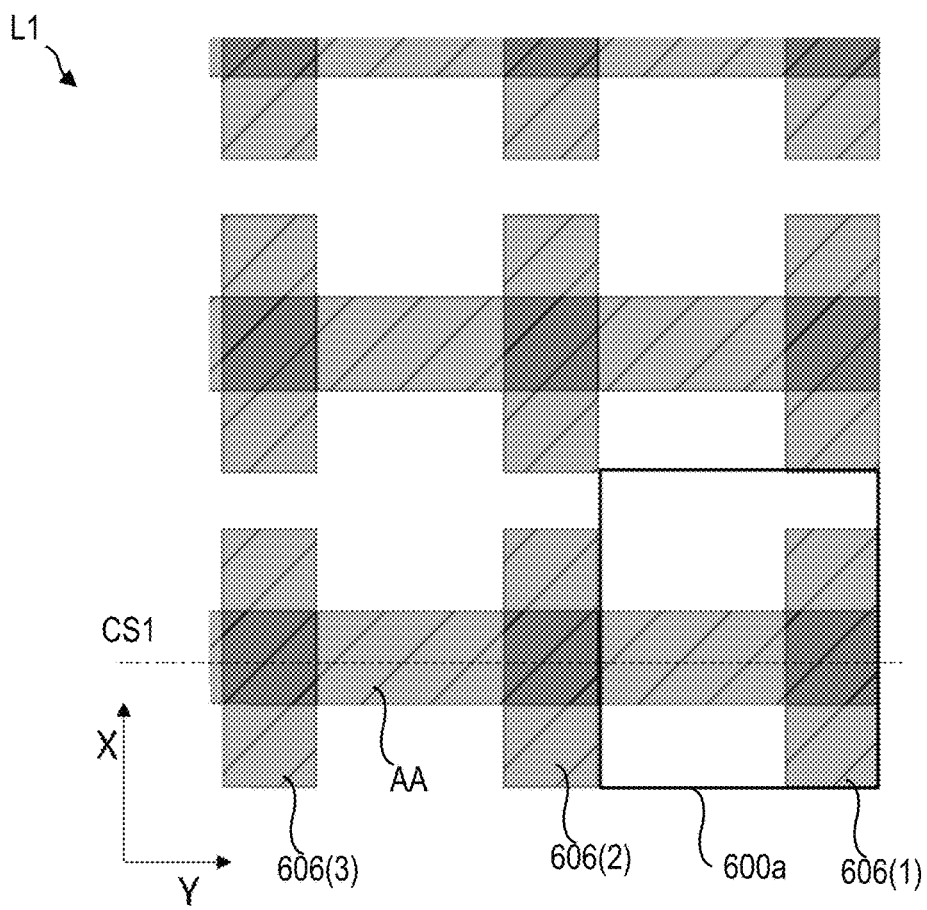
Figure 6B:
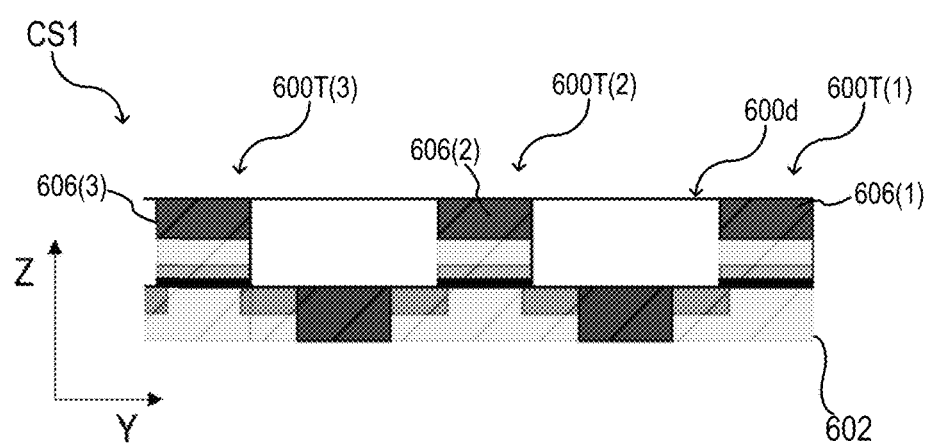
Figure 6C:
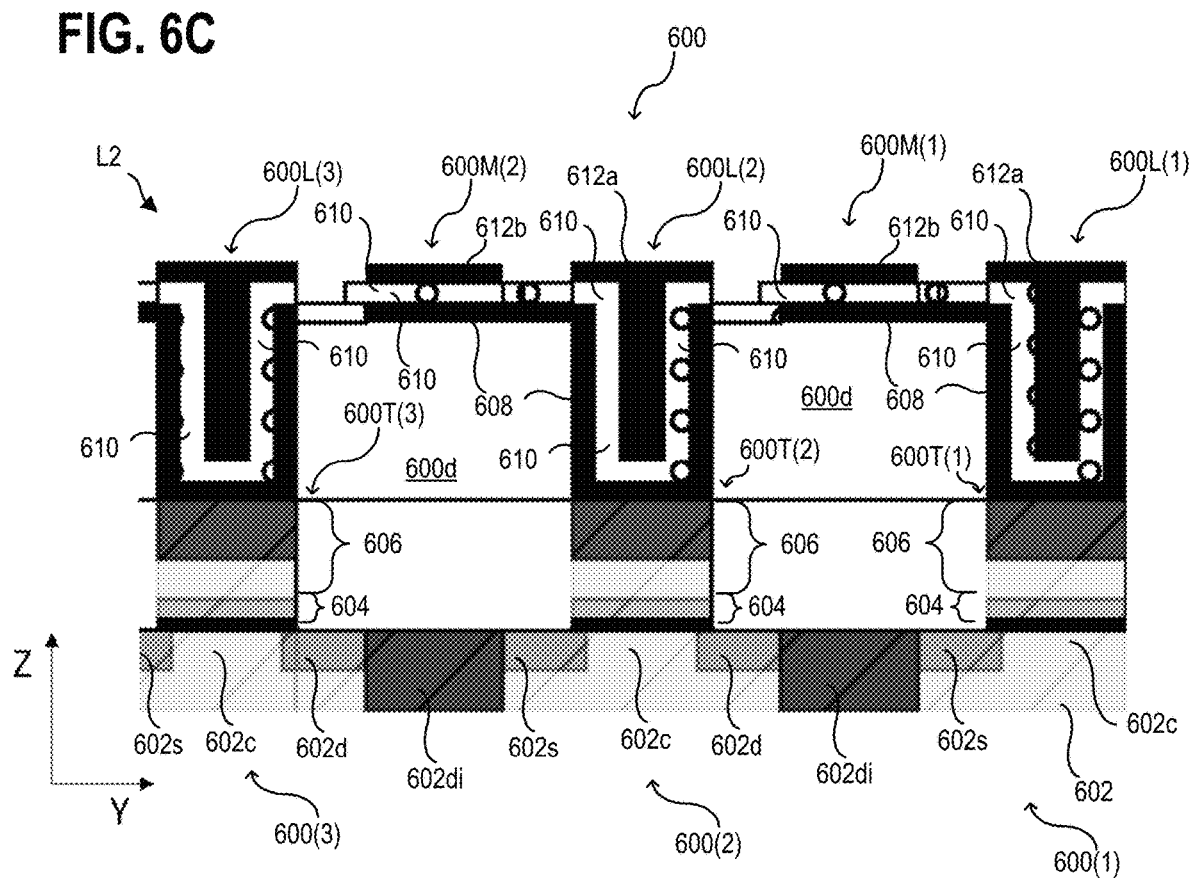
Figure 6D:
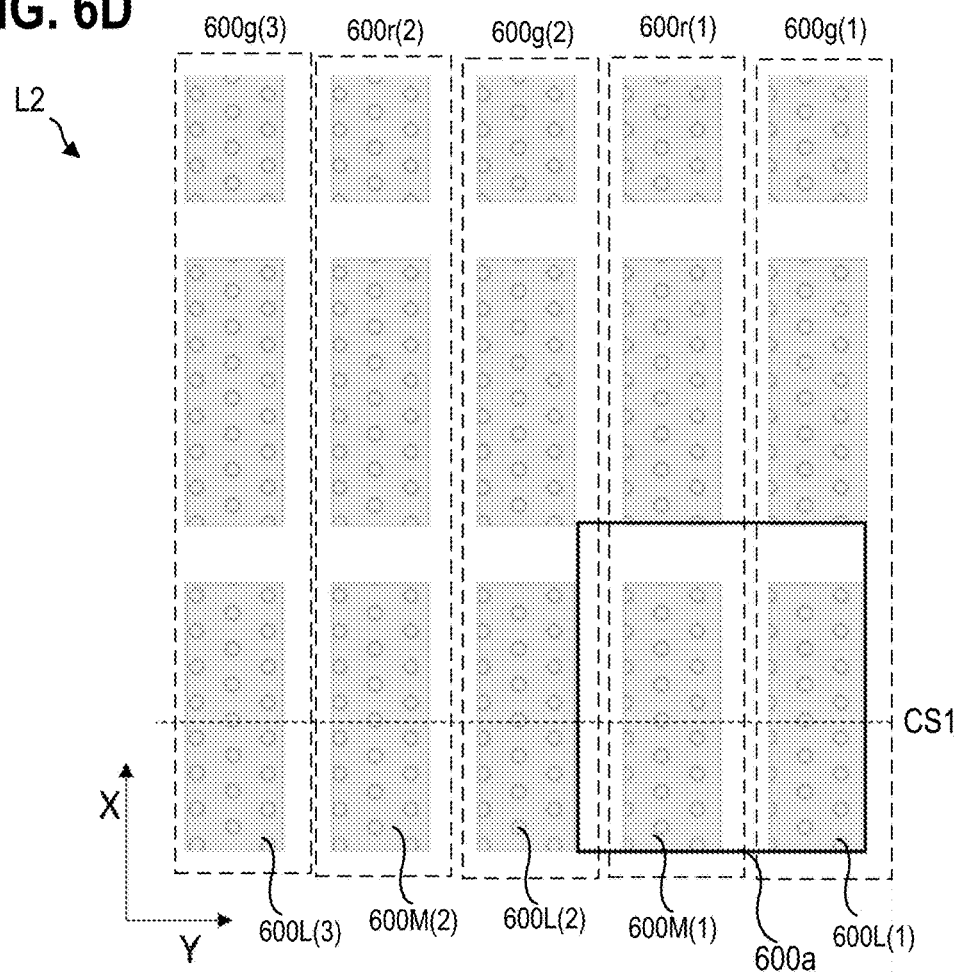
Figure 6D:
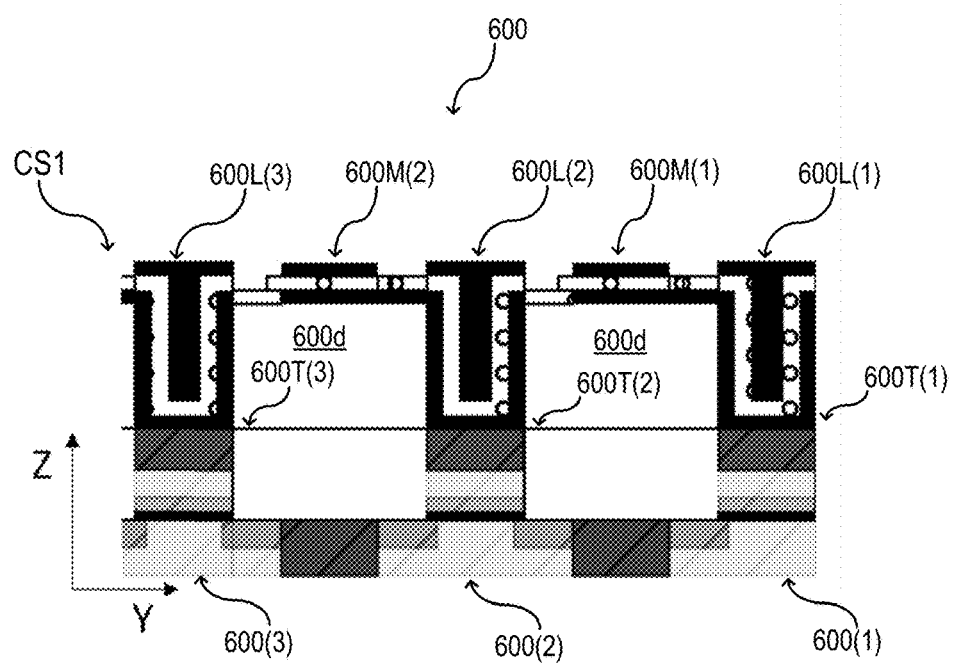
Figure 6E:
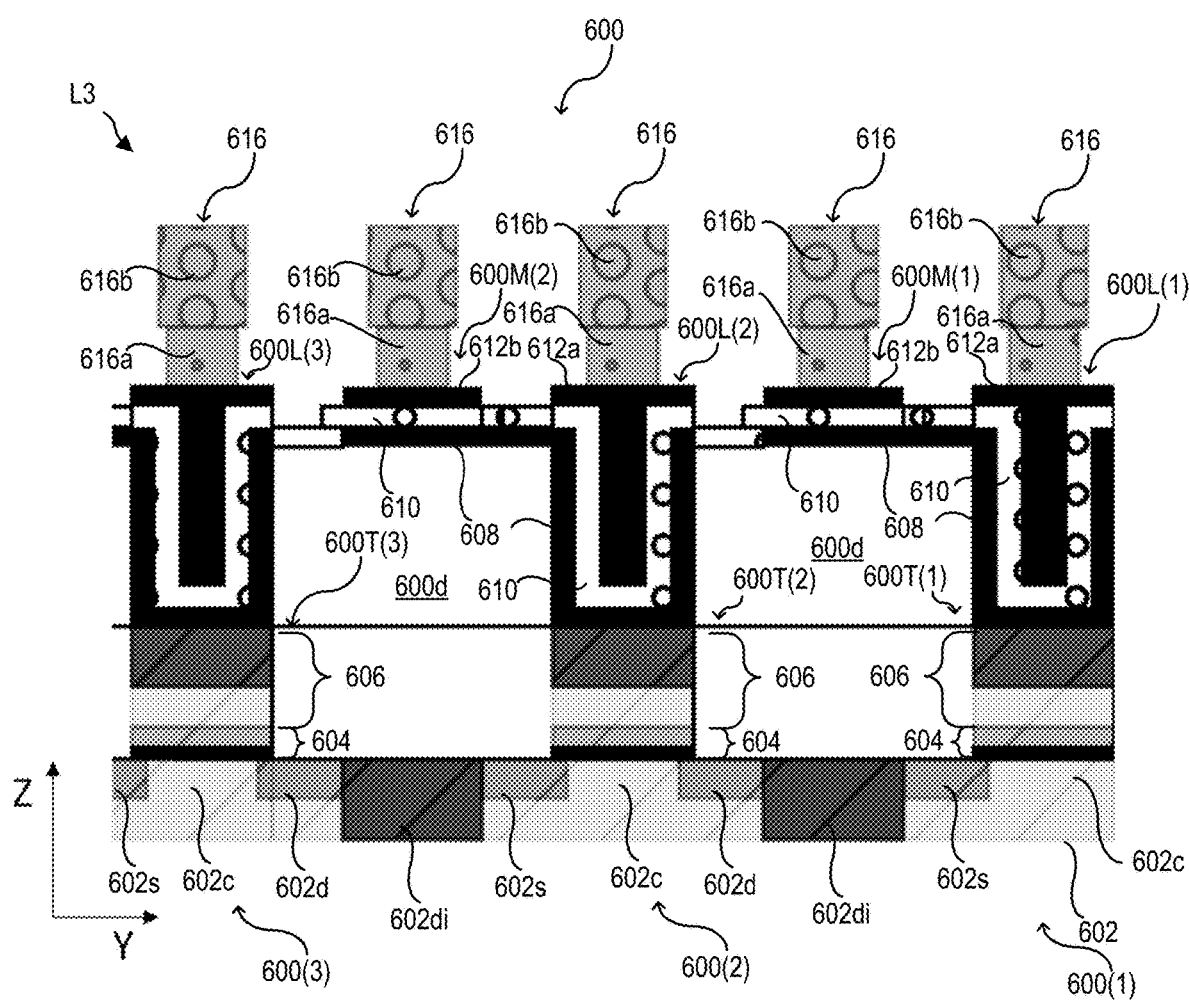
Figure 6F:
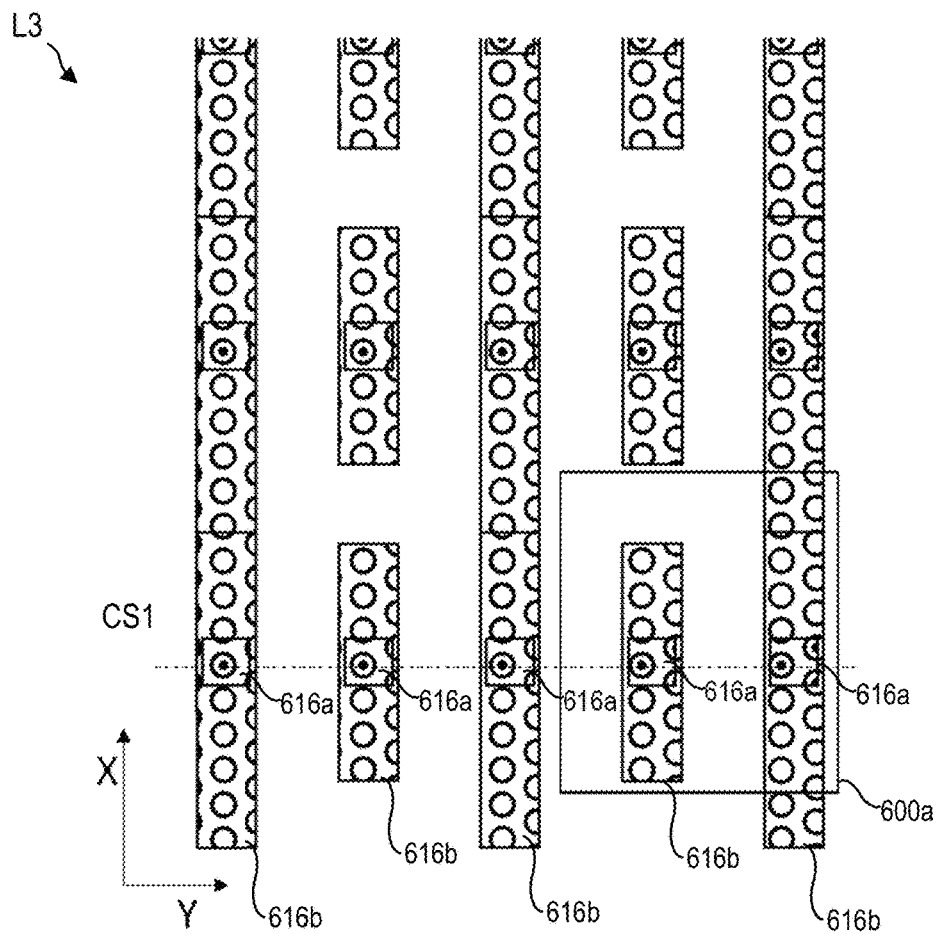
Figure 6F:
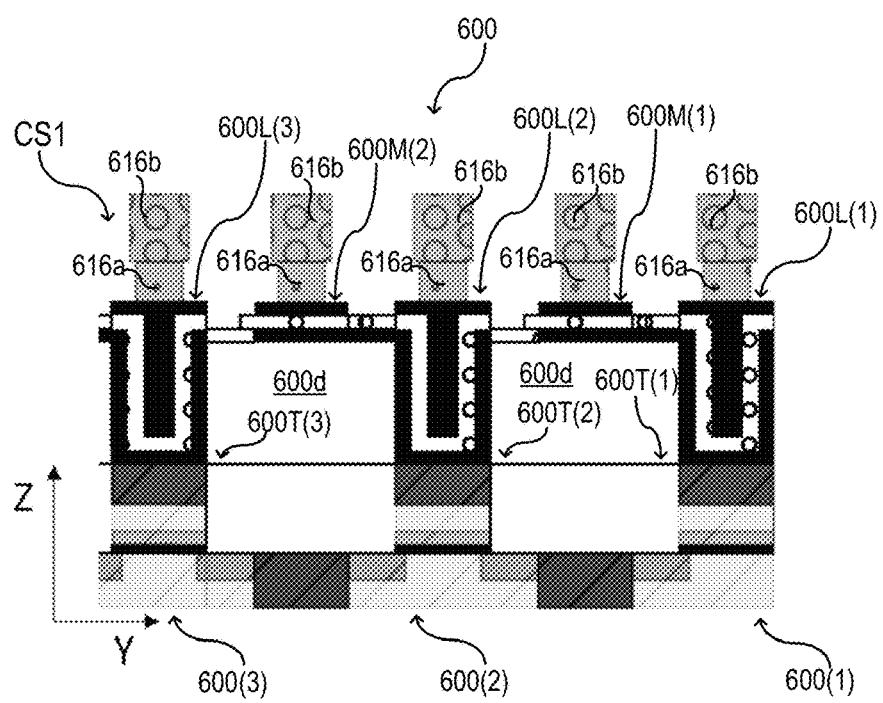

FIG. 6A, FIG. 6C, and FIG. 6E show an exemplary memory cell arrangement 600 in a schematic cross-sectional view, according to various aspects. FIG. 6B, FIG. 6D, and FIG. 6F show a schematic exemplary layout of the memory cell arrangement 600, according to various aspects. Each exemplary layout includes a top view and a cross-sectional view along a cross section line CS1. FIG. 6A and FIG. 6B illustrate a first level L1 of the memory cell arrangement 600 and the memory cell arrangement layout, FIG. 6C and FIG. 6D illustrate a second level L1 of the memory cell arrangement 600 and the memory cell arrangement layout, and FIG. 6E and FIG. 6F illustrate a third level L3 of the memory cell arrangement 600 and the memory cell arrangement layout, according to various aspects.

According to various aspects, the memory cell arrangement 600 may include a plurality of memory cells. Each memory cell may have a memory cell area 600a associated therewith, see, for example, FIG. 6B and FIG. 6D.

According to various aspects, a first memory cell 600(1) of the plurality of memory cells may include a first field-effect transistor structure 600T(1), a first capacitive memory structure 600M(1) coupled to a gate 606 of the first field-effect transistor structure 600T(1), and a first capacitive lever structure 600L(1) coupled to the gate 606 of the first field-effect transistor structure 600T(1), see, for example, FIG. 6C to FIG. 6F. According to various aspects, a second memory cell 600(2) of the plurality of memory cells may include a second field-effect transistor structure 600T(2), a second capacitive memory structure 600M(2) coupled to a gate 606 of the second field-effect transistor structure 600T(2), and a second capacitive lever structure 600L(2) coupled to the gate 606 of the second field-effect transistor structure 600T(2), see, for example, FIG. 6C to FIG. 6F.

According to various aspects, the first capacitive lever structure 600L(1) may be disposed over the gate 606 of the first field-effect transistor structure 600T(1), e.g., in a first recess formed in a dielectric layer 600d over the gate 606 of the first field-effect transistor structure 600T(1). According to various aspects, the second capacitive lever structure 600L(2) may be disposed over the gate 606 of the second field-effect transistor structure 600T(2), e.g., in a first recess formed in a dielectric layer 600d over the gate 606 of the second field-effect transistor structure 600T(2).

According to various aspects, the first capacitive memory structure 600M(1) and the second capacitive memory structure 600M(2) may be disposed in respective a memory structure region 600r(1), 600r(2), see, for example, FIG. 6D. The first capacitive memory structure 600M(1) may be disposed between the first capacitive lever structure 600L(1) and the second capacitive lever structure 600L(2). The first memory structure region 600r(1) in which the first capacitive memory structure 600M(1) is formed is disposed between a first lever structure region 600g(1) associated with the first memory cell 600(1) and a second lever structure region 600g(2) associated with the second memory cell 600(1). Illustratively, the first capacitive memory structure 600M(1) is formed between the first capacitive lever structure 600L(1) and the second capacitive lever structure 600L(2). The second memory structure region 600r(2) in which the second capacitive memory structure 600M(2) is formed is disposed between a second lever structure region 600g(2) associated with the second memory cell 600(2) and a further lever structure region 600g(3) associated with a further memory cell, see, for example, FIG. 6D. Illustratively, the second capacitive memory structure 600M(2) is formed between the second capacitive lever structure 600L(2) and a further capacitive lever structure 600L(3).

It is noted that some components of the memory cell arrangement 600 may be part of third memory cell; such components may be marked with (3). It is understood, that the memory cell arrangement may include more than two or three memory cells, e.g., hundreds of memory cells or more.

According to various aspects, each field-effect transistor structure 600T(1, 2, 3) has a gate 606(1, 2, 3) associated therewith, see, for example, FIG. 6B. The respective gate 606(1, 2, 3) may define the position in which the corresponding capacitive lever structure 600L(1, 2, 3) is formed. Each capacitive lever structure 600L(1, 2, 3) may be formed directly over, e.g., in direct physical contact, with the corresponding gate 606(1, 2, 3). Each capacitive lever structure 600L(1, 2, 3) may be formed in a corresponding recess directly over, e.g., in direct physical contact, with the corresponding gate 606(1, 2, 3). To achieve an area efficient layout, the respective capacitive memory structures 600M(1, 2, 3) may be formed such that one of the capacitive memory structures 600M(1, 2, 3) is disposed between two neighboring capacitive lever structures 600L(1, 2, 3). Furthermore, to achieve an area efficient layout, the respective capacitive lever structures 600L(1, 2, 3) may be formed such that one of the capacitive lever structures 600L(1, 2, 3) is disposed between two neighboring capacitive memory structures 600M(1, 2, 3). Please note that each memory cell 600(1, 2, 3) of the memory cell arrangement 600 may include (may be formed by) a corresponding one of the capacitive lever structures 600L(1, 2, 3), a corresponding one of the capacitive memory structures 600M(1, 2, 3), and a corresponding one of the field-effect transistor structures 600T(1, 2, 3).

According to various aspects, each field-effect transistor structure 600T(1, 2, 3) may include a source region 602s, a drain region 602d, and a channel region 602c extending from the source region 602s to the drain region 602d. A gate structure may be disposed adjacent to the channel region 602c to control one or more electrical properties (e.g., the conductance) thereof (see, for example, FIG. 1). The control (e.g., addressing, writing, reading, as examples) of the memory cells 600(1, 2, 3) of the memory cell arrangement 600 may be carried out as described herein with reference to FIGS. 1 to 5. The gate structure of the respective field-effect transistor structure 600T(1, 2, 3) may include a gate isolation 604 and a gate electrode (606). The gate isolation 604 may include one or more gate isolation layers and the gate electrode may include one or more electrode layers.

According to various aspects, each of the capacitive lever structures 600L(1, 2, 3) may be laterally surrounded by a dielectric layer 600d. The capacitive lever structures 600L(1, 2, 3) may be formed as trench capacitor structures, as illustrated in FIGS. 6C to 6F. The trenches (also referred to as recesses) may be provided by the dielectric layer 600d. The dielectric layer 600d may be disposed at a level higher than the level of the gates 606 of the respective field-effect transistor structures 600T(1, 2, 3).

According to various aspects, the source region 602s of the first field-effect transistor structure 600T(1) and the drain region 602d of the second field-effect transistor structure 600T(2) may be electrically conductively connected to one another.

According to various aspects, the memory cell arrangement 600 may include a diffusion (e.g., a source/drain diffusion 602di) at least one of over or in a semiconductor substrate 602. The diffusion may be configured to electrically conductively connect the source region 602s of the first field-effect transistor structure 600T(1) and the drain region 602d of the second field-effect transistor structure 600T(2) with one another. In this way, a NAND configuration of the memory cell arrangement may be provided efficiently.

According to various aspects, the respective memory structure region 600r(1, 2) may be disposed over a corresponding diffusion (e.g., over the respective source/drain diffusion 602di corresponding to the field-effect transistor structures 600T(1, 2)). According to various aspects, the respective memory structure region 600r(1, 2) may overlap the corresponding diffusion (e.g., over the respective source/drain diffusion 602di corresponding to the field-effect transistor structures 600T(1, 2)) with respect to a projection along a vertical direction. In the figures, the vertical direction may be represented by the z-axis and the lateral plane and lateral directions may be represented by the y-axis and x-axis.

According to various aspects, the each of the capacitive memory structures 600M(1, 2, 3) may include a bottom electrode 608. Furthermore, each of the capacitive lever structures 600L(1, 2, 3) may include a bottom electrode 608. The bottom electrodes 608 of a capacitive lever structure 600L(1, 2, 3) and a corresponding capacitive memory structure 600M(1, 2, 3) may be formed by a single electrode layer. The bottom electrodes 608 of a capacitive lever structure 600L(1, 2, 3) and a corresponding capacitive memory structure 600M(1, 2, 3) may be electrically conductively connected with one another. In some aspects, a capacitive lever structure 600L(1, 2, 3) and a corresponding capacitive memory structure 600M(1, 2, 3) may share a common electrode.

According to various aspects, all of the bottom electrodes 608 included in the capacitive memory structures 600M(1, 2, 3) and capacitive lever structures 600L(1, 2, 3) may be formed by patterning a single electrode layer. The single electrode layer may be referred to herein as first single electrode layer. In some aspects, the first single electrode layer may extend from the memory structure region 600r(1, 2) into the lever structure region 600g(1, 2), e.g., into one or more recesses that correspond to one or more of the capacitive lever structures 600L(1, 2, 3).

In some aspects, the a first single electrode layer may extend from the first memory structure region 600r(1) into the first lever structure region 600g(1), e.g., into a recess that corresponds to the first capacitive lever structure 600L(1) to thereby provide the connected bottom electrodes 608 associated with the first capacitive lever structure 600L(1) and the first capacitive memory structure 600M(1). In some aspects, the a second single electrode layer may extend from the second memory structure region 600r(2) into the second lever structure region 600g(2), e.g., into a recess that corresponds to the second capacitive lever structure 600L(2) to thereby provide the connected bottom electrodes 608 associated with the second capacitive lever structure 600L(2) and the second capacitive memory structure 600M(2). The first single electrode layer may be electrically separated from the second single electrode layer to allow an individual addressing of the first memory cell and the second memory cell receptively. The first single electrode layer may be electrically separated from the second single electrode layer to allow an individual addressing of the first capacitive memory structure 600M(1) and the second capacitive memory structure 600M(2). The first single electrode layer may be electrically separated from the second single electrode layer to allow an individual addressing of the first capacitive lever structure 600L(1) and the second capacitive lever structure 600L(2).

According to various aspects, each of the capacitive memory structures 600M(1, 2, 3) may include a top electrode 612b. According to various aspects, each of the capacitive lever structures 600L(1, 2, 3) may include a top electrode 612a. In some aspects, all of the top electrodes 612a, 612b of the capacitive lever structures 600L(1, 2, 3) and the capacitive memory structures 600M(1, 2, 3) may be electrically separated from one another to allow an individual addressing of the capacitive lever structures 600L(1, 2, 3) and the capacitive memory structures 600M(1, 2, 3) receptively.

According to various aspects, the memory cell arrangement may include one or more functional layers 610, e.g., a single functional layer, to modify the properties of the capacitive lever structures 600L(1, 2, 3) and the capacitive memory structures 600M(1, 2, 3).

According to various aspects, each of the capacitive memory structures 600M(1, 2, 3) may include a spontaneously polarizable layer 610, e.g., a remanent-polarizable layer. The respective spontaneously polarizable layer 610 included in the capacitive memory structures 600M(1, 2, 3) may be a portion of the one or more functional layers 610, e.g., the single functional layer.

According to various aspects, each of the capacitive lever structures 600L(1, 2, 3) may include a dielectric layer, e.g., a spontaneously polarizable layer, a non-spontaneously polarizable layer, a remanent-polarizable layer, or a non-remanent-polarizable layer. Since, according to various aspects, the capacitive lever structures 600L(1, 2, 3) may be operated in dielectric mode, the polarization properties of the capacitive lever structures 600L(1, 2, 3) may be of lower priority. In the case that the capacitive lever structures 600L(1, 2, 3) include a remanent-polarizable layer, the capacitive lever structures 600L(1, 2, 3) may be operated with voltages below the switching voltage (also referred to as programming voltage) such that the capacitive lever structures 600L(1, 2, 3) are not remanently polarized. As a result, various combinations of functional layer portions included in the capacitive lever structures 600L(1, 2, 3) and the capacitive memory structures 600M(1, 2, 3) are possible. However, this may allow a formation of all of the layer portions 610 between the bottom electrode 608 and top electrodes 612a, 612 by depositing a single functional layer.

According to various aspects, a single functional layer 610 may be configured (e.g., thermally treated, e.g., crystallized, as examples) such that functional layer portions included in the capacitive lever structures 600L(1, 2, 3) may include at least one of a dielectric material that is not remanently and/or spontaneously polarizable, a dielectric material that is remanently polarizable, and/or a dielectric material that is spontaneously polarizable. According to various aspects, a single functional layer 610 may be configured (e.g., thermally treated, e.g., crystallized, as examples) such that functional layer portions included in the capacitive memory structures 600M(1, 2, 3) may include at least one of a dielectric material that is remanently or spontaneously polarizable.

According to various aspects, the electrodes or electrode layers included in the memory cell arrangement 600 may include or may consist of Cu, Au, Ag, W, Al, Ru, Ti, TiN, Ta, TaN, Co, CoN, Nb, NbN, Pd, Pt, Ir, $IrO_2$, $RuO_2$, Poly-Si etc.

According to various aspects, the memory cell arrangement 600 may include a metallization structure 616, see, for example, FIG. 6E and FIG. 6F. The metallization structure 616 may electrically contact the top electrodes 612a, 612b of the capacitive lever structures 600L(1, 2, 3) and the capacitive memory structures 600M(1, 2, 3). The metallization structure 616 may include contact vias 616a and metal lines 616b. The metal lines 616b may be part of respective control lines that may be used to address the memory cells 600(1, 2, 3) of the memory cell arrangement 600, as described above. The contact vias 616a and the metal lines 616b may be embedded in a dielectric material.

According to various aspects, the bottom electrodes 608 of the capacitive lever structures 600L(1, 2, 3) and the capacitive memory structures 600M(1, 2, 3) may be electrically floating, e.g., may not be electrically connected to an externally addressed node.

According to various aspects, the capacitive lever structures 600L(1, 2, 3), the capacitive memory structures 600M(1, 2, 3), and the field-effect transistor structures 600T(1, 2, 3) may form a capacitive voltage divider as described herein, e.g., with reference to FIG. 1.

According to various aspects, a memory cell 600(1, 2) include in the memory cell arrangement 600 may define a cell area 600, also referred to as footprint, including only one field-effect transistor structure, only one capacitive memory structure, and only one capacitive lever structure, as illustrated exemplarily in FIG. 6B. FIG. 6B illustrates the active area AA in the semiconductor substrate 602 as well. This may allow an efficient formation of various memory cell arrangements. However, in some aspects, it may be desired to contact one of the diffusions included in the semiconductor substrate. In other aspects, it may be desired to reduce the overall footprint of the memory cells included in the memory cell arrangement 600. In the following, various aspects are described with reference to a memory cell arrangement 700 that may fulfill such requirements, see, for example, FIGS. 7A to 7F. It is noted that, for sake of brevity, components of the memory cell arrangement 700—as described, for example, with reference to FIGS. 7A to 7F—that are configured in the same or similar way as components of the memory cell arrangement 600—as described, for example, with reference to FIGS. 6A to 6F—are denoted with the same reference signs. Therefore, with respect to one or more components included in the memory cell arrangement 700 described in the following, reference is made to the disclosure provided above.

Figure 7A:
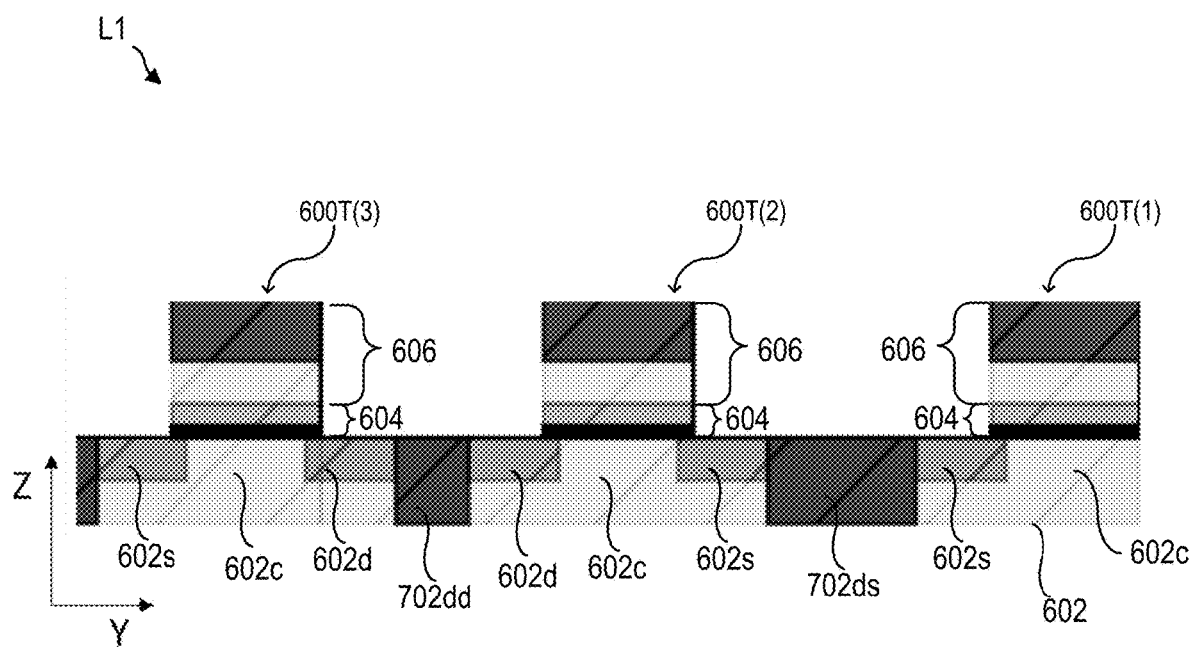
Figure 7B:
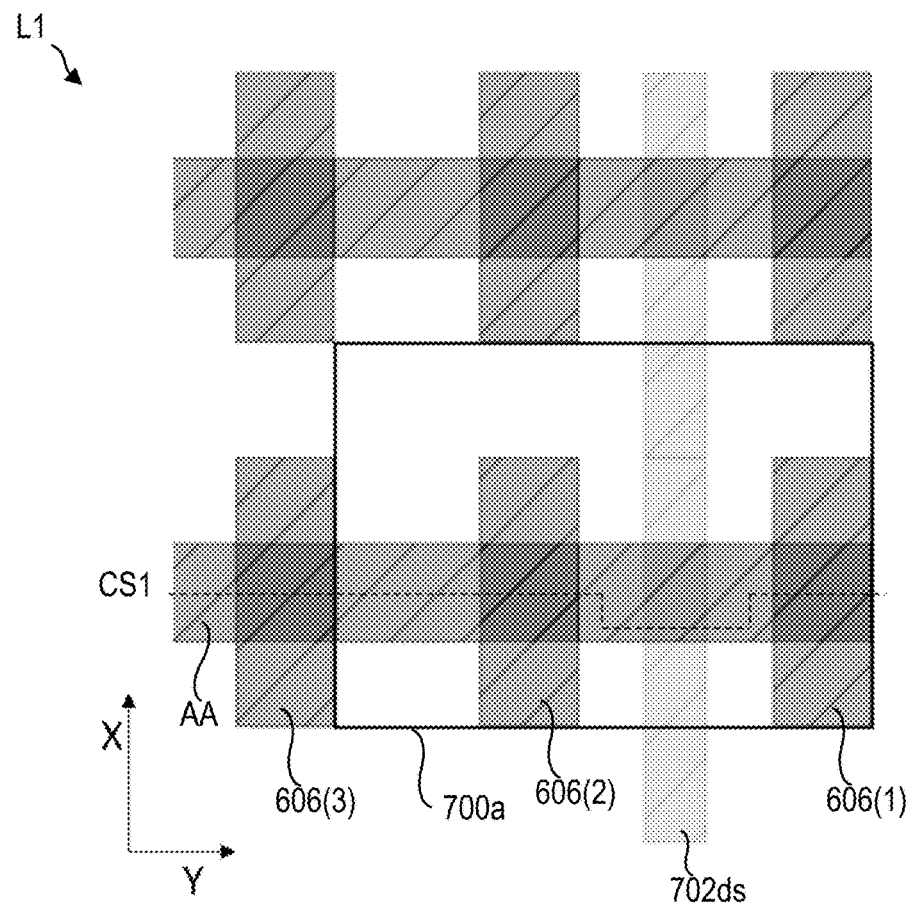
Figure 7B:
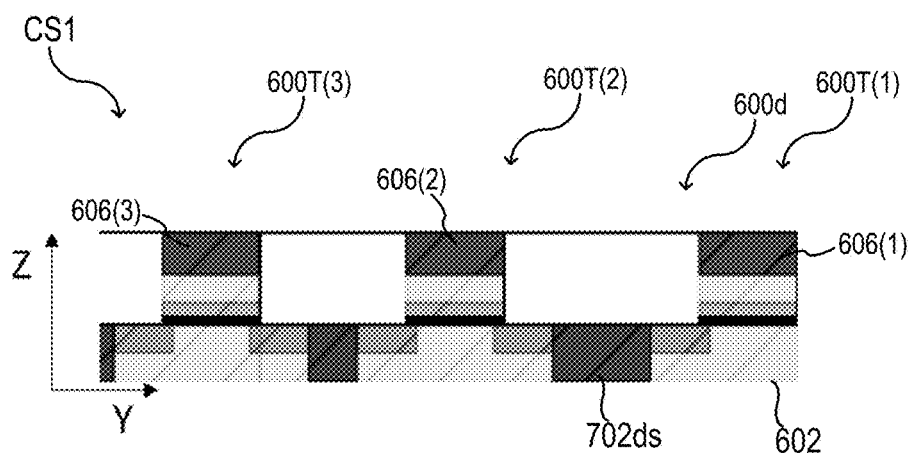
Figure 7D:
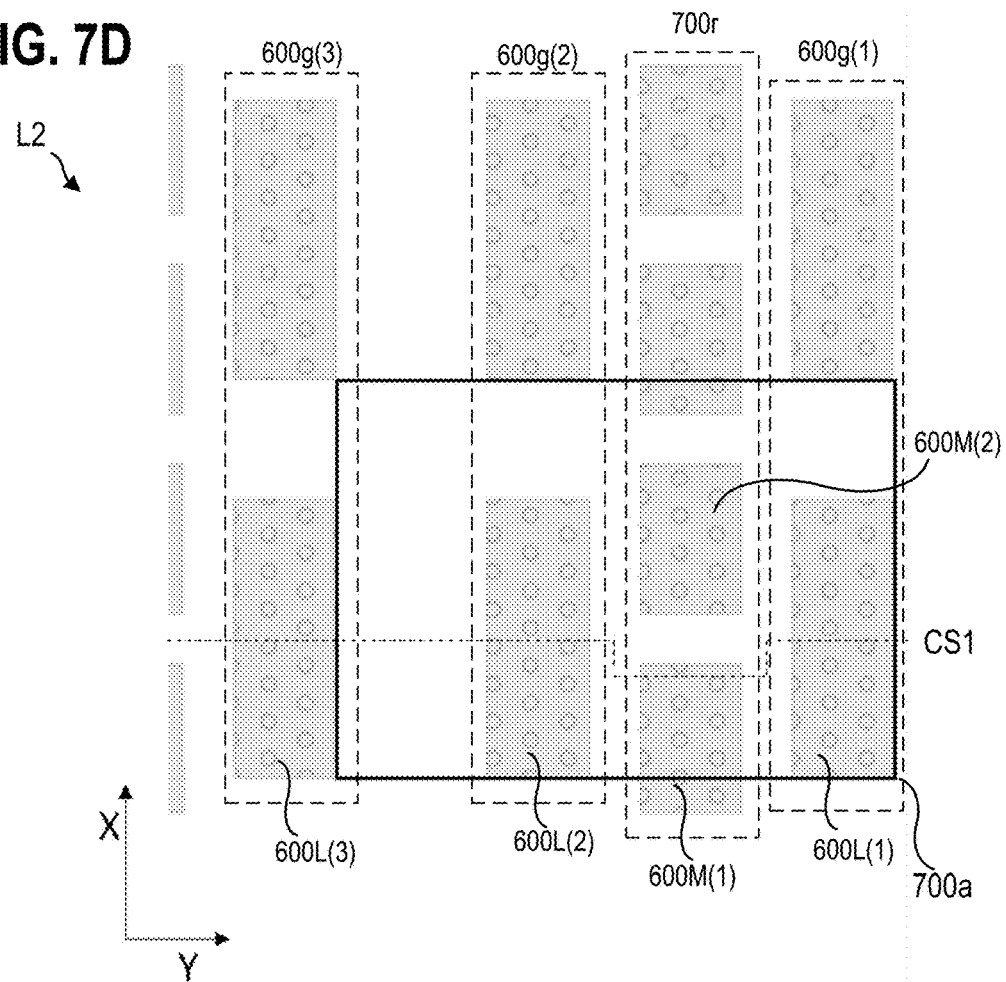
Figure 7D:
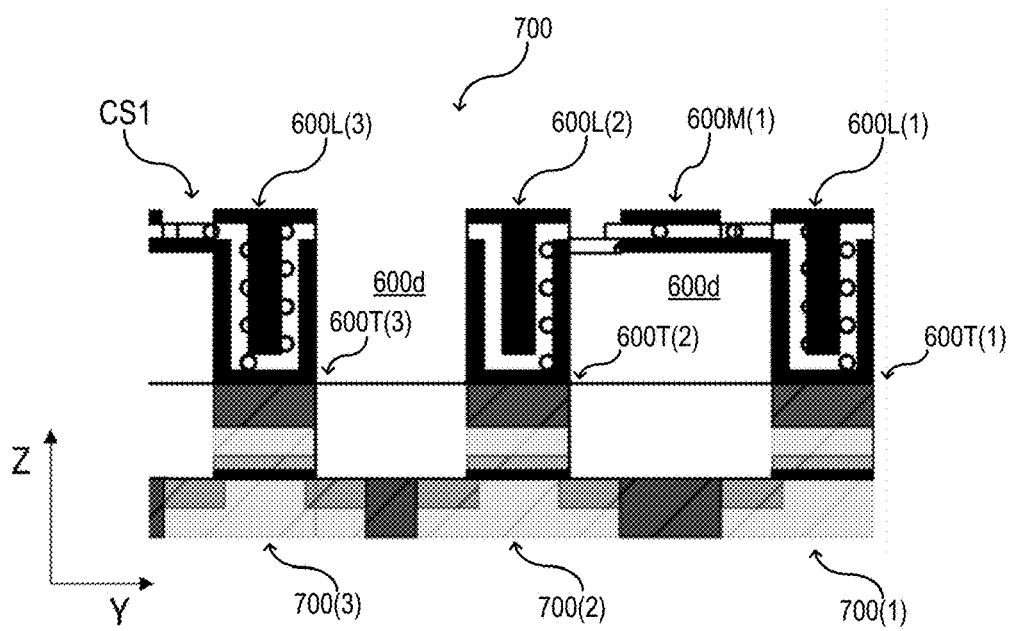
Figure 7E:
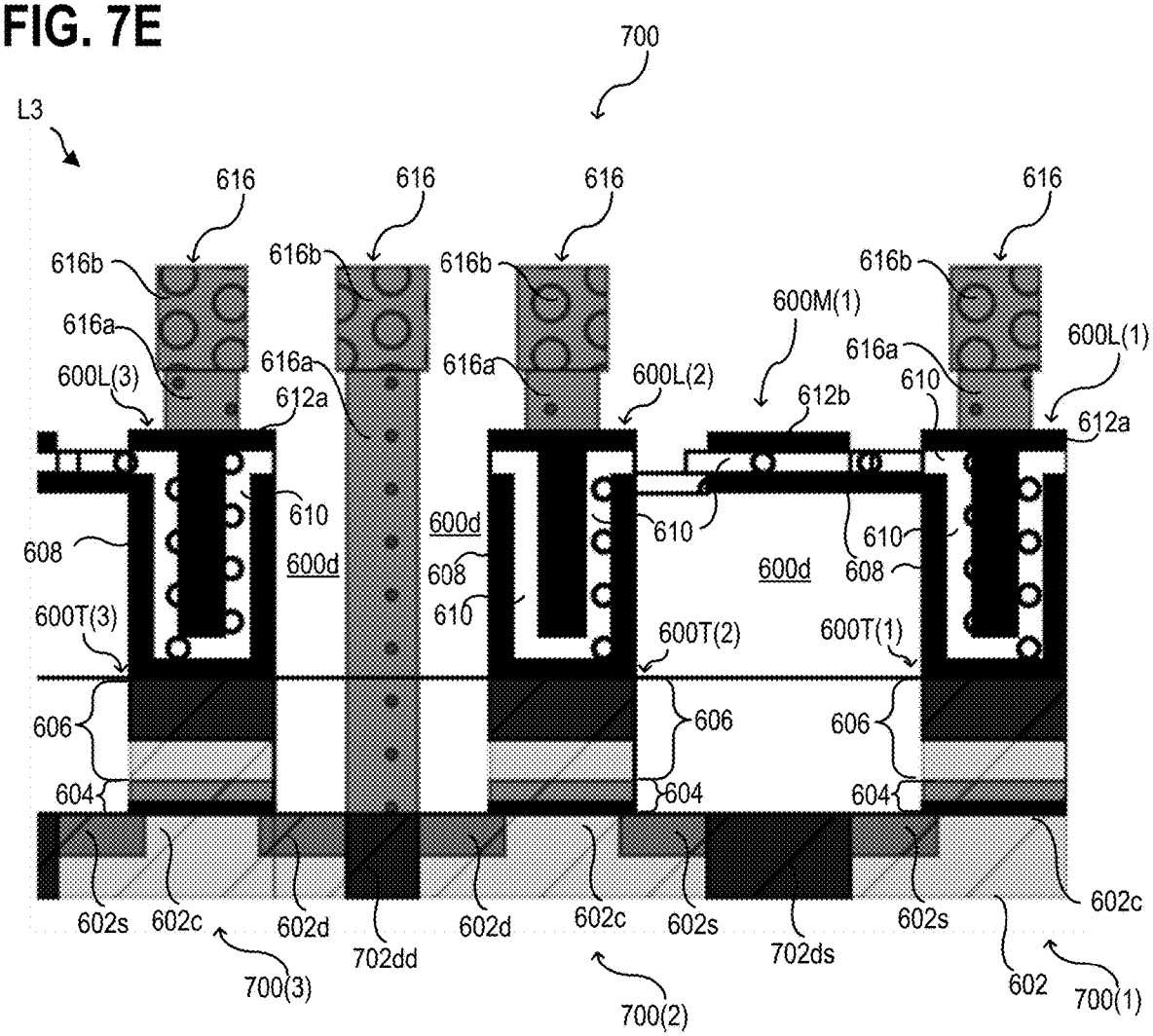
Figure 7F:
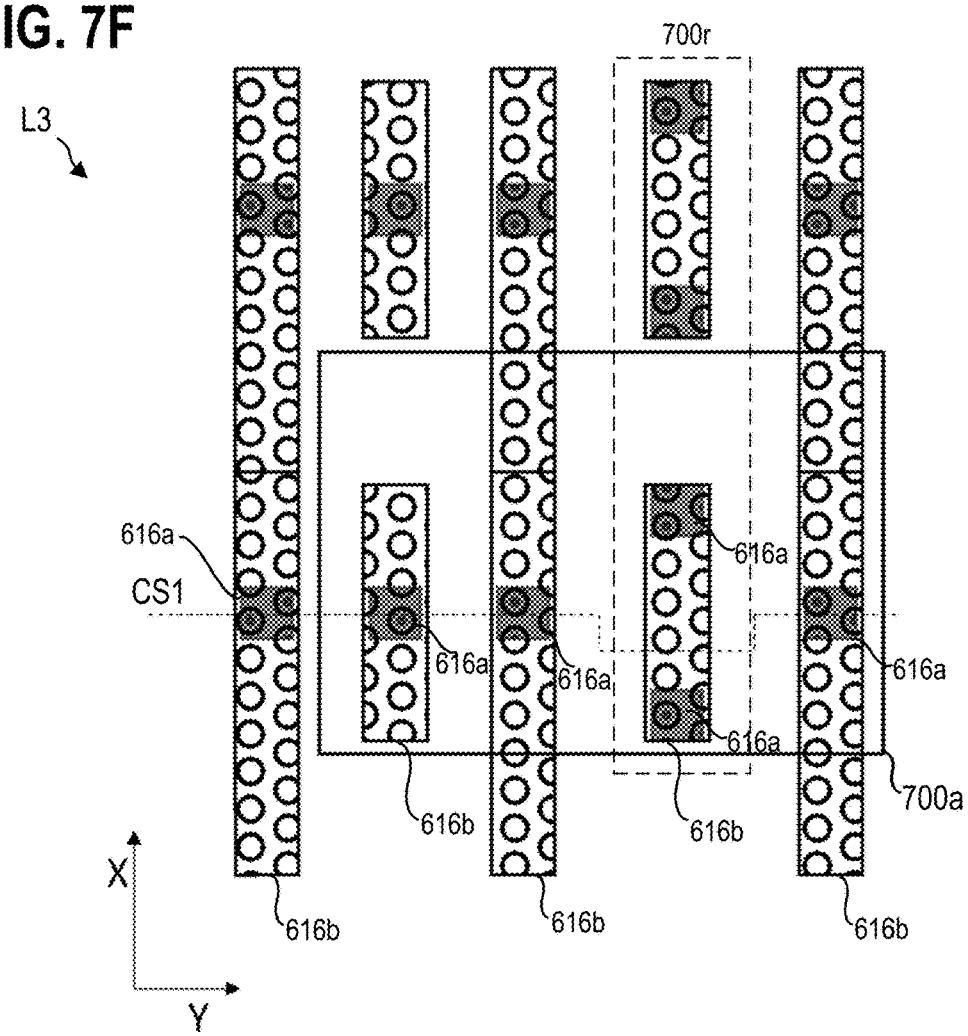
Figure 7F:
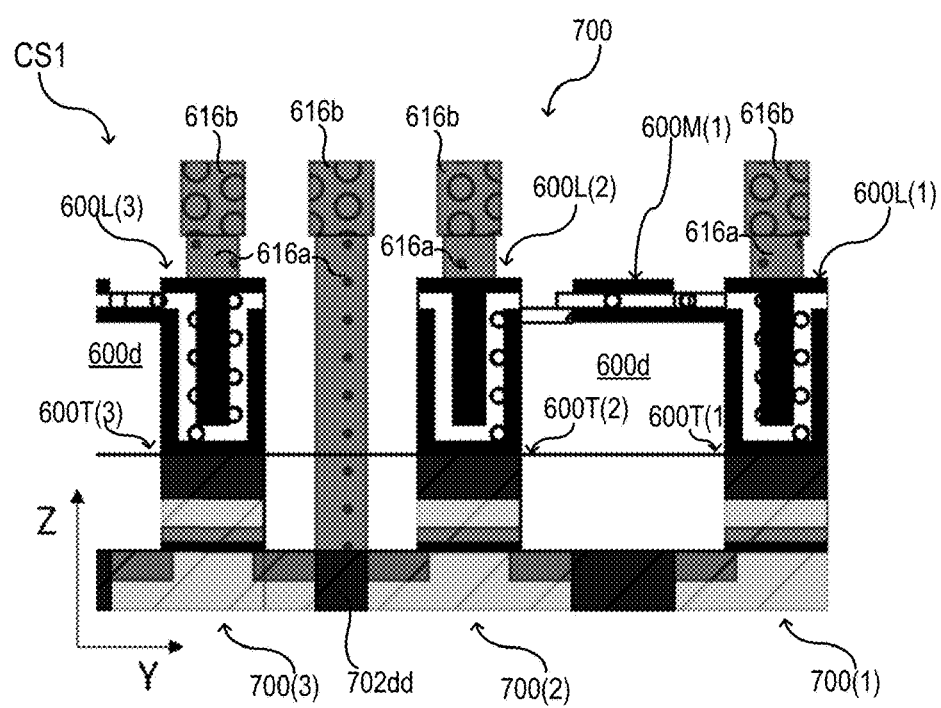

FIG. 7A, FIG. 7C, and FIG. 7E show an exemplary memory cell arrangement 700 in a schematic cross-sectional view, according to various aspects. FIG. 7B, FIG. 7D, and FIG. 7F show a schematic exemplary layout of the memory cell arrangement 700, according to various aspects. Each exemplary layout includes a top view and a cross-sectional view along a cross section line CS1. FIG. 7A and FIG. 7B illustrate a first level L1 of the memory cell arrangement 700 and the memory cell arrangement layout, FIG. 7C and FIG. 7D illustrate a second level L1 of the memory cell arrangement 700 and the memory cell arrangement layout, and FIG. 7E and FIG. 7F illustrate a third level L3 of the memory cell arrangement 700 and the memory cell arrangement layout, according to various aspects.

The memory cell arrangement 700 may include a plurality of memory cells 700(1, 2, 3). In the same or on a similar way as described above, a first memory cell 600(1) of the plurality of memory cells 700(1, 2, 3) may include a first field-effect transistor structure 600T(1), a first capacitive memory structure 600M(1) coupled to a gate 606 of the first field-effect transistor structure 600T(1), and a first capacitive lever structure 600L(1) coupled to the gate 606 of the first field-effect transistor structure 600T(1), and a second memory cell 600(2) of the plurality of memory cells 700(1, 2, 3) may include a second field-effect transistor structure 600T(2), a second capacitive memory structure 600M(2) coupled to a gate 606 of the second field-effect transistor structure 600T(2), and a second capacitive lever structure 600L(2) coupled to the gate 606 of the second field-effect transistor structure 600T(2).

In the same or on a similar way as described above, the first capacitive lever structure 600L(1) may be disposed (e.g., directly) over the gate 606 of the first field-effect transistor structure 600T(1), e.g., in a first recess formed in a dielectric layer over the gate 606 of the first field-effect transistor structure 600T(1). In the same or on a similar way as described above, the second capacitive lever structure 600L(2) may be disposed (e.g., directly) over the gate 606 of the second field-effect transistor structure 600T(2), e.g., in a second recess formed in the dielectric layer over the gate 606 of the second field-effect transistor structure 600T(2).

However, in contrast to the configuration of the memory cell arrangement 600, both the first capacitive memory structure 600M(1) and the second capacitive memory structure 600M(2) of the memory cell arrangement 700 may be disposed in a memory structure region 700r between the first recess and the second recess, see, for example, FIG. 7D. Both the first capacitive memory structure 600M(1) and the second capacitive memory structure 600M(2) may be disposed between the first capacitive lever structure 600L(1) and the second capacitive lever structure 600L(2). The memory structure region 700r, in which the first capacitive memory structure 600M(1) and the second capacitive memory structure 600M(2) are formed, may be disposed between a first lever structure region 600g(1) associated with the first memory cell 600(1) and a second lever structure region 600g(2) associated with the second memory cell 600(1).

It is noted that some components of the memory cell arrangement 700 may be part of third memory cell; such components may be marked with (3). It is understood, that the memory cell arrangement may include more than two or three memory cells, e.g., hundreds of memory cells or more.

According to various aspects, the memory cell arrangement 700 may include a diffusion (e.g., a source/source diffusion 702*ds*) at least one of over or in a semiconductor substrate 602. The diffusion may be configured to electrically conductively connect the source region 602*s* of the first field-effect transistor structure 600T(1) and the source region 602*d* of the second field-effect transistor structure 600T(2) with one another. In this way, a NOR configuration of the memory cell arrangement may be provided efficiently. According to various aspects, the memory cell arrangement 700 may include another diffusion (e.g., a drain/drain diffusion 702*dd*) at least one of over or in a semiconductor substrate 602. The diffusion may be configured to electrically conductively connect the drain region 602*s* of the second field-effect transistor structure 600T(2) and the drain region of a third field-effect transistor structure 600T(3) with one another.

According to various aspects, the memory structure region 700*r* (in which both capacitive memory structures 600M(1, 2) of the adjacent memory cells 700(1, 2) are disposed) may be disposed over a corresponding diffusion (e.g., over the source/source diffusion 702*ds* corresponding to the field-effect transistor structures 600T(1, 2)), see, for example, FIG. 7D. According to various aspects, the memory structure region 700*r* may overlap the diffusion (e.g., over the respective source/source diffusion 702*ds* corresponding to the field-effect transistor structures 600T(1, 2)) with respect to a projection along a vertical direction. In the figures, the vertical direction may be represented by the z-axis and the lateral plane and lateral directions may be represented by the y-axis and x-axis.

Illustratively, two neighboring memory cells 700(1, 2) of the memory cell arrangement 700 may share a memory structure region 700*r* between the capacitive lever structures 600L(1, 2) (or between the adjacent recesses—in which the capacitive lever structures 600L(1, 2) are formed—or between the adjacent gates 606 of the field-effect transistor structures 600T(1, 2)). Therefore, a double cell area 700*a* may be associated with such pairs of memory cells 700(1, 2) of the memory cell arrangement 700.

In the following, various processes are described that may allow an efficient (e.g., time efficient, material efficient, cost efficient) manufacture of a memory cell arrangement as described herein. It is noted that one or more of the processes may provide aspects of a method 800 for processing a memory cell arrangement, as illustrated in a schematic flow diagram in FIG. 8, according to various aspects.

A method 800 for processing a memory cell arrangement may include: in 810; forming at least a first field-effect transistor structure 600T(1) and a second field-effect transistor structure 600T(2) (e.g., laterally) next to one another (e.g., adjacent to one another), the first field-effect transistor structure 600T(1) including a first gate electrode 606 and the second field-effect transistor structure 600T(2) including a second gate electrode 606; in 820, forming a patterned (e.g., dielectric) layer 600*d* over at least the first field-effect transistor structure 600T(1) and the second field-effect transistor structure 600T(2), the patterned layer 600*d* includes an electrically insulating material and at least a first recess and a second recess, the first recess exposes the gate electrode 606 of the first field-effect transistor structure 600T(1) and the second recess exposes the gate electrode 606 of the second field-effect transistor structure 600T(2); in 830, forming a first electrode layer over the patterned layer 600*d*, wherein a first portion 608 of the first electrode layer is disposed in the first recess and is in electric contact with the gate electrode of the first field-effect transistor structure 600T(1), wherein a second portion 608 of the first electrode layer is disposed in the second recess and is in electric contact with the gate electrode of the second field-effect transistor structure 600T(2), wherein a third portion 608 of the first electrode layer is disposed outside the first recess and outside the second recess on the patterned layer 600*d* and in electric contact with the first portion of the first electrode layer, and wherein a fourth portion 608 of the first electrode layer is disposed outside the first recess and outside the second recess on the patterned layer 600*d* and in electric contact with the second portion of the first electrode layer; in 840, forming a functional layer 610 over the patterned layer 600*d* and over the first electrode layer; and in 850, forming a second electrode layer over the functional layer 610, wherein a first portion 612*a* of the second electrode layer is disposed in the first recess, wherein a second portion 612*a* of the second electrode layer is disposed in the second recess, wherein a third portion 612*b* of the second electrode layer is disposed outside the first recess and outside the second recess on the functional layer 610 over the third portion 608 of the first electrode layer, and wherein a fourth portion 612*b* of the second electrode layer is disposed outside the first recess and outside the second recess on the functional layer 610 over the fourth portion 608 of the first electrode layer, wherein the first portion 608 of the first electrode layer, the first portion 612*a* of the second electrode layer, and a first portion of the functional layer 610 disposed there between (i.e., between the first portion of the first electrode layer and the first portion of the second electrode layer) form a first lever capacitor structure 600L(1) (also referred to as capacitive lever structure), wherein the second portion 608 of the first electrode layer, the second portion 612*a* of the second electrode layer, and a second portion of the functional layer 610 disposed there between (i.e., between the second portion of the first electrode layer and the second portion of the second electrode layer) form a second lever capacitor structure 600L(2), wherein the third portion 608 of the first electrode layer, the third portion 612*b* of the second electrode layer, and a third portion of the functional layer 610 disposed there between (i.e., between the third portion of the first electrode layer and the third portion of the second electrode layer) form a first memory capacitor structure 600M(1) (also referred to as capacitive memory structure) associated with the first lever capacitor structure 600L(1), and wherein the fourth portion 608 of the first electrode layer, the fourth portion 612*b* of the second electrode layer, and a fourth portion of the functional layer 610 disposed there between (i.e., between the fourth portion of the first electrode layer and the fourth portion of the second electrode layer) form a second memory capacitor structure 600M(2) associated with the second lever capacitor structure 600L(2).

According to various aspects, a method or the method 800 may further include: forming a metallization structure 616, the metallization structure 616 electrically contacting the first portion 612*a* of the second electrode layer, the second portion 612*a* of the second electrode layer, the third portion 612*b* of the second electrode layer, and the fourth portion 612*b* of the second electrode layer.

According to various aspects, forming the functional layer 610 may include forming a dielectric material that forms the first portion of the functional layer and the second portion of the functional layer. According to various aspects, forming the functional layer 610 may include forming a remanent-polarizable material that forms the third portion of the functional layer and the fourth portion of the functional layer.

According to various aspects, forming the functional layer 610 may include forming a remanent-polarizable material that forms the first portion of the functional layer, the second portion of the functional layer, the third portion of the functional layer, and the fourth portion of the functional layer.

According to various aspects, forming the functional layer 610 may include forming a dielectric material that forms the first portion of the functional layer and the second portion of the functional layer. According to various aspects, forming the functional layer 610 may include forming a layer stack including one or more charge storage layers and one or more spontaneously-polarizable layers that form the third portion of the functional layer and the fourth portion of the functional layer.

According to various aspects, forming the functional layer 610 may include forming a spontaneously-polarizable material that forms the first portion of the functional layer and the second portion of the functional layer. According to various aspects, forming the functional layer 610 may include forming a layer stack including one or more charge storage layers and one or more spontaneously-polarizable layers that form.

According to various aspects, forming the functional layer 610 may include forming a dielectric material that forms the first portion of the functional layer and the second portion of the functional layer; and modifying the dielectric material to provide a remanent-polarizable material that forms the third portion of the functional layer and the fourth portion of the functional layer.

According to various aspects, forming the functional layer 610 may include forming a remanent-polarizable material that forms the third portion of the functional layer and the fourth portion of the functional layer; and modifying the remanent-polarizable material to provide a dielectric material that forms the first portion of the functional layer and the second portion of the functional layer.

According to various aspects, the dielectric material of the functional layer may be not remanently polarizable and not spontaneously polarizable. According to various aspects, the dielectric material of the patterned layer 600*d* may be not remanently polarizable and not spontaneously polarizable.

According to various aspects, forming the first electrode layer may include: depositing one or more electrically conductive layers; and patterning the one or more electrically conductive layers to form the first portion 608 of the first electrode layer associated with the first capacitive lever structure 600L(1), the second portion 608 of the first electrode layer associated with the second capacitive lever structure 600L(2), the third portion 608 of the first electrode layer associated with the first capacitive memory structure 600M(1), and the fourth portion of the first electrode layer associated with the second capacitive memory structure 600M(2). According to various aspects, the first portion of the first electrode layer associated with the first capacitive lever structure 600L(1) and the third portion of the first electrode layer associated with the first capacitive memory structure 600M(1) are electrically separated (e.g., not electrically conductively connected, e.g., not shorted, as examples) from the second portion of the first electrode layer associated with the second capacitive lever structure 600L(2) and the fourth portion of the first electrode layer associated with the second capacitive memory structure 600M(2).

According to various aspects, each of the first portion of the first electrode layer and the second portion of the first electrode layer may have a curved or angled shape (e.g., a U-shape). This shape may be achieved by depositing a portion of the first electrode layer into a respective recess in the dielectric layer 600*d* associated with a corresponding field-effect transistor structure 600T(1, 2). According to various aspects, each of the third portion of the first electrode layer and the fourth portion of the first electrode layer may have a planar shape (e.g., a plate shape). This shape may be achieved by depositing a portion of the first electrode layer not into one of the recesses in the dielectric layer 600*d* but on a planar surface of the in the dielectric layer 600*d*.

According to various aspects, the respective field-effect transistor structures are described herein with reference to figures that show a planar field-effect transistor structure. However, it is noted that the field-effect transistor structure may include or may be at least one of the following field-effect transistor structures: a planar field-effect transistor structure; a trench field-effect transistor structure; a fin field-effect transistor structure; a nano-sheet field-effect transistor structure; and/or a nano-wire field-effect transistor structure. In some aspects, any gated device may be used as a field-effect transistor structure.

According to various aspects, the capacitive memory structures 600M(1, 2) of the memory cell arrangement 600, 700 may be formed as trench capacitor structures. In some aspects, the patterned layer 600*d* may include a third recess and a fourth recess; wherein the third portion of the first electrode layer is at least partially disposed in the third recess, and wherein the fourth portion of the first electrode layer is at least partially disposed in the fourth recess. The corresponding portions of the functional layer 610 may be at least partially disposed in the respective recess. The top electrodes of the capacitive memory structures 600M(1, 2) may be partially disposed in the respective recess.

According to various aspects, the first portion 612*a* of the second electrode layer that is associated with the first capacitive lever structure 600L(1) and the third portion 612*b* of the second electrode layer that is associated with the first capacitive memory structure 600M(1) may be electrically separated (e.g., not electrically conductively connected, e.g., not shorted, as examples) from one another to allow an individual addressing of the first memory capacitor structure 600M(1) and the first lever capacitor structure 600L(1). According to various aspects, the second portion 612*a* of the second electrode layer that is associated with the second capacitive lever structure 600L(2) and the fourth portion 612*b* of the second electrode layer that is associated with the second capacitive memory structure 600M(2) may be electrically separated (e.g., not electrically conductively connected, e.g., not shorted, as examples) from one another to allow an individual addressing of the second memory capacitor structure 600M(2) and the second lever capacitor structure 600L(2).

According to various aspects, the first capacitive memory structure 600M(1) and the second capacitive memory structure 600M(2) may be formed in a memory structure region 700*r* between the first recess and the second recess. According to various aspects, the first capacitive memory structure 600M(1) and the second capacitive memory structure 600M(2) may be formed in a memory structure region 700*r* between the first capacitive lever structure 600L(1) and the second recess capacitive lever structure 600L(2). According to various aspects, the first capacitive memory structure 600M(1) and the second capacitive memory structure 600M(2) may be formed in a memory structure region 700*r* between the gate of the first field-effect transistor structure 600T(1) and the gate of the second field-effect transistor structure 600T(2).

According to various aspects, a method or the method 800 may further include forming a first contact structure in a first contact structure region, the first contact structure electrically contacting a first source/drain region of the first field-effect transistor structure 600T(1), wherein the first recess or the second recess is disposed between the first contact structure region and the memory structure region 700r. The first contact structure may be part of a metallization, see, for example, the drain/drain diffusion 702dd in FIG. 7F that is contacted by a part (e.g., a via 616a) of the metallization 616.

According to various aspects, a method or the method 800 may further include forming a second contact structure in a second contact structure region, the second contact structure electrically contacting a first source/drain region of the second field-effect transistor structure, wherein the second recess or the first recess is disposed between the second contact structure region and the memory structure region 700r.

According to various aspects, a source/drain region 602s, 602d of the first field-effect transistor structure 600T(1) may be electrically conductively connected to a source/drain region 602s, 602d of the second field-effect transistor structure 600T(1). In a NOR arrangement, for example, the source region 602s of the first field-effect transistor structure 600T(1) may be electrically conductively connected to a source region 602s of the second field-effect transistor structure 600T(2), see, for example, FIGS. 7A to 7F. In a NAND arrangement, for example, the source region 602s of the first field-effect transistor structure 600T(1) may be electrically conductively connected to a drain region 602d of the second field-effect transistor structure 600T(2), see, for example, FIGS. 6A to 6F. According to various aspects, the first capacitive memory structure 600M(1) and the second capacitive memory structure 600M(2) may be formed in a first memory structure region 600r(1) and a second memory structure region 600r(2) respectively see, for example, FIG. 6D. In some aspects, the second recess (or the first recess) may be disposed between the first memory structure 600r(1) region and the second memory structure region 600r(2). In some aspects, the second capacitive lever structure 600L(2) (or the first capacitive lever structure 600L(1)) may be disposed between the first memory structure 600r(1) region and the second memory structure region 600r(2).

In the following, various examples are provided that may include one or more aspects described above with reference to the memory cell arrangement 600, the memory cell arrangement 700, and the method 800. It may be intended that aspects described in relation to the memory cell arrangements 600, 700 may apply also to the method 800, and vice versa.

Example 1 is a memory cell arrangement, including: a plurality of memory cells; wherein a first memory cell of the plurality of memory cells includes a first field-effect transistor structure, a first capacitive memory structure coupled to a gate of the first field-effect transistor structure, and a first capacitive lever structure coupled to the gate of the first field-effect transistor structure, and wherein a second memory cell of the plurality of memory cells includes a second field-effect transistor structure, a second capacitive memory structure coupled to a gate of the second field-effect transistor structure, and a second capacitive lever structure coupled to the gate of the second field-effect transistor structure; wherein the first capacitive lever structure is disposed in a first recess formed over the gate of the first field-effect transistor structure, wherein the second capacitive lever structure is disposed in a second recess formed over the gate of the second field-effect transistor structure, and wherein the first capacitive memory structure and/or the second capacitive memory structure are disposed in a memory structure region between the first recess and the second recess. Another Example 1 is a memory cell arrangement, including: a plurality of memory cells; wherein a first memory cell of the plurality of memory cells includes a first field-effect transistor structure, a first capacitive memory structure coupled to a gate of the first field-effect transistor structure, and a first capacitive lever structure coupled to the gate of the first field-effect transistor structure, and wherein a second memory cell of the plurality of memory cells includes a second field-effect transistor structure, a second capacitive memory structure coupled to a gate of the second field-effect transistor structure, and a second capacitive lever structure coupled to the gate of the second field-effect transistor structure; wherein the first capacitive lever structure is disposed in a first recess formed over the gate of the first field-effect transistor structure, wherein the second capacitive lever structure is disposed in a second recess formed over the gate of the second field-effect transistor structure, and wherein the first capacitive memory structure and/or the second capacitive memory structure are disposed in a memory structure region between the first capacitive lever structure and the second capacitive lever structure.

In Example 2, the memory cell arrangement according to Example 1 may optionally further include that the first memory cell and the second memory cell are adjacent to one another.

In Example 3, the memory cell arrangement according to Example 1 or 2 may optionally further include that the first memory cell is part of a set of memory cells provided in a first memory cell row and that the second memory cell is part of a set of memory cells provided in a second memory cell row, where the first memory cell row runs parallel to the second memory cell row and wherein the first memory cell row and the second memory cell row are adjacent to one another.

In Example 4, the memory cell arrangement according to Example 3 may optionally further include that the first memory cell row is formed in a first memory cell area including a first memory structure region and a first lever structure region and that the second memory cell row is formed in a second memory cell area including a second memory structure region and a second lever structure region. The first memory structure region may be disposed between the first lever structure region and the second lever structure region.

In Example 5, the memory cell arrangement according to Example 3 may optionally further include that the first memory cell row and the second memory cell row are formed in a double memory cell area including a memory structure region, a first lever structure region, and a second lever structure region. The memory structure region may be disposed between the first lever structure region and the second lever structure region.

In Example 6, the memory cell arrangement according to any one of Examples 1 to 5 may optionally further include that the field-effect transistor structure of the first memory cell and the field-effect transistor structure of the second memory cell each includes: a source region; a drain region; a channel region extending from the source region to the drain region, wherein the respective gate is disposed adjacent to the channel region to control one or more electrical (e.g., electric conductance, electric resistance, etc.) properties thereof.

In Example 7, the memory cell arrangement according to Example 6 may optionally further include that the source region of the first field-effect transistor structure and the source region of the second field-effect transistor structure are electrically conductively connected to one another.

In Example 8, the memory cell arrangement according to Example 6 or 7 may optionally further include: a diffusion (also referred to as diffusion region or diffusion area) at least one of over or in a semiconductor substrate, wherein the source region of the first field-effect transistor structure and the source region of the second field-effect transistor structure are formed at least one of over or in the semiconductor substrate, and wherein the diffusion electrically conductively connects the source or drain region of the first field-effect transistor structure and the source or drain region of the second field-effect transistor structure with one another.

In Example 9, the memory cell arrangement according to Example 8 may optionally further include that the memory structure region is disposed over the diffusion.

In Example 10, the memory cell arrangement according to Example 8 or 9 may optionally further include that the memory structure region overlaps the diffusion with respect to a projection along a vertical direction.

In Example 11, the memory cell arrangement according to any one of Examples 1 to 10 may optionally further include that the first capacitive memory structure includes a bottom electrode, and that the first capacitive lever structure includes a bottom electrode, wherein the bottom electrode of the first capacitive memory structure and the bottom electrode of the first capacitive lever structure are formed by a first single electrode layer.

In Example 12, the memory cell arrangement according to any one of Examples 1 to 11 may optionally further include that the first capacitive memory structure includes a bottom electrode, and that the first capacitive lever structure includes a bottom electrode, wherein the bottom electrode of the first capacitive memory structure and the bottom electrode of the first capacitive lever structure are electrically conductively connected to one another.

In Example 13, the memory cell arrangement according to any one of Examples 1 to 12 may optionally further include that the first capacitive memory structure includes a bottom electrode, and that the first capacitive lever structure includes a bottom electrode, wherein the bottom electrode of the first capacitive memory structure and the bottom electrode of the first capacitive lever structure are configured as a common floating node.

In Example 14, the memory cell arrangement according to any one of Examples 1 to 13 may optionally further include that second capacitive memory structure includes a bottom electrode, the second capacitive lever structure includes a bottom electrode, and that the bottom electrode of the second capacitive memory structure and the bottom electrode of the second capacitive lever structure are formed by a second single electrode layer.

In Example 15, the memory cell arrangement according to any one of Examples 1 to 14 may optionally further include that the first single electrode layer extends from the memory structure region into the recess that corresponds to the first capacitive lever structure; and that the second single electrode layer extends from the memory structure region into the recess that corresponds to the second capacitive lever structure.

In Example 16, the memory cell arrangement according to any one of Examples 1 to 15 may optionally further include that the first single electrode layer is electrically separated from the second single electrode layer to allow an individual addressing of the first memory cell and the second memory cell receptively.

In Example 17, the memory cell arrangement according to any one of Examples 1 to 16 may optionally further include that the first capacitive memory structure includes a top electrode, that the first capacitive lever structure includes a top electrode, and that the top electrode of the first capacitive memory structure and the top electrode of the first capacitive lever structure are electrically separated from one another to allow an individual addressing of the first capacitive lever structure and the first capacitive memory structure receptively.

In Example 18, the memory cell arrangement according to any one of Examples 1 to 17 may optionally further include that second capacitive memory structure includes a top electrode, that the second capacitive lever structure includes a top electrode, and that the top electrode of the second capacitive memory structure and the top electrode of the second capacitive lever structure are electrically separated from one another to allow an individual addressing of the second capacitive lever structure and the second capacitive memory structure receptively.

In Example 19, the memory cell arrangement according to any one of Examples 1 to 18 may optionally further include that the first capacitive memory structure includes a spontaneously polarizable layer; and that the second capacitive memory structure includes a spontaneously polarizable layer.

In Example 20, the memory cell arrangement according to any one of Examples 1 to 18 may optionally further include that the first capacitive memory structure includes a remanent-polarizable layer; and that the second capacitive memory structure includes a remanent-polarizable layer.

In Example 21, the memory cell arrangement according to any one of Examples 1 to 18 may optionally further include that the first capacitive lever structure includes a spontaneously polarizable layer; and that the second capacitive lever structure includes a spontaneously polarizable layer.

In Example 22, the memory cell arrangement according to any one of Examples 1 to 18 may optionally further include that the first capacitive lever structure includes a remanent-polarizable layer; and that the second capacitive lever structure includes a remanent-polarizable layer.

In Example 23, the memory cell arrangement according to any one of Examples 1 to 18 may optionally further include that the first capacitive lever structure includes a dielectric layer that is not remanently polarizable; and that the second capacitive lever structure includes a dielectric layer that is not remanently polarizable.

In Example 24, the memory cell arrangement according to any one of Examples 1 to 23 may optionally further include that the first capacitive lever structure includes a first functional layer portion; that the first capacitive memory structure includes a second functional layer portion; that the second capacitive lever structure includes a third functional layer portion; that the second capacitive memory structure includes a fourth functional layer portion; and that the first functional layer portion, the second functional layer portion, the third functional layer portion, and the fourth functional layer portion are portions of a single functional layer.

In Example 25, the memory cell arrangement according to Example 24 may optionally further include that the single functional layer is configured (e.g., thermally treated, e.g., crystallized, as examples) such that the first functional layer portion and the third functional layer portion each includes at least one of a dielectric material that is not remanently or spontaneously polarizable, a dielectric material that is remanently polarizable, and/or a dielectric material that is spontaneously polarizable; and that the single functional layer is configured (e.g., thermally treated, e.g., crystallized, as examples) such that the second functional layer portion and the fourth functional layer portion each includes at least one of a dielectric material that is remanently or spontaneously polarizable.

Example 26 is a memory cell arrangement, including: a plurality of memory cells; wherein a first memory cell of the plurality of memory cells includes a first field-effect transistor structure, a first capacitive memory structure coupled to a gate of the first field-effect transistor structure, and a first capacitive lever structure coupled to the gate of the first field-effect transistor structure, and wherein a second memory cell of the plurality of memory cells includes a second field-effect transistor structure, a second capacitive memory structure coupled to a gate of the first field-effect transistor structure, and a second capacitive lever structure coupled to the gate of the first field-effect transistor structure; wherein the first capacitive lever structure is disposed in a first recess formed over the gate of the first field-effect transistor structure, wherein the second capacitive lever structure is disposed in a second recess formed over the gate of the second field-effect transistor structure, and wherein the first capacitive memory structure or the second capacitive memory structure is disposed in a memory structure region between the first recess and the second recess. Another Example 26 is a memory cell arrangement, including: a plurality of memory cells; wherein a first memory cell of the plurality of memory cells includes a first field-effect transistor structure, a first capacitive memory structure coupled to a gate of the first field-effect transistor structure, and a first capacitive lever structure coupled to the gate of the first field-effect transistor structure, and wherein a second memory cell of the plurality of memory cells includes a second field-effect transistor structure, a second capacitive memory structure coupled to a gate of the first field-effect transistor structure, and a second capacitive lever structure coupled to the gate of the first field-effect transistor structure; wherein the first capacitive lever structure is disposed in a first recess formed over the gate of the first field-effect transistor structure, wherein the second capacitive lever structure is disposed in a second recess formed over the gate of the second field-effect transistor structure, and wherein the first capacitive memory structure and/or the second capacitive memory structure are/is disposed in a memory structure region between the first field-effect transistor structure and the second field-effect transistor structure. Another Example 26 is a memory cell arrangement, including: a plurality of memory cells; wherein a first memory cell of the plurality of memory cells includes a first field-effect transistor structure, a first capacitive memory structure coupled to a gate of the first field-effect transistor structure, and a first capacitive lever structure coupled to the gate of the first field-effect transistor structure, and wherein a second memory cell of the plurality of memory cells includes a second field-effect transistor structure, a second capacitive memory structure coupled to a gate of the first field-effect transistor structure, and a second capacitive lever structure coupled to the gate of the first field-effect transistor structure; wherein the first capacitive lever structure is disposed in a first recess formed over the gate of the first field-effect transistor structure, wherein the second capacitive lever structure is disposed in a second recess formed over the gate of the second field-effect transistor structure, and wherein the first capacitive memory structure and/or the second capacitive memory structure are/is disposed in a memory structure region between the first capacitive lever structure and the second capacitive lever structure.

In Example 27, the memory cell arrangement according to Example 26 may optionally further include that the first capacitive memory structure and the second capacitive memory structure are formed in a first memory structure region and a second memory structure region respectively, wherein the first recess is disposed between the first memory structure region and the second memory structure region.

In Example 28, the memory cell arrangement according to Example 26 or 27 may optionally further include that a second source/drain region of the first field-effect transistor structure is electrically conductively connected to a first source/drain region of the second field-effect transistor structure.

Example 29 is a method for processing a memory cell arrangement, the method including: forming at least a first field-effect transistor structure and a second field-effect transistor structure laterally next to one another, the first field-effect transistor structure including a first gate electrode and the second field-effect transistor structure including a second gate electrode; forming a patterned layer over at least the first field-effect transistor structure and the second field-effect transistor structure, the patterned layer including an electrically insulating material and at least a first recess and a second recess, the first recess exposes the first gate electrode and the second recess exposes the second gate electrode; forming a first electrode layer over the patterned layer, wherein a first portion of the first electrode layer is disposed in the first recess and is in electric contact with the first gate electrode, wherein a second portion of the first electrode layer is disposed in the second recess and is in electric contact with the second gate electrode, wherein a third portion of the first electrode layer is disposed outside the first recess and outside the second recess on the patterned layer and in electric contact with the first portion of the first electrode layer, and wherein a fourth portion of the first electrode layer is disposed outside the first recess and outside the second recess on the patterned layer and in electric contact with the second portion of the first electrode layer; forming a functional layer over the patterned layer and over the first electrode layer; and forming a second electrode layer over the functional layer, wherein a first portion of the second electrode layer is disposed in the first recess, wherein a second portion of the second electrode layer is disposed in the second recess, wherein a third portion of the second electrode layer is disposed outside the first recess and outside the second recess on the functional layer over the third portion of the first electrode layer, and wherein a fourth portion of the second electrode layer is disposed outside the first recess and outside the second recess on the functional layer over the fourth portion of the first electrode layer, wherein the first portion of the first electrode layer, the first portion of the second electrode layer, and a first portion of the functional layer disposed there between (i.e., between the first portion of the first electrode layer and the first portion of the second electrode layer) form a first lever capacitor structure, wherein the second portion of the first electrode layer, the second portion of the second electrode layer, and a second portion of the functional layer disposed there between (i.e., between the second portion of the first electrode layer and the second portion of the second electrode layer) form a second lever capacitor structure, wherein the third portion of the first electrode layer, the third portion of the second electrode layer, and a third portion of the functional layer disposed there between (i.e., between the third portion of the first electrode layer and the third portion of the second electrode layer) form a first memory capacitor structure associated with the first lever capacitor structure, and wherein the fourth portion of the first electrode layer, the fourth portion of the second electrode layer, and a fourth portion of the functional layer disposed there between (i.e., between the fourth portion of the first electrode layer and the fourth portion of the second electrode layer) form a second memory capacitor structure associated with the second lever capacitor structure.

In Example 30, the method according to Example 29 may optionally further include: forming a metallization structure, the metallization structure electrically contacting the first portion of the second electrode layer, the second portion of the second electrode layer, the third portion of the second electrode layer, and the fourth portion of the second electrode layer.

In Example 31, the method according to Example 29 or 30 may optionally further include that forming the functional layer includes forming a dielectric material that forms the first portion of the functional layer and the second portion of the functional layer; and that forming the functional layer includes forming a remanent-polarizable material that forms the third portion of the functional layer and the fourth portion of the functional layer.

In Example 32, the method according to Example 29 or 30 may optionally further include that forming the functional layer includes forming a remanent-polarizable material that forms the first portion of the functional layer, the second portion of the functional layer, the third portion of the functional layer, and the fourth portion of the functional layer.

In Example 33, the method according to Example 29 or 30 may optionally further include that forming the functional layer includes forming a dielectric material that forms the first portion of the functional layer and the second portion of the functional layer; and that forming the functional layer includes forming a layer stack including one or more charge storage layers and one or more spontaneously-polarizable layers that form the third portion of the functional layer and the fourth portion of the functional layer.

In Example 34, the method according to Example 29 or 30 may optionally further include that forming the functional layer includes forming a spontaneously-polarizable material that forms the first portion of the functional layer and the second portion of the functional layer; and that forming the functional layer includes forming a layer stack including one or more charge storage layers and one or more spontaneously-polarizable layers that form.

In Example 35, the method according to Example 29 or 30 may optionally further include that forming the functional layer includes forming a dielectric material that forms the first portion of the functional layer and the second portion of the functional layer; and modifying the dielectric material to provide a remanent-polarizable material that forms the third portion of the functional layer and the fourth portion of the functional layer.

In Example 36, the method according to Example 29 or 30 may optionally further include that forming the functional layer includes forming a remanent-polarizable material that forms the third portion of the functional layer and the fourth portion of the functional layer; and modifying the remanent-polarizable material to provide a dielectric material that forms the first portion of the functional layer and the second portion of the functional layer.

In Example 37, the method according to Example 31, 33, 35 or 36 may optionally further include that the dielectric material of the functional layer or formed from the functional layer is not remanently polarizable and not spontaneously polarizable.

In Example 38, the method according to any one of Examples 29 to 37 may optionally further include that forming the first electrode layer includes: depositing one or more electrically conductive layers; and patterning the one or more electrically conductive layers to form the first portion of the first electrode layer, the second portion of the first electrode layer, the third portion of the first electrode layer, and the fourth portion of the first electrode layer.

In Example 39, the method according to any one of Examples 29 to 38 may optionally further include that the first portion of the first electrode layer and the third portion of the first electrode layer are electrically separated (e.g., not electrically conductively connected, e.g., not shorted, as examples) from the second portion of the first electrode layer and the fourth portion of the first electrode layer.

In Example 40, the method according to any one of Examples 29 to 39 may optionally further include that each of the first portion of the first electrode layer and the second portion of the first electrode layer has a curved or angled shape (e.g., a U-shape).

In Example 41, the method according to any one of Examples 29 to 40 may optionally further include that each of the third portion of the first electrode layer and the fourth portion of the first electrode layer has a planar shape (e.g., a plate shape).

In Example 42, the method according to any one of Examples 29 to 41 may optionally further include that each of the first recess and the second recess has a depth of at least 15 nm.

In Example 43, the method according to any one of Examples 29 to 42 may optionally further include that the functional layer has a layer thickness in the range from about 2 nm to about 15 nm.

In Example 44, the method according to any one of Examples 29 to 43 may optionally further include that the field-effect transistor structure is at least one of the following field-effect transistor structures: a planar field-effect transistor structure; a trench field-effect transistor structure; a fin field-effect transistor structure; a nano-sheet field-effect transistor structure; and/or a nano-wire field-effect transistor structure.

In Example 45, the method according to any one of Examples 29 to 44 may optionally further include that the patterned layer includes a third recess and a fourth recess; wherein the third portion of the first electrode layer is at least partially disposed in the third recess, and wherein the fourth portion of the first electrode layer is at least partially disposed in the fourth recess.

In Example 46, the method according to any one of Examples 29 to 45 may optionally further include that the first portion of the second electrode layer and the third portion of the second electrode layer are electrically separated (e.g., not electrically conductively connected, e.g., not shorted, as examples) from one another to allow an individual addressing of the first memory capacitor structure and the first lever capacitor structure; and that the second portion of the second electrode layer and the fourth portion of the second electrode layer are electrically separated (e.g., not electrically conductively connected, e.g., not shorted, as examples) from one another to allow an individual addressing of the second memory capacitor structure and the second lever capacitor structure.

In Example 47, the method according to any one of Examples 29 to 46 may optionally further include that the first capacitive memory structure and the second capacitive memory structure are formed in a memory structure region between the first recess and the second recess.

In Example 48, the method according to any one of Examples 29 to 47 may optionally further include: forming a first contact structure in a first contact structure region, the first contact structure electrically contacting a first source/drain region of the first field-effect transistor structure, wherein the first or second recess is disposed between the first contact structure region and the memory structure region.

In Example 49, the method according to any one of Examples 29 to 48 may optionally further include: forming a second contact structure in a second contact structure region, the second contact structure electrically contacting a first source/drain region of the second field-effect transistor structure, wherein the second or first recess is disposed between the second contact structure region and the memory structure region.

In Example 50, the method according to any one of Examples 29 to 49 may optionally further include that a second source/drain region of the first field-effect transistor structure is electrically conductively connected to a second source/drain region of the second field-effect transistor structure.

In Example 51, the method according to any one of Examples 29 to 50 may optionally further include that the first capacitive memory structure and the second capacitive memory structure are formed in a first memory structure region and a second memory structure region respectively, wherein the first recess is disposed between the first memory structure region and the second memory structure region.

In Example 52, the method according to any one of Examples 29 to 51 may optionally further include that a second source/drain region of the first field-effect transistor structure is electrically conductively connected to a first source/drain region of the second field-effect transistor structure.

According to various aspects, the capacitance of each of the capacitive lever structures of the memory cell arrangement (e.g., of the lever capacitors implemented in the memory cell arrangement) may be greater (e.g., at least 10% greater, at least 50% greater, e.g., at least twice as much) than the capacitance of each of the capacitive memory structures of the memory cell arrangement (e.g., of the memory capacitors implemented in the memory cell arrangement).

It is noted that one or more functions described herein with reference to a memory cell, a memory cell arrangement, etc., may be accordingly part of a method, e.g., part of a method for operating a memory cell arrangement. Vice versa, one or more functions described herein with reference to a method, e.g., with reference to a method for operating a memory cell arrangement, may be implemented accordingly in a device or in a part of a device, for example, in a memory cell, a memory cell arrangement, etc.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A memory cell arrangement, comprising:
   a plurality of memory cells;
   wherein a first memory cell of the plurality of memory cells comprises a first field-effect transistor structure, a first capacitive memory structure coupled to a gate of the first field-effect transistor structure, and a first capacitive lever structure coupled to the gate of the first field-effect transistor structure, and wherein a second memory cell of the plurality of memory cells comprises a second field-effect transistor structure, a second capacitive memory structure coupled to a gate of the second field-effect transistor structure, and a second capacitive lever structure coupled to the gate of the second field-effect transistor structure;
   wherein the first capacitive lever structure is disposed in a first recess formed over the gate of the first field-effect transistor structure, wherein the second capacitive lever structure is disposed in a second recess formed over the gate of the second field-effect transistor structure, and wherein the first capacitive memory structure and the second capacitive memory structure are disposed in a memory structure region between the first capacitive lever structure and the second capacitive lever structure;
   wherein the first capacitive lever structure and the first capacitive memory structure each comprise a first bottom electrode that are electrically conductively connected together to form a first single electrode layer that extends from the memory structure region into the first recess;
   wherein the second capacitive lever structure and the second capacitive memory structure each comprise a second bottom electrode that are electrically conductively connected together to form a second single electrode layer that extends from the memory structure region into the second recess; and
   wherein the first single electrode layer is electrically separated from the second single electrode layer to allow an individual addressing of the first memory cell and the second memory cell respectively.

2. The memory cell arrangement according to claim 1,
   wherein the field-effect transistor structure of the first memory cell and the field-effect transistor structure of the second memory cell each comprises:
   a source region;
   a drain region;
   a channel region extending from the source region to the drain region,
   wherein the respective gate is disposed adjacent to the channel region to control one or more electrical properties thereof.

3. The memory cell arrangement according to claim 2,
   wherein the source region of the first field-effect transistor structure and the source region of the second field-effect transistor structure are electrically conductively connected to one another.

4. The memory cell arrangement according to claim 3, further comprising:
   a source diffusion at least one of over and/or in a semiconductor substrate, wherein the source region of the first field-effect transistor structure and the source region of the second field-effect transistor structure are formed at least one of over and/or in the semiconductor substrate, and wherein the source diffusion electrically conductively connects the source region of the first field-effect transistor structure and the source region of the second field-effect transistor structure with one another.

5. The memory cell arrangement according to claim 4, wherein the memory structure region is disposed over the source diffusion.

6. The memory cell arrangement according to claim 1, wherein the first capacitive memory structure comprises a top electrode,
wherein the first capacitive lever structure comprises a top electrode, and
wherein the top electrode of the first capacitive memory structure and the top electrode of the first capacitive lever structure are electrically separated from one another to allow an individual addressing of the first capacitive lever structure and the first capacitive memory structure respectively.

7. The memory cell arrangement according to claim 6, wherein second capacitive memory structure comprises a top electrode,
wherein the second capacitive lever structure comprises a top electrode, and
wherein the top electrode of the second capacitive memory structure and the top electrode of the second capacitive lever structure are electrically separated from one another to allow an individual addressing of the second capacitive lever structure and the second capacitive memory structure respectively.

8. The memory cell arrangement according to claim 1, wherein the first capacitive memory structure comprises a remanent-polarizable layer; and
wherein the second capacitive memory structure comprises a remanent-polarizable layer.

9. The memory cell arrangement according to claim 1, wherein the first capacitive lever structure comprises a remanent-polarizable layer; and
wherein the second capacitive lever structure comprises a remanent-polarizable layer.

10. The memory cell arrangement according to claim 1, wherein the first capacitive lever structure comprises a dielectric layer that is not remanently polarizable; and
wherein the second capacitive lever structure comprises a dielectric layer that is not remanently polarizable.

11. The memory cell arrangement according to claim 1, wherein the first capacitive lever structure comprises a first functional layer portion;
wherein the first capacitive memory structure comprises a second functional layer portion;
wherein the second capacitive lever structure comprises a third functional layer portion;
wherein the second capacitive memory structure comprises a fourth functional layer portion;
wherein the first functional layer portion, the second functional layer portion, the third functional layer portion, and the fourth functional layer portion are portions of a single functional layer.

12. The memory cell arrangement according to claim 11, wherein the single functional layer is configured such that the first functional layer portion and the third functional layer portion each comprises at least one of a dielectric material that is not remanently and/or spontaneously polarizable, a dielectric material that is remanently polarizable, and/or a dielectric material that is spontaneously polarizable; and wherein the single functional layer is configured such that the second functional layer portion and the fourth functional layer portion each comprises at least one of a dielectric material that is remanently and/or spontaneously polarizable.

13. A method for processing a memory cell arrangement according to claim 1, the method comprising: forming at least the first field-effect transistor structure and the second field-effect transistor structure laterally next to one another, the first field-effect transistor structure comprising a first gate electrode and the second field-effect transistor structure comprising a second gate electrode; forming a patterned layer over at least the first field-effect transistor structure and the second field-effect transistor structure, the patterned layer comprising an electrically insulating material and at least a first recess and a second recess, the first recess exposes the first gate electrode and the second recess exposes the second gate electrode; forming a first electrode layer over the patterned layer, wherein a first portion of the first electrode layer is disposed in the first recess and is in electric contact with the first gate electrode, wherein a second portion of the first electrode layer is disposed in the second recess and is in electric contact with the second gate electrode, wherein a third portion of the first electrode layer is disposed outside the first recess and outside the second recess in a memory structure region between the first recess and the second recess on the patterned layer and in electric contact with the first portion of the first electrode layer, and wherein a fourth portion of the first electrode layer is disposed outside the first recess and outside the second recess in the memory structure region on the patterned layer and in electric contact with the second portion of the first electrode layer; forming a functional layer over the patterned layer and over the first electrode layer; and forming a second electrode layer over the functional layer, wherein a first portion of the second electrode layer is disposed in the first recess, wherein a second portion of the second electrode layer is disposed in the second recess, wherein a third portion of the second electrode layer is disposed outside the first recess and outside the second recess on the functional layer over the third portion of the first electrode layer, and wherein a fourth portion of the second electrode layer is disposed outside the first recess and outside the second recess on the functional layer over the fourth portion of the first electrode layer, wherein the first portion of the first electrode layer, the first portion of the second electrode layer, and a first portion of the functional layer disposed there between form the first lever capacitor structure, wherein the second portion of the first electrode layer, the second portion of the second electrode layer, and a second portion of the functional layer disposed there between form the second lever capacitor structure, wherein the third portion of the first electrode layer, the third portion of the second electrode layer, and a third portion of the functional layer disposed there between form the first memory capacitor structure associated with the first lever capacitor structure, and wherein the fourth portion of the first electrode layer, the fourth portion of the second electrode layer, and a fourth portion of the functional layer disposed there between form the second memory capacitor structure associated with the second lever capacitor structure.

14. The method of claim 13, further comprising:
forming a metallization structure, the metallization structure electrically contacting the first portion of the second electrode layer, the second portion of the second electrode layer, the third portion of the second electrode layer, and the fourth portion of the second electrode layer.

15. The method of claim 13, wherein forming the first electrode layer comprises:

depositing one or more electrically conductive layers; and patterning the one or more electrically conductive layers to form the first portion of the first electrode layer, the second portion of the first electrode layer, the third portion of the first electrode layer, and the fourth portion of the first electrode layer.

* * * * *